(12) United States Patent
Nishikawa et al.

(10) Patent No.: US 11,342,026 B2
(45) Date of Patent: May 24, 2022

(54) SEMICONDUCTOR MEMORY MEDIUM AND MEMORY SYSTEM

(71) Applicant: Kioxia Corporation, Tokyo (JP)

(72) Inventors: Suguru Nishikawa, Osaka (JP);
Takehiko Amaki, Yokohama (JP);
Yoshihisa Kojima, Kawasaki (JP);
Shunichi Igahara, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/018,147

(22) Filed: Sep. 11, 2020

(65) Prior Publication Data

US 2021/0257027 A1    Aug. 19, 2021

(30) Foreign Application Priority Data

Feb. 13, 2020   (JP) .............................. JP2020-022377

(51) Int. Cl.
| | |
|---|---|
| *G11C 16/34* | (2006.01) |
| *G11C 16/10* | (2006.01) |
| *G11C 16/04* | (2006.01) |
| *G11C 16/08* | (2006.01) |
| *G11C 16/14* | (2006.01) |
| *G11C 16/26* | (2006.01) |

(52) U.S. Cl.
CPC .......... *G11C 16/10* (2013.01); *G11C 16/0483* (2013.01); *G11C 16/08* (2013.01); *G11C 16/14* (2013.01); *G11C 16/26* (2013.01); *G11C 16/3459* (2013.01)

(58) Field of Classification Search
CPC ................................. G11C 16/3454

USPC .................................................. 365/185.22
See application file for complete search history.

(56) References Cited

U.S. PATENT DOCUMENTS

| | | | |
|---|---|---|---|
| 7,483,301 | B2 | 1/2009 | Hwang |
| 8,891,300 | B2 | 11/2014 | Oh et al. |
| 9,201,728 | B2 | 12/2015 | Patapoutian et al. |
| 9,244,834 | B2 | 1/2016 | Sheredy et al. |
| 9,972,396 | B1 | 5/2018 | Naik et al. |
| 2012/0069681 | A1 | 3/2012 | Oikawa |
| 2014/0043901 | A1 | 2/2014 | Kwak |

(Continued)

FOREIGN PATENT DOCUMENTS

| | | |
|---|---|---|
| JP | 2006-309928 A | 11/2006 |
| JP | 2012-69199 A | 4/2012 |

(Continued)

*Primary Examiner* — Jason Lappas
(74) *Attorney, Agent, or Firm* — Oblon, McClelland, Maier & Neustadt, L.L.P.

(57) ABSTRACT

According to one embodiment, the semiconductor memory medium includes a first memory cell, a first word line coupled to the first memory cell, and a row decoder coupled to the first word line. A write operation is executed multiple times on the first memory cell within a first period from after an execution of an erase operation to an execution of a next erase operation. The write operation includes at least one of program loops each including a program operation and a verify operation. In the verify operation, the row decoder applies a verify voltage to the first word line. The verify voltage is set in accordance with a number of executed write operations on the first memory cell within the first period.

30 Claims, 33 Drawing Sheets

(56) References Cited

U.S. PATENT DOCUMENTS

| 2014/0247666 A1* | 9/2014 | Dutta ................. G11C 11/5635 |
| | | 365/185.19 |
| 2020/0043549 A1 | 2/2020 | Shibata et al. |
| 2021/0257027 A1 | 8/2021 | Nishikawa et al. |

FOREIGN PATENT DOCUMENTS

| JP | 2015-56184 A | 3/2015 |
| JP | 2021-128810 A | 9/2021 |

* cited by examiner

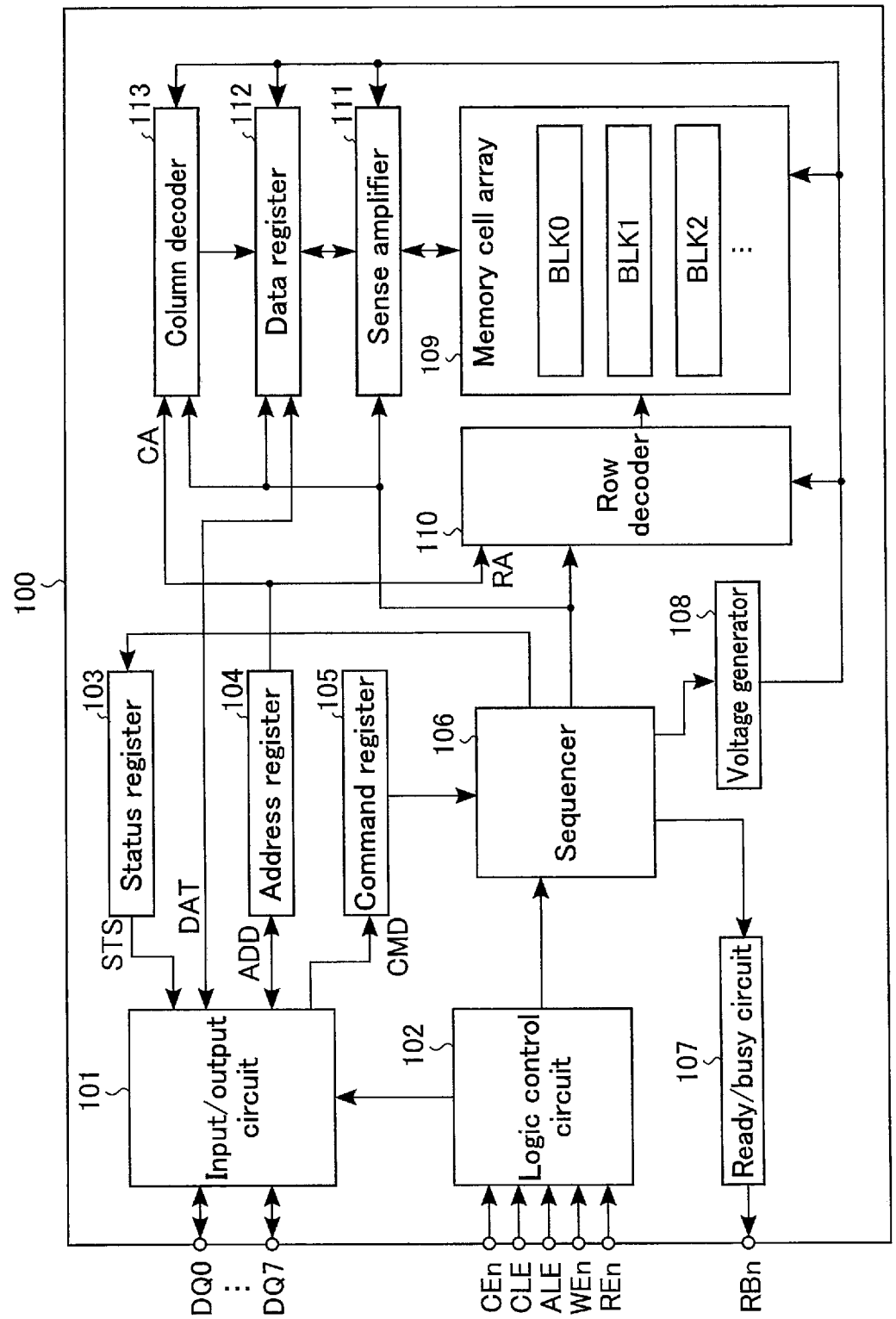
F I G. 2

| Number of written times after an erasure | Read voltage | Verify voltage | initial VPGM | DVPGM |
|---|---|---|---|---|
| 1 | VR1 | VV1 | VP1 | VDP1 |
| 2 | VR2 | VV2 | VP2 | VDP2 |
| 3 | VR3 | VV3 | VP3 | VDP3 |

FIG. 8

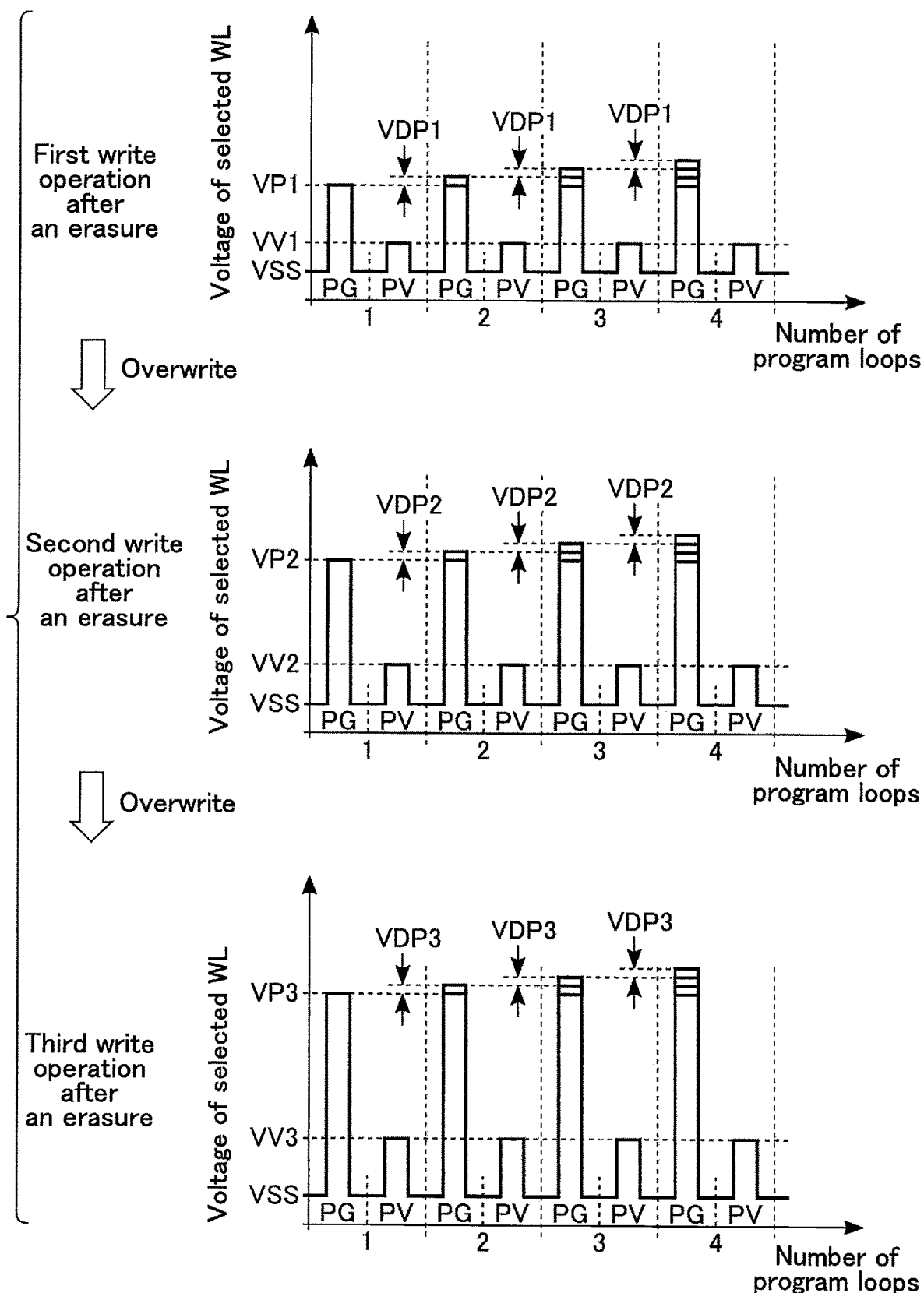
F I G. 11

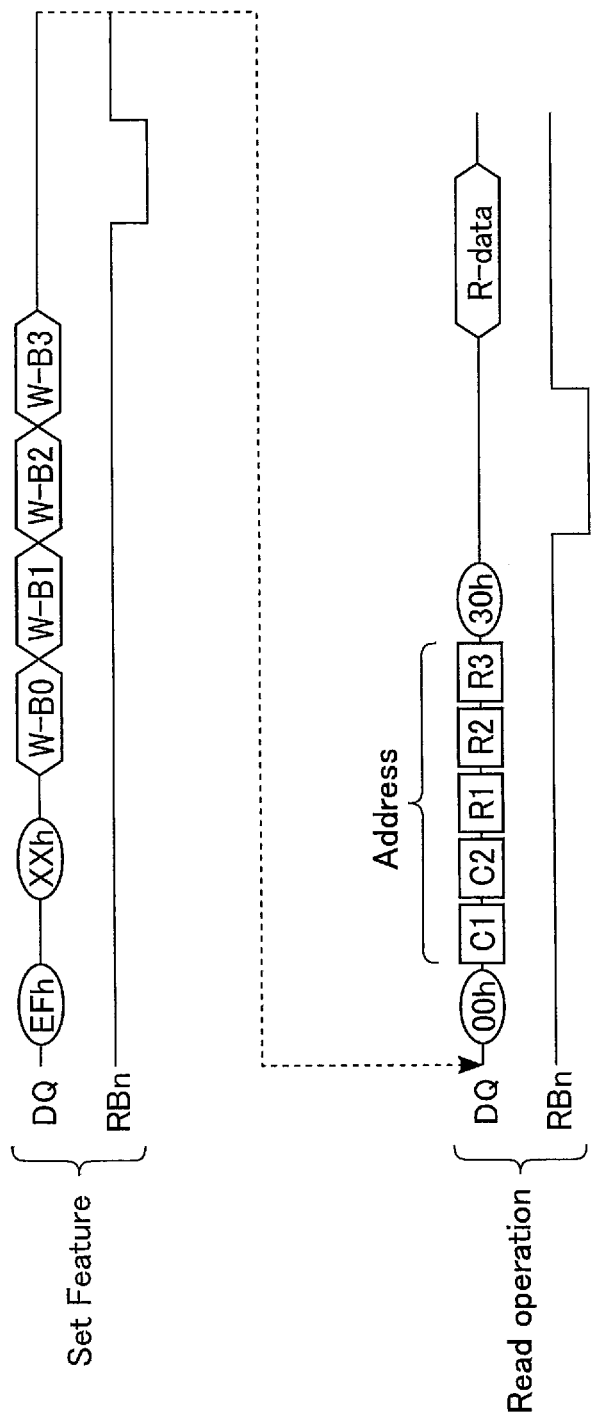
F I G. 13

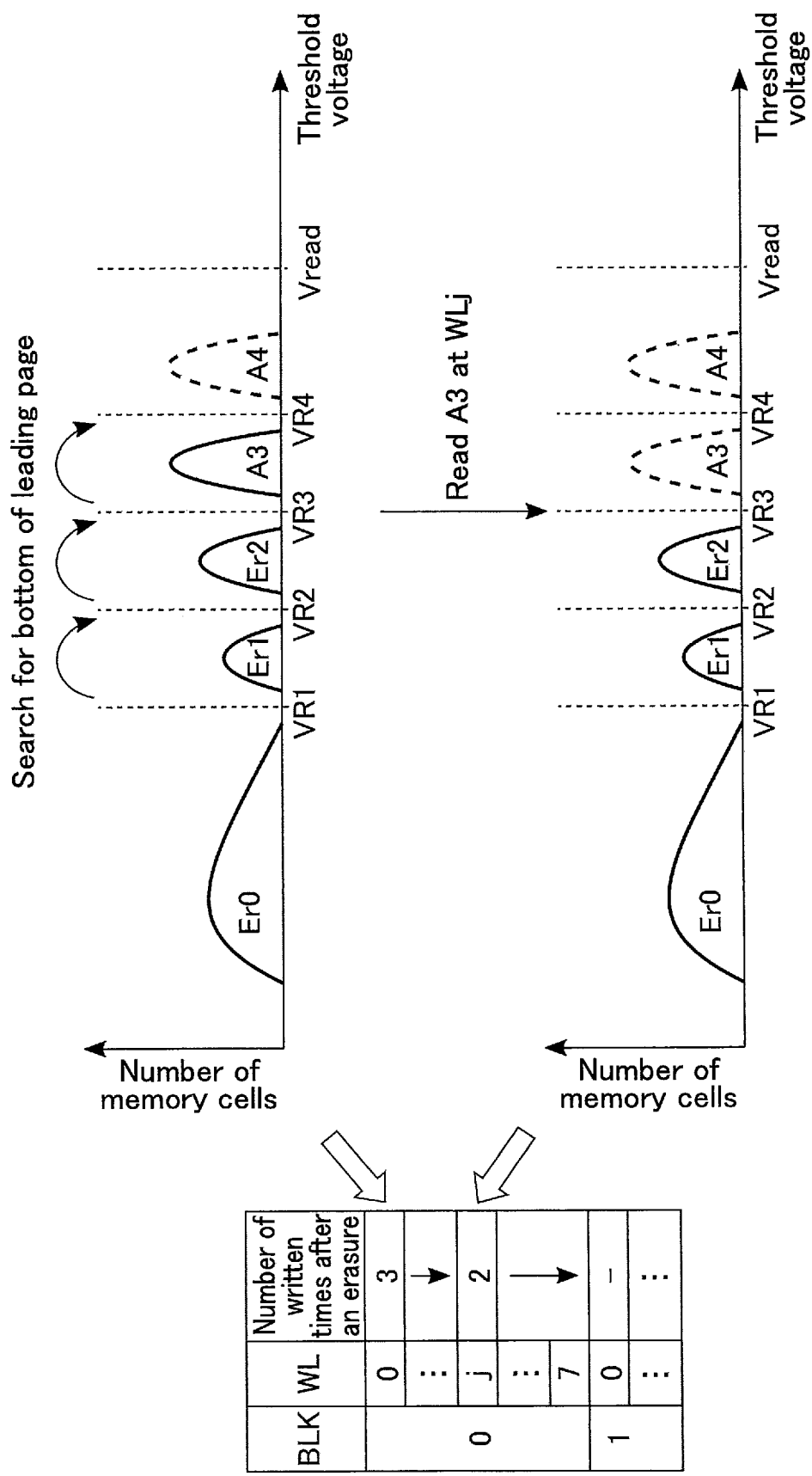
F I G. 15

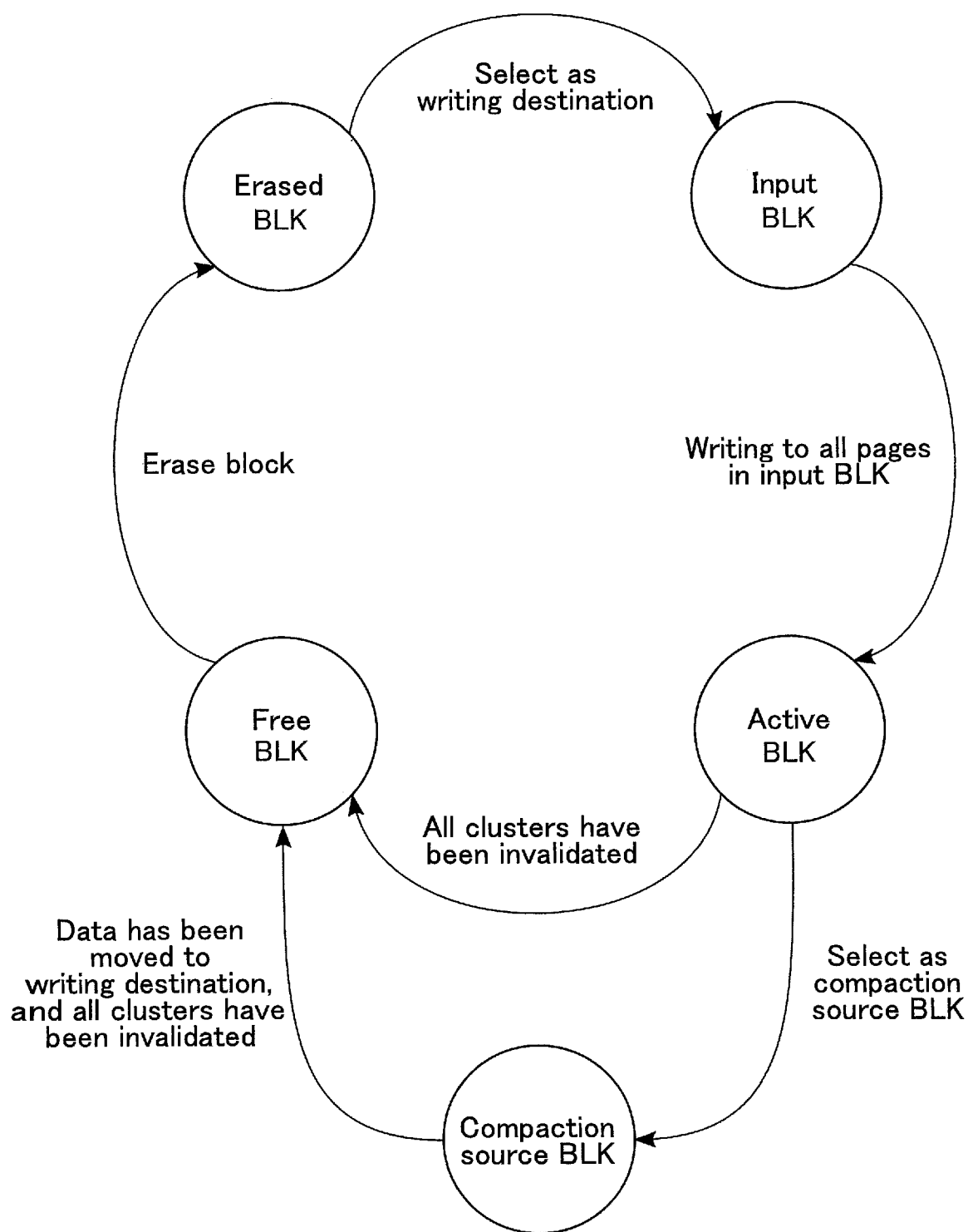
F I G. 17

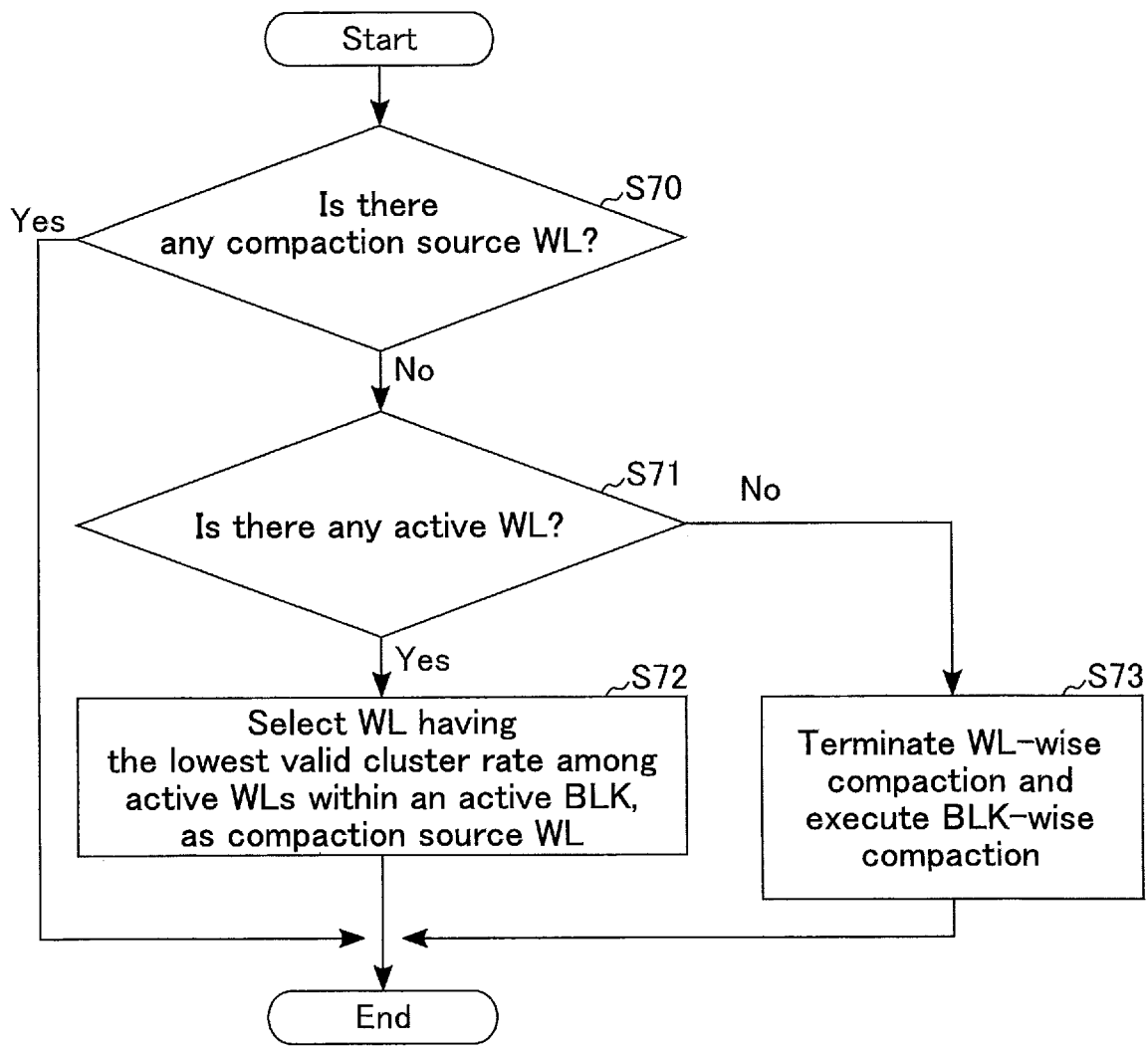
F I G. 21

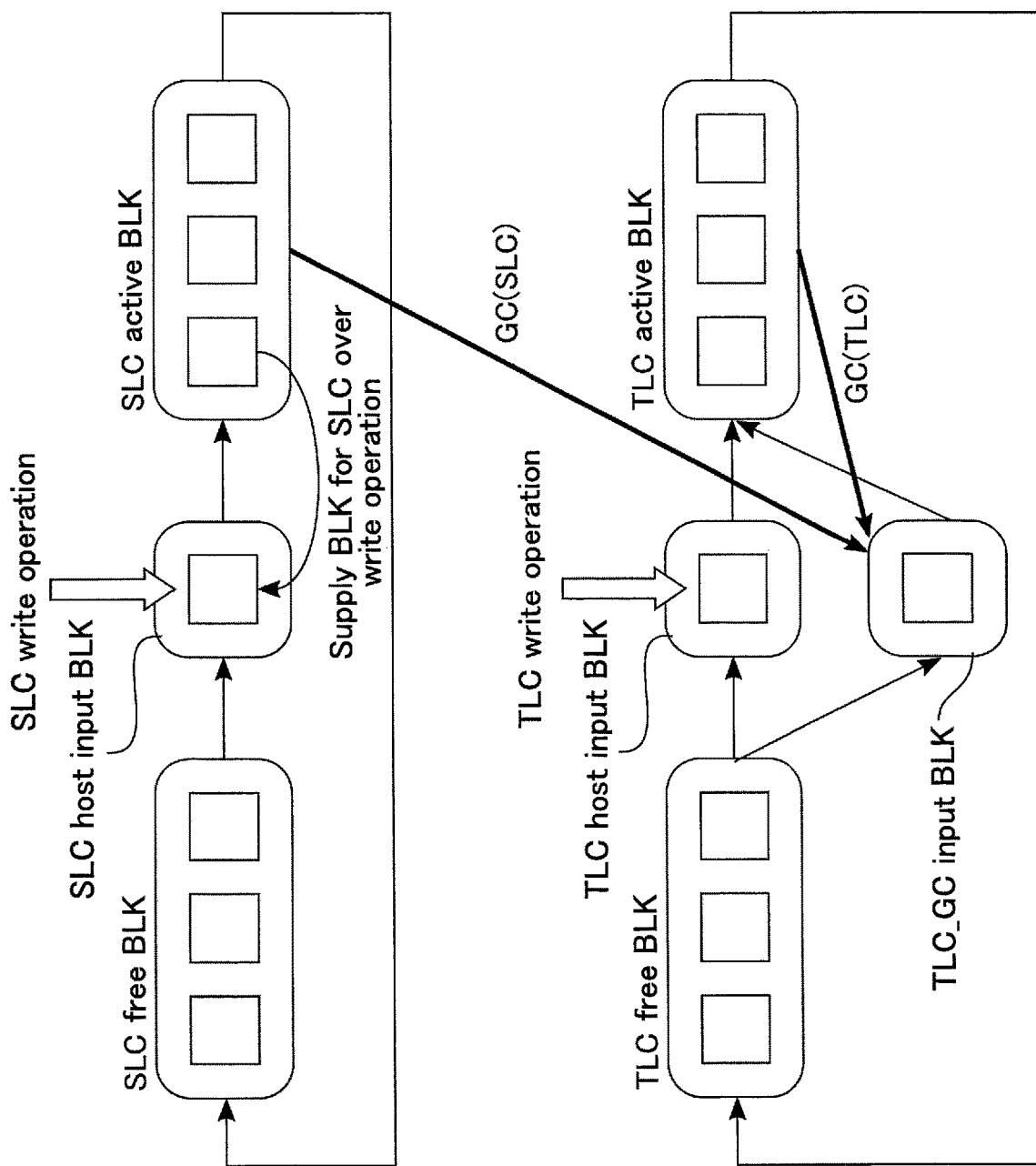
F I G. 24

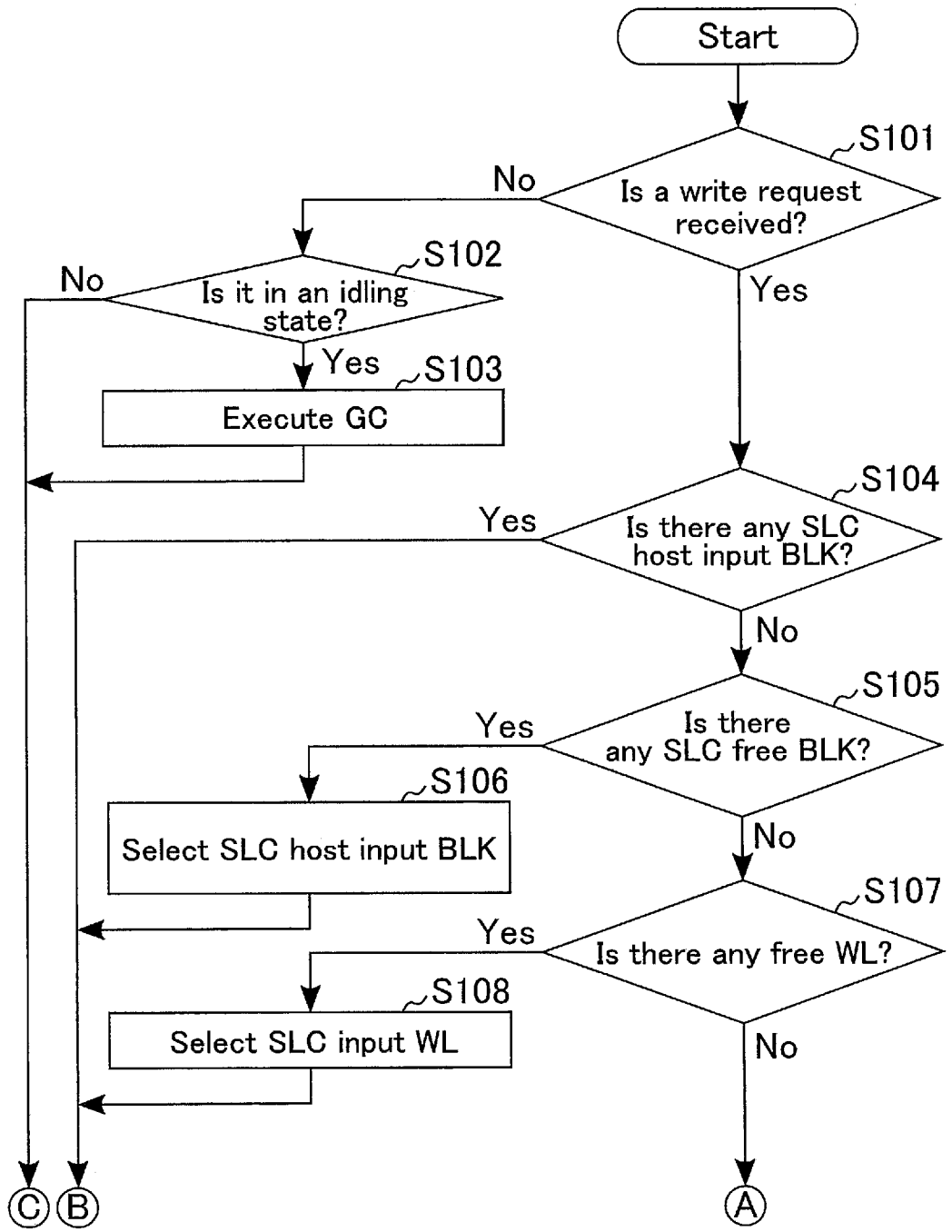
F I G. 30

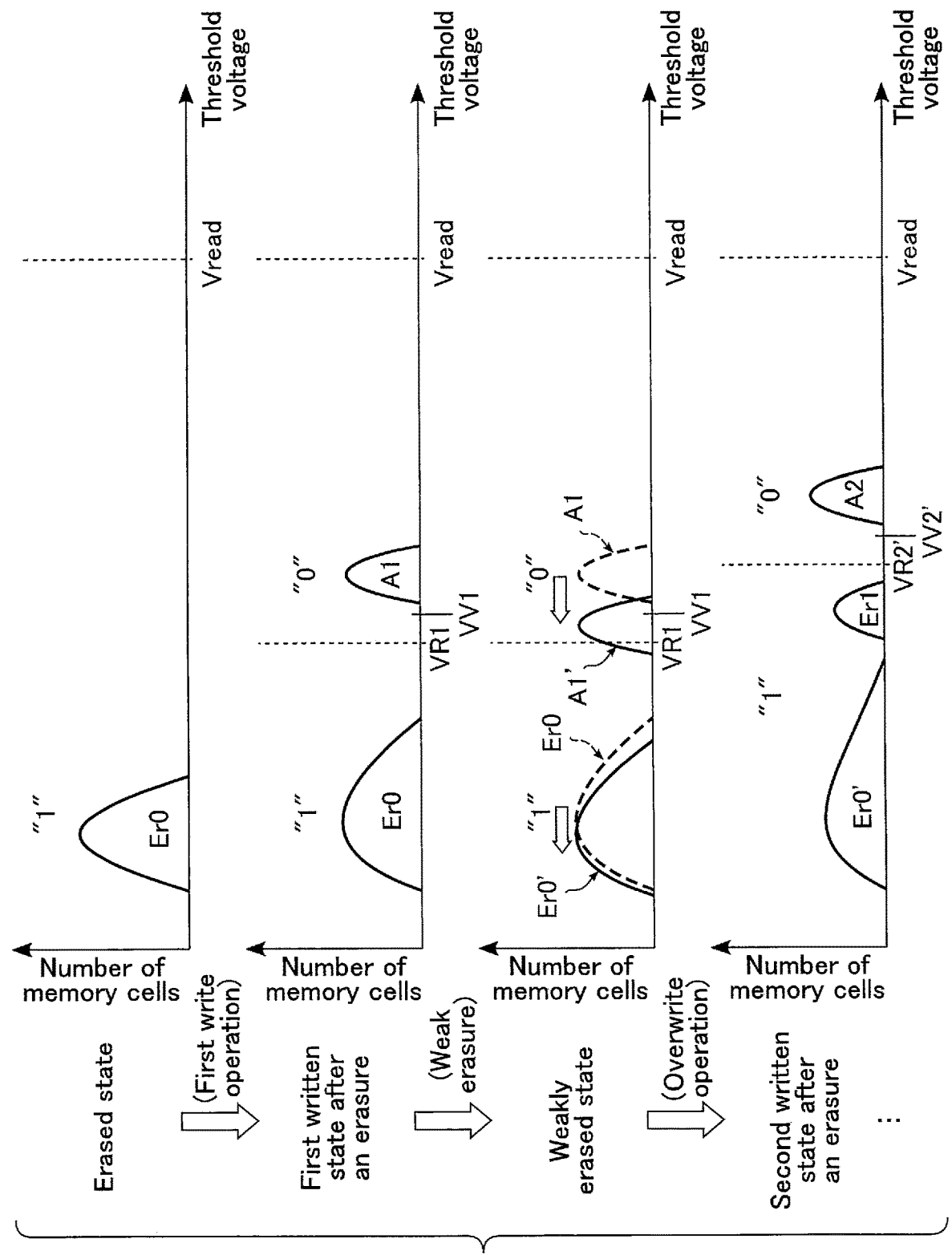
F I G. 32

SEMICONDUCTOR MEMORY MEDIUM AND MEMORY SYSTEM

CROSS-REFERENCE TO RELATED APPLICATIONS

This application is based upon and claims the benefit of priority from Japanese Patent Application No. 2020-022377, filed Feb. 13, 2020, the entire contents of which are incorporated herein by reference.

FIELD

Embodiments described herein relate generally to a semiconductor memory medium and a memory system.

BACKGROUND

As a memory system, a solid state drive (SSD) mounted with a nonvolatile semiconductor memory, such as a NAND-type flash memory, is known.

BRIEF DESCRIPTION OF THE DRAWINGS

FIG. 2 is a block diagram of a semiconductor memory medium included in the memory system according to the first embodiment;

FIG. 8 is a parameter table corresponding to the first to third write operations in the memory system according to the first embodiment;

FIG. 11 is a diagram illustrating a program voltage and a verify voltage corresponding to the first to third write operations after an erasure in the memory system according to the first embodiment;

FIG. 13 is a command sequence of a Set Feature and a read operation in the memory system according to the first embodiment;

FIG. 15 is an exemplary diagram of a "Number of written times after erasure" search operation in the memory system according to the second embodiment;

FIG. 17 is a state transition diagram of a block in the memory system according to the third embodiment;

FIG. 21 is a flowchart illustrating a selection operation of a compaction source block and a compaction source word line in the memory system according to the third embodiment;

FIG. 24 is a state transition diagram of an SLC block BLK and a TLC block BLK in the semiconductor memory medium included in the memory system according to the fourth embodiment;

FIGS. 30 and 31 are flowcharts of a write operation in the memory system according to the fifth embodiment;

FIG. 32 is a diagram illustrating a threshold voltage distribution corresponding to the first and second written data after an erasure in a memory system according to a sixth embodiment.

DETAILED DESCRIPTION

In general, according to one embodiment, the semiconductor memory medium includes a first memory cell, a first word line coupled to the first memory cell, and a row decoder coupled to the first word line. A write operation is executed multiple times on the first memory cell within a first period from after an execution of an erase operation to an execution of a next erase operation. The write operation includes at least one of program loops each including a program operation and a verify operation. In the verify operation, the row decoder applies a verify voltage to the first word line. The verify voltage is set in accordance with a number of executed write operations on the first memory cell within the first period.

Hereinafter, the embodiments will be described with reference to drawings. The drawings are schematic ones. In the description below, elements having substantially the same functions and configurations will be denoted by the

1. First Embodiment

In the description below, the memory system according to the first embodiment will be described.

1.1 Configuration

1.1.1 Configuration of Memory System

Figure 1:
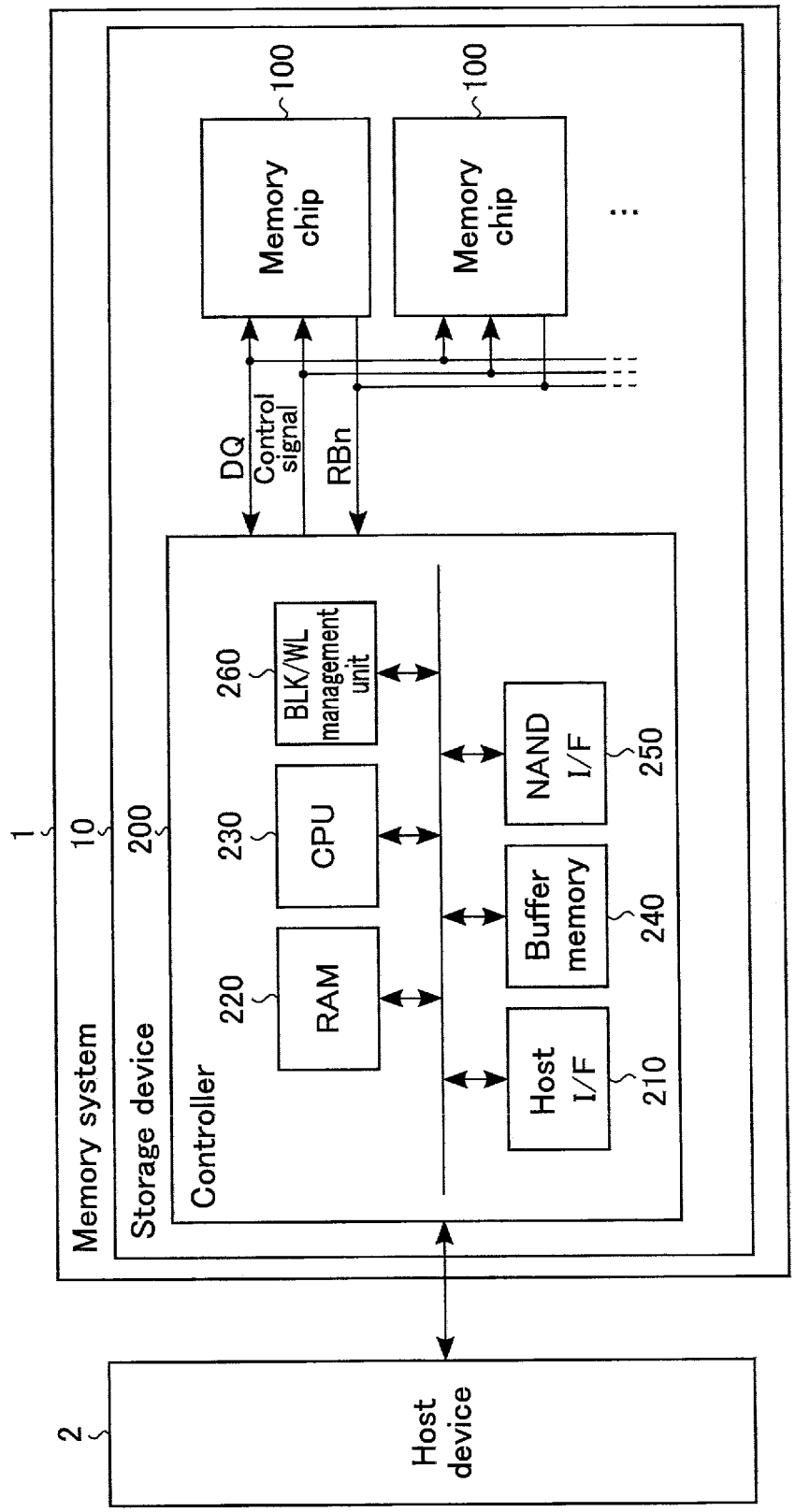
FIG. 1 is a block diagram of a memory system according to a first embodiment.

First, an example of the overall configuration of a memory system 1 will be described with reference to FIG. 1.

The memory system 1 includes a storage device 10. The storage device 10 is, for example, a solid state drive (SSD). The storage device 10 is coupled to a host device 2, which is an external information processing device. The storage device 10 includes a plurality of memory chips 100 and a controller 200.

Each memory chip 100 is a nonvolatile memory capable of storing data in a nonvolatile manner. The plurality of memory chips 100 can operate independently of each other. It should be noted that any number of memory chips 100 may be included in the memory system 1, and it suffices that the memory system is provided with one or more chips. In the description below, a case will be described where the memory chip 100 is a three-dimensionally stacked NAND-type flash memory.

The controller 200 instructs the memory chip 100 to execute a read operation, a write operation, an erase operation, etc. based on a request (instruction) from the host device 2. The controller 200 may be, for example, a system on a chip (SoC). Each function of the controller 200 may be implemented either via a dedicated circuit or by executing firmware via a processor. In the present embodiment, a case will be described where a dedicated circuit is provided in the controller 200.

The controller 200 includes a host interface circuit 210, a built-in memory (RAM) 220, a processor (central processing unit (CPU)) 230, a buffer memory 240, a NAND interface circuit 250 and a BLK/WL management unit 260.

The host interface circuit 210 is a hardware interface that controls communications with the host device 2. For example, the host interface circuit 210 transfers an instruction and data received from the host device 2 to CPU 230 and the buffer memory 240, respectively. In addition, the host interface circuit 210 transfers data, etc. in the buffer memory 240 to the host device 2, in response to the instruction of CPU 230.

RAM 220 is, for example, a semiconductor memory such as DRAM. RAM 220 holds firmware for managing the memory chips 100 and various kinds of management tables. RAM 220 holds, for example, a "Number of written times after erasure" table to be described later. Furthermore, RAM 220 is used as a working area of CPU 230.

CPU 230 controls the overall operation of the controller 200. More specifically, CPU 230 controls the host interface circuit 210, RAM 220, buffer memory 240, NAND interface circuit 250 and BLK/WL management unit 260. For example, CPU 230 issues a write command in response to a write instruction received by the host device 2 and transmits the issued write command to the NAND interface circuit 250. This operation is similar to the case of a read instruction and an erase instruction. In the memory system 1 of the present embodiment, it is possible to instruct the memory chip 100 to execute an overwrite operation of data on the same memory cell transistor. That is, CPU 230 can execute a write operation multiple times on one memory cell transistor capable of holding, for example, 1 bit data in a period which begins after the execution of an erase operation and ends with the execution of the next erase operation (hereinafter, referred to as a "period from after the execution of an erase operation to the execution of the next erase operation). In other words, after executing a write operation of first write data on a certain memory cell transistor, CPU 230 can execute a write operation of second write data which differs from the first write data without executing an erase operation on the same memory cell transistor MC. In the description below, the number of write operation times executed on the same memory cell transistor in the period from after the execution of an erase operation to the execution of the next erase operation is referred to as "the number of written times after an erasure". Therefore, CPU 230 transmits write instructions and read instructions corresponding to the number of written times after an erasure to the memory chips 100, based on the information of written times after an erasure received from the BLK/WL management unit 260. Furthermore, CPU 230 executes various kinds of processing for managing memory spaces of the memory chip 100, such as wear-leveling or garbage collection.

The buffer memory 240 is a semiconductor memory that temporarily holds read data received by the controller 200 from the memory chip 100 and written data received by the controller 200 from the host device 2 (hereinafter, also referred to as "host data"), etc.

The NAND interface circuit 250 is a hardware interface that controls communications with the memory chip 100. For example, the NAND interface circuit 250 transmits various kinds of control signals to the memory chip 100, based on an instruction received from CPU 230. The NAND interface circuit 250 transmits a ready/busy signal RBn received from the memory chip 100 to CPU 230. Furthermore, the NAND interface circuit 250 transmits and receives a signal DQ to and from the memory chip 100. The ready/busy signal RBn is a signal to notify the controller 200 whether or not the memory chip 100 is in a state of being able to receive an instruction from the controller 200. For example, the ready/busy signal RBn is set to a High ("H") level when the memory chip 100 is in a state of being able to receive (ready state) an instruction from the controller 200, and is set to a Low ("L") level when the memory chip 100 is in a state of being unable to receive (busy state) an instruction from the controller 200. The signal DQ is, for example, an 8-bit-wide signal and includes a command, an address, data, etc. More specifically, a signal DQ transferred to the memory chip 100, for example, during a write operation, includes a write command and an address issued by CPU 230 and written data in the buffer memory 240. The address is provided to data for which an access (a read operation, a write operation, an erase operation, etc.) is requested from the host device 2. In addition, in the read operation, the signal DQ transferred to the memory chip 100 during a read operation includes a read command and an address issued by CPU 230, and the signal DQ transferred to the controller 200 includes read data.

The BLK/WL management unit 260 manages the number of written times (the number of times for execution of a write operation) after an erasure in the memory chip 100, for example, using the "Number of written times after erasure" table which includes information on the number of written times after an erasure.

1.1.2 Configuration of Semiconductor Memory Device

Next, an example of the overall configuration of the memory chip 100 will be described with reference to FIG. 2. In the example of FIG. 2, a portion of coupling between respective blocks is indicated by an arrow line, but the coupling between the respective blocks is not limited thereto.

The memory chip 100 includes an input/output circuit 101, a logic control circuit 102, a status register 103, an address register 104, a command register 105, a sequencer 106, a ready/busy circuit 107, a voltage generator 108, a memory cell array 109, a row decoder 110, a sense amplifier 111, a data register 112, and a column decoder 113.

The input/output circuit 101 controls inputs and outputs of signals DQ (DQ0 to DQ7) in and to the controller 200. Signal DQ includes, for example, data DAT, an address ADD, and a command CMD. More specifically, the input/output circuit 101 transmits: data DAT received from the controller 200 to the data register 112, the address ADD to the address register 104, and the command CMD to the command register 105. Furthermore, the input/output circuit 101 transmits the status information STS received from the status register 103, data DAT received from the data register 112, address ADD received from the address register 104, etc., to the controller 200.

The logic control circuit 102 receives various kinds of control signals from the controller 200. The logic control circuit 102 then controls the input/output circuit 101 and the sequencer 106 in accordance with the received control signal. More specifically, the logic control circuit 102 receives, from the controller 200, for example, a chip enable signal CEn, a command latch enable signal CLE, an address latch enable signal ALE, a write enable signal WEn, and a read enable signal REn. The chip enable signal CEn is a signal for enabling the memory chip 100 and is asserted, for example, at the low ("L") level. The command latch enable signal CLE is a signal indicating that the signal DQ is a command and is asserted, for example, at the high ("H") level. The address latch enable signal ALE is a signal indicating that the signal DQ is an address and is asserted, for example, at the high ("H") level. The write enable signal WEn is a signal for taking the received signal in the memory chip 100 and is asserted, for example, at the "L" level, every time a command, an address, data, etc., is received from the controller 200. Therefore, every time the write enable signal WEn is toggled, a signal DQ is taken in the memory chip 100. The read enable signal REn is a signal for the controller 200 to read data from the memory chip 100. The read enable signal REn is asserted, for example, at the "L" level. Therefore, the memory chip 100 outputs a signal DQ to the controller 200, based on the read enable signal REn being toggled.

The status register 103 temporarily holds status information STS, for example, in a write operation, a read operation, or an erase operation and notifies the controller 200 whether or not the operation has been ended normally. In addition, for example, information indicating a ready/busy state of the memory chip 100 may be included in the status information STS.

The address register 104 temporarily holds the received address ADD. Then, the address register 104 transfers a row address RA to the row decoder 110 and transfers a column address CA to the column decoder 113.

The command register 105 temporarily holds the received command CMD, and transfers the received command CMD to the sequencer 106.

The sequencer 106 controls the overall operation of the semiconductor memory medium 1. More specifically, the sequencer 106 controls, for example, the status register 103, ready/busy circuit 107, voltage generator 108, row decoder 110, sense amplifier 111, data register 112, column decoder 113, etc., in accordance with the received command CMD and executes a write operation, a read operation, an erase operation, etc.

The ready/busy circuit 107 transits a ready busy signal RBn to the controller 200 in accordance with the operation state of the sequencer 106.

The voltage generator 108 generates voltages necessary for a write operation, a read operation and an erase operation, in accordance with the control of the sequencer 106, and supplies the generated voltages to, for example, the memory cell array 109, row decoder 110, sense amplifier 111, column decoder 113, etc.

The memory cell array 109 includes a plurality of blocks BLK (BLK0, BLK1, BLK2, . . . ) which includes a plurality of nonvolatile memory cell transistors (hereinafter, also referred to as "memory cells") corresponding rows and columns. It should be noted that any number of blocks BLK may be included in the memory cell array 109. In the description below, a block is referred to as "block BLK or BLKi" (i is an integer of 0 or more) unless the block is not limited to the block BLK0, BlK1, BLK2, . . . . The details of the memory cell array 109 will be described later.

The row decoder 110 decodes a row address RA received from the controller 200. The row decoder 110 then selects a direction of rows of the memory cell array 109 based on the decoding result. More specifically, the row decoder 110 applies voltages to various interconnects (word lines and select gate lines) for selecting the row direction.

The sense amplifier 111 senses data read from any one of the blocks BLK at the time of a read operation. The sense amplifier 111 then transmits the read data to the data register 112. Furthermore, the sense amplifier 111 gives voltages in accordance with write data to the memory cell array 109.

The data register 112 includes a plurality of latch circuits (not shown). The latch circuits hold written data or read data, temporarily.

The column decoder 113 decodes a column address CA, for example, at the time of a write operation, a read operation and an erase operation, and selects the latch circuits in the data register 112 in accordance with the decoded result.

1.1.3 Circuit Configuration of Memory Cell Array

Figure 3:
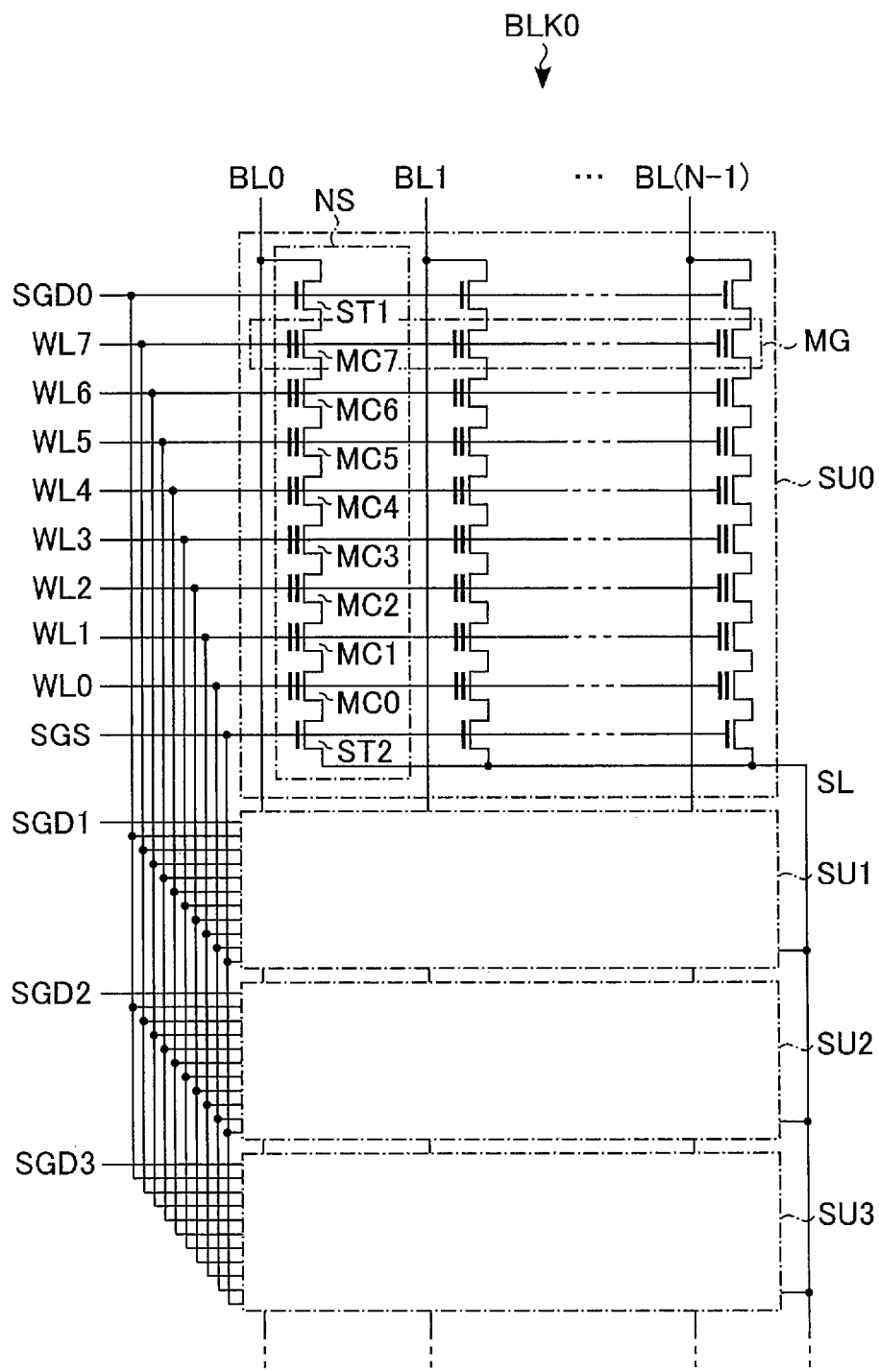
FIG. 3 is a circuit diagram of a memory cell array in the semiconductor memory medium included in the memory system according to the first embodiment.

Next, an example of a circuit configuration of the memory cell array 109 will be described with reference to FIG. 3. The example of FIG. 3 illustrates a block BLK0, but the configurations of the other blocks BLK are the same as that of the block BLK0.

The block BLK0 includes, for example, four string units SU0 to SU3. Each of the four string units includes a plurality of NAND stings NS.

One NAND string NS includes a plurality of memory cell transistors MC and select transistors ST1 and ST2.

The memory cell transistor MC includes a control gate and a charge storage layer, and holds data in a nonvolatile manner. The memory cell transistor MC may be a MONOS type using an insulating layer as the charge storage layer or an FG type using a conductive layer as the charge storage layer. The number of memory cell transistors MC included in one NAND string NS is, for example, eight (MC0 to MC7). The number of memory cell transistors MC included in one NAND string NS is not limited to eight, and may be 16, 32, 64, 96, 128, etc.

Any number of each of the select transistors ST1 and ST2 may be included in one NAND string NS, and the number of each of the select transistors ST1 and ST2 needs to be one or more.

In one NAND string NS, respective current paths for the select transistor ST2, the plurality of memory cell transistors MC, and the select transistor ST1 are coupled in series in this order.

The select transistor ST2 includes a source. The sources of select transistors ST2 in the plurality of blocks BLK are coupled in common to a source line SL.

The memory cell transistors MC respectively include a control gate. The control gates of the memory cell transistors MC in one NAND string NS are respectively coupled to different one word line WL. In addition, one word line WL is coupled to the control gate of one memory cell transistor included in each of the plurality of NAND strings NS provided in one block BLK. More specifically, for example, the control gate of one memory cell transistor MC0 included in each of the plurality of NAND strings NS provided in a block BLK is coupled in common to the word line WL0. The number of word lines WL is, for example, eight (WL0 to WL7).

The select transistors ST1 and ST2 respectively include gates. The gate of the select transistor ST1 included in each of the plurality of NAND strings NS provided in one string unit SU is coupled in common to one select gate line SGD. More specifically, the gate of the select transistor ST1 included in each of the plurality of NAND strings NS provided in the string unit SU0 is coupled to a select gate line SGD0. Furthermore, the gate of the select transistor ST2 included in each of the plurality of NAND strings NS provided in one block BLK is coupled in common to one select gate line SGS. Alternatively, the gate of the select transistor ST2 included in each of the plurality of NAND strings NS provided in one block BLK may be coupled to a plurality of select gate lines SGS which are different for each string unit SU.

The select transistor ST1 includes a drain. The drains of select transistors ST1 included in each of the plurality of NAND strings NS provided in one string unit SU are each coupled to a different bit line BL. That is, a plurality of NAND strings NS provided in one string unit SU are respectively coupled to different bit lines BL. In addition, a bit line BL couples, in common, one NAND string NS included in the string units SU provided in one block BLK.

That is, the string unit SU is an aggregate of NAND strings NS, each of which is coupled to a different bit line BL and to the same select gate SGD. The block BLK is an aggregate of a plurality of string units SU coupled in common to a word line WL. The memory cell array 109 is an aggregate of a plurality of blocks BLK coupled in common to a bit line BL.

The aggregate of the plurality of memory cell transistors MC coupled to a common word line WL in one string unit SU, is referred to as a "memory cell group MG". For example, the memory capacity of a memory cell group MG including memory cell transistors MC each storing 1-bit data is defined as "1 page". The memory cell group MG is capable of holding data of two or more pages in accordance with the number of bits of data to be stored in the memory cell transistor MC. In the present embodiment, a case will be described where the memory cell transistor MC functions as a single level cell (SLC) that holds 1-bit data. In the description below, a write operation of 1-bit data to SLC is referred to as an "SLC write operation".

1.2 Write Operation

Next, the write operation will be described. The write operation includes a data-in operation, a program operation, and a verify operation. The threshold voltage of the memory cell transistor MC is then increased to a target level by repeating a combination of the program operation and a program verify operation (hereinafter, referred to as a "program loop").

The data-in operation is an operation for storing written data received from the controller 200 in the data register 112. Upon completion of the data-in operation, the program operation is subsequently executed. After starting the program operation, the data-in operation is not executed.

The program operation is an operation for increasing the threshold voltage by injecting electrons into the charge storage layer (or maintaining the threshold voltage by inhibiting the injection).

The program verify operation is an operation for reading data after the program operation and determining whether or not the threshold voltage of the memory cell transistor MC has reached an intended target level.

In the present embodiment, multiple times of an SLC write operation can be executed for one memory cell transistor MC in a period from after the execution of an erase operation to the execution of the next erase operation.

1.2.1 Threshold Voltage Distribution of SLC Write Operation

Figure 4:
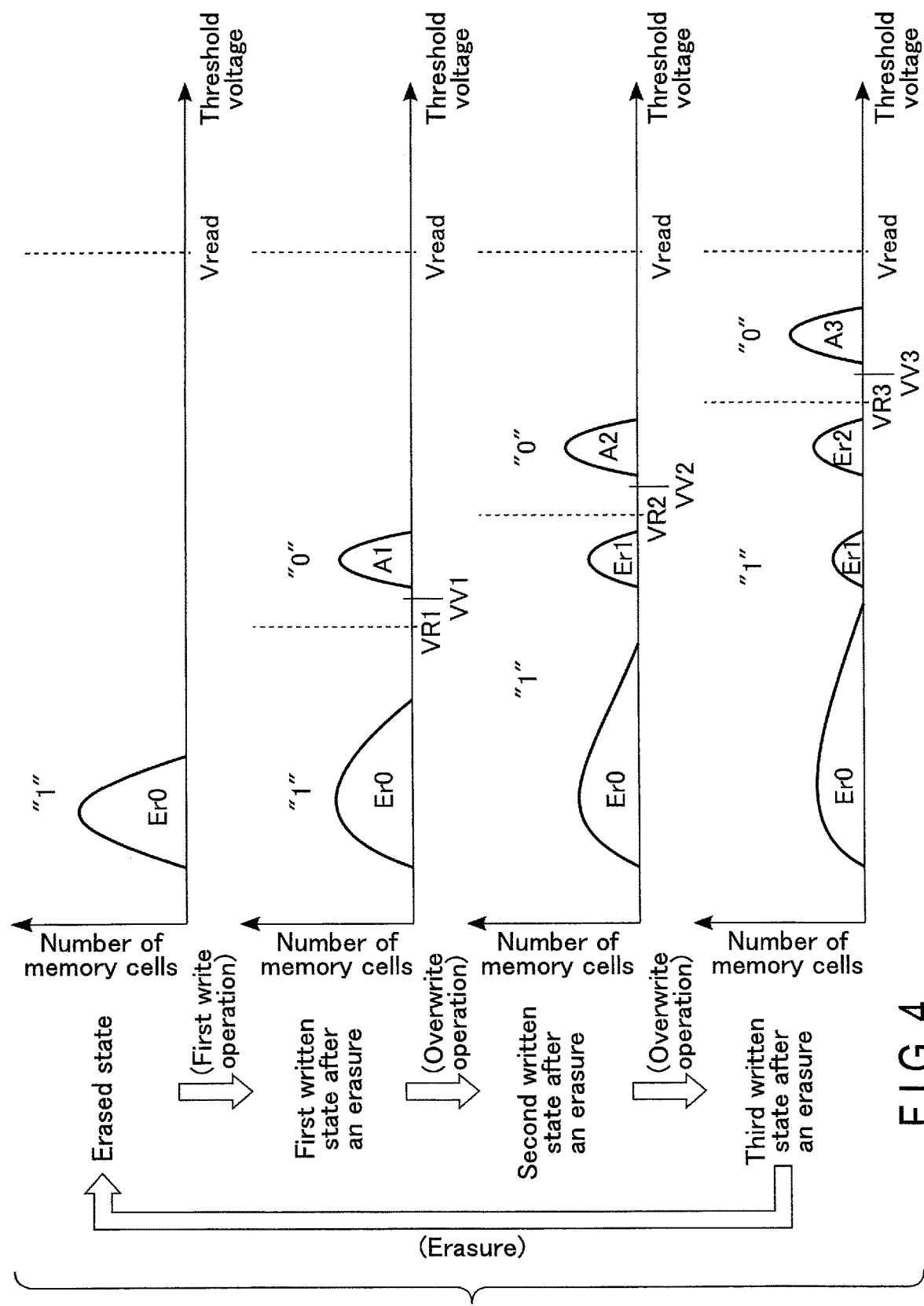
FIG. 4 is a diagram illustrating a threshold voltage distribution corresponding to first to third written data in the memory system according to the first embodiment.

Next, an example of a threshold voltage distribution of an SLC write operation will be described with reference to FIG. 4. The example of FIG. 4 illustrates a case where an SLC write operation is executed three times on one memory cell group MG after an erasure, i.e., a case where two overwrite operations are executed.

The threshold voltage distribution of a memory cell transistor MC in an erased state is referred to as an "Er0" state. For example, in the erased state, "1" data is allocated to the "Er0" state.

In the first SLC write operation after an erasure, data stored in the data register 112 at the time of the data-in operation of the first SLC write operation after an erasure is written in memory cell transistors MC to be written (write target), such that the threshold voltages of the memory cell transistors MC increase from the "Er0" state to an "A1" state. For example, "1" data is allocated to the "Er0" state, and "0" data is allocated to the "A1" state. In the case where a read voltage corresponding to the first SLC write operation after an erasure is denoted by VR1, and a verify voltage corresponding thereto is denoted by VV1, voltages VR1 and VV1 have a relationship of VR1≤VV1<Vread. The read voltage VR1 is a voltage applied to a target word line WL (hereinafter, referred to as a "selected word line WL") in a read operation. The verify voltage VV1 is a voltage applied to the selected word line WL in a program verify operation. The voltage Vread is a voltage applied to a non-target word line WL (hereinafter, referred to as a "non-selected word line WL") in the read operation. When the voltage Vread is applied to the gate of the memory cell transistor MC, the memory cell transistor MC is set to the ON state, irrespective of the data to be held by the memory cell transistor MC. The threshold voltage of the memory cell transistor MC in the "Er0" state is lower than a voltage VR1. The threshold voltage of the memory cell transistor MC in the "A1" state is equal to or higher than the voltage VV1 and lower than the voltage Vread.

In the second SLC write operation after the erasure, the data stored in the data register 112 at the time of the data-in operation of the second SLC write operation after the erasure is written in the memory cell transistors to be written (write target), such that the threshold voltages of the memory cell transistors increase from the "Er0" state or "A1" state to an "A2" state. After the second write operation after an erasure, the "A1" state is also treated as an erased state, and therefore, the "A1" state is referred to as "Er1" state. For example, "1" data is allocated to, for example, the "Er0" state and "Er1" state, and "0" data is allocated to the "A2" state. In the case where a read voltage corresponding to the second SLC write operation after the erasure is denoted by VR2, and a verify voltage corresponding thereto is denoted by VV2, voltages VR2 and VV2 have a relationship of VR1≤VV1<VR2≤VV2<Vread. The threshold voltages of memory cell transistors MC in the state of "Er0" and "Er1" are lower than the voltage VR2. The threshold voltage of the memory cell transistor MC in the "A2" state is equal to or higher than the voltage VV2 and lower than the voltage Vread.

In the third SLC write operation after the erasure, the data stored in the data register 112 is written in a memory cell transistor MC by the data-in operation of the third SLC write operation after the erasure, such that the threshold voltage of the memory cell transistor MC increases from the "Er0" state, "Er1" state, or "A2" state to an "A3" state. After the third SLC write operation after an erasure, the "A2" state is also treated as an erased state, and thus referred to as "Er2". For example, "1" data is allocated to the "Er0" state, "Er1" state and "Er2" state, and "0" data is allocated to the "A3" state. Where a read voltage corresponding to the third SLC write operation after the erasure is denoted by VR3, and a verify voltage corresponding thereto is denoted by VV3, voltages VR3 and VV3 have a relationship of VR1≤VV1<VR2≤VV2<VR3≤VV3<Vread. The threshold voltages of memory cell transistors MC in the "Er0" state, "Er1" state and "Er2" state are lower than the voltage VR3. The threshold voltage of the memory cell transistor MC in the "A3" state is equal to or higher than the voltage VV3 and lower than the voltage Vread.

In the present embodiment, an SLC write operation is executed three times in a period from after the execution of an erase operation to the execution of the next erase operation. For this reason, the memory cell group MG for which the third SLC write operation is executed after an erasure cannot be used for the next SLC write operation until after the data is erased.

In the example of FIG. 4, when the third SLC write operation after the erasure has ended, the data is erased. It should be noted that the number of written times is not limited to three times. The number of written times after an erasure may be set discretionarily in accordance with the budget between a threshold voltage distribution of "0" data and the Vread.

In the present embodiment, since a threshold voltage distribution differs between "1" data and "0" data in accordance with the number of SLC writing operations after an erasure, it is necessary to set a read voltage and a verify voltage in accordance with the number of written times after an erasure. That is, the conditions for the SLC writing operation and the conditions for the read operation differ in accordance with the number of written times after an erasure.

1.2.2 "Number of Written Times after Erasure" Table

Figure 5:
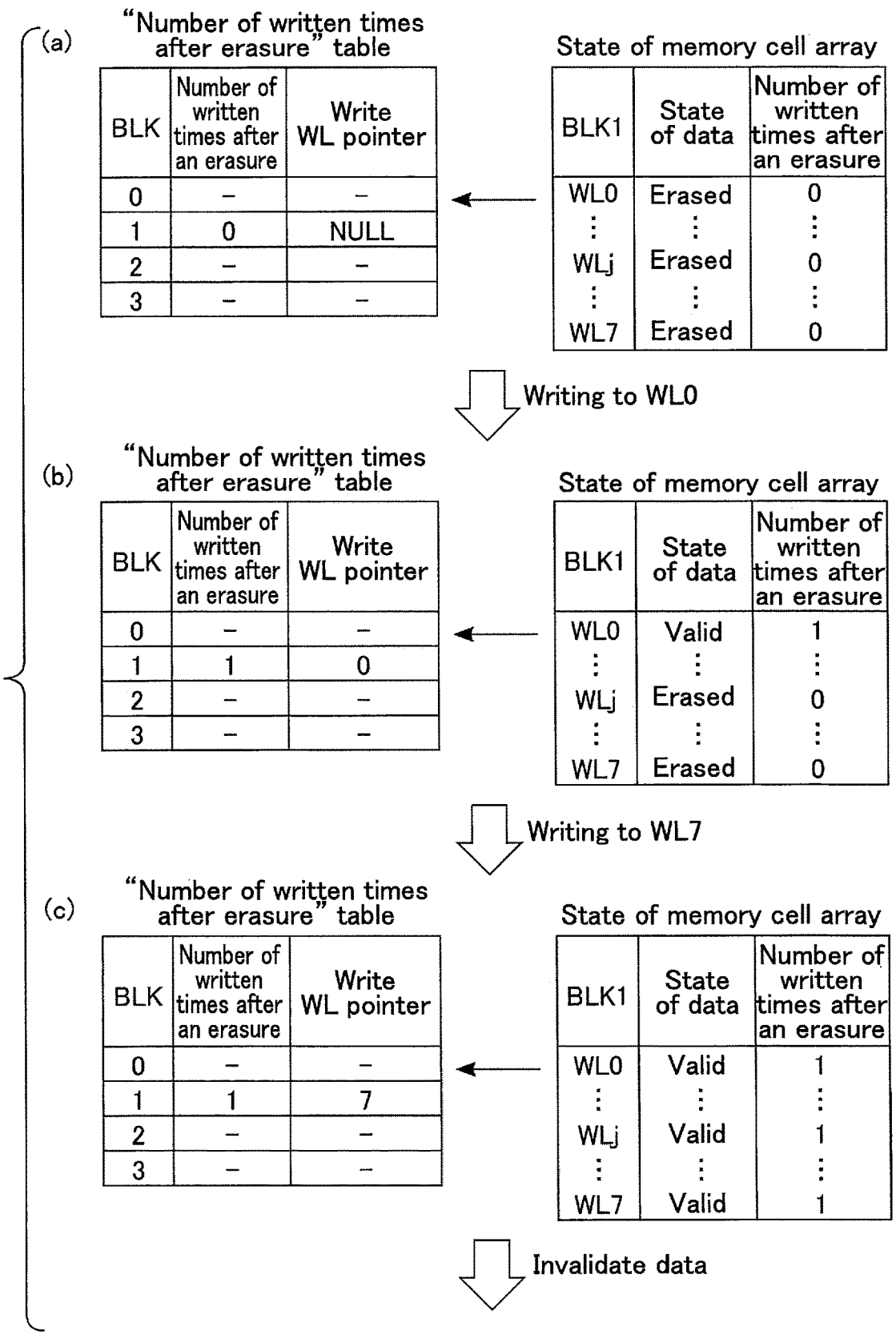
FIGS. 5 to 7 are diagrams illustrating one example of the relationship between a "Number of written times after erasure" table and a memory cell array in a write operation in the memory system according to the first embodiment.
Figure 6:
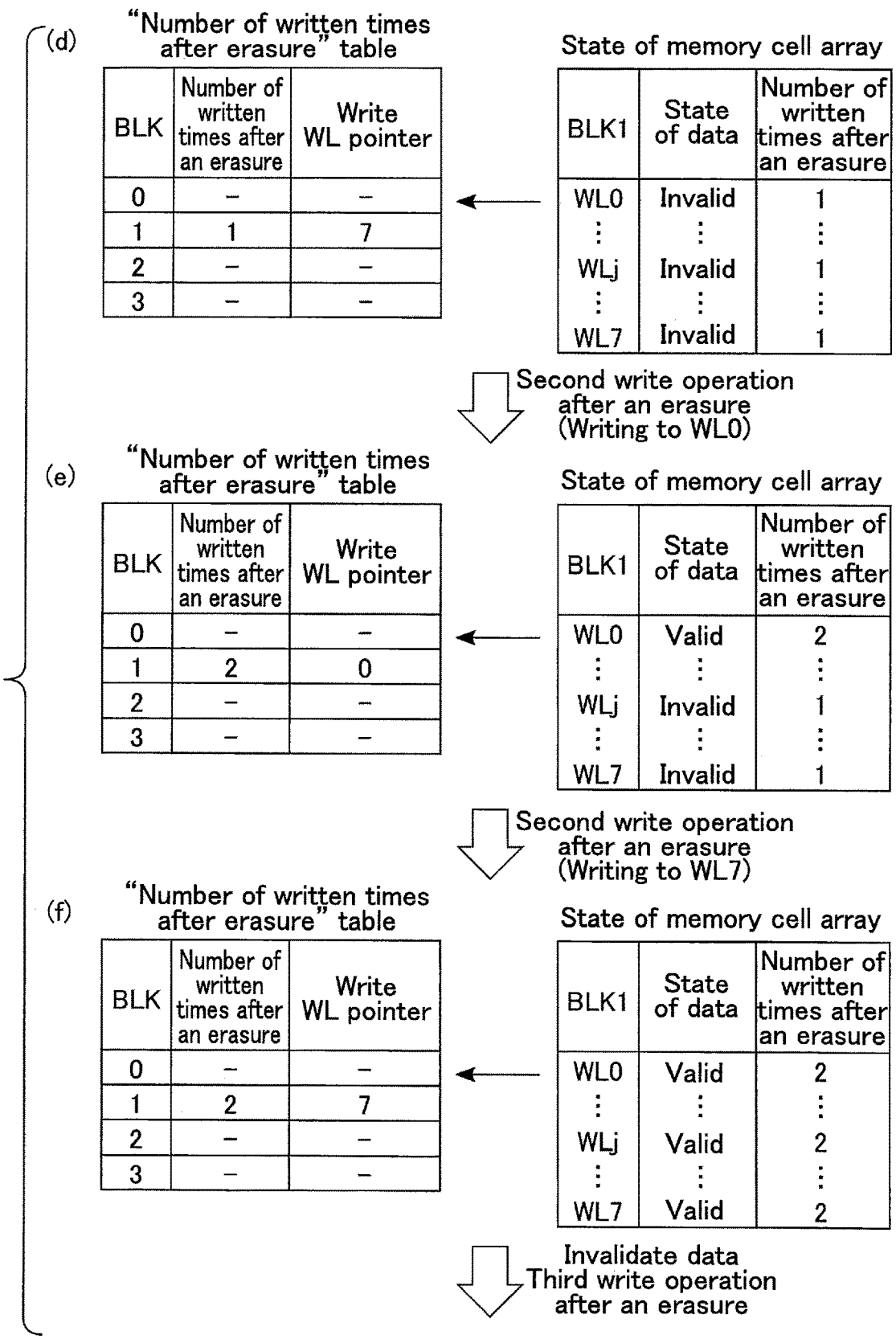
Figure 7:
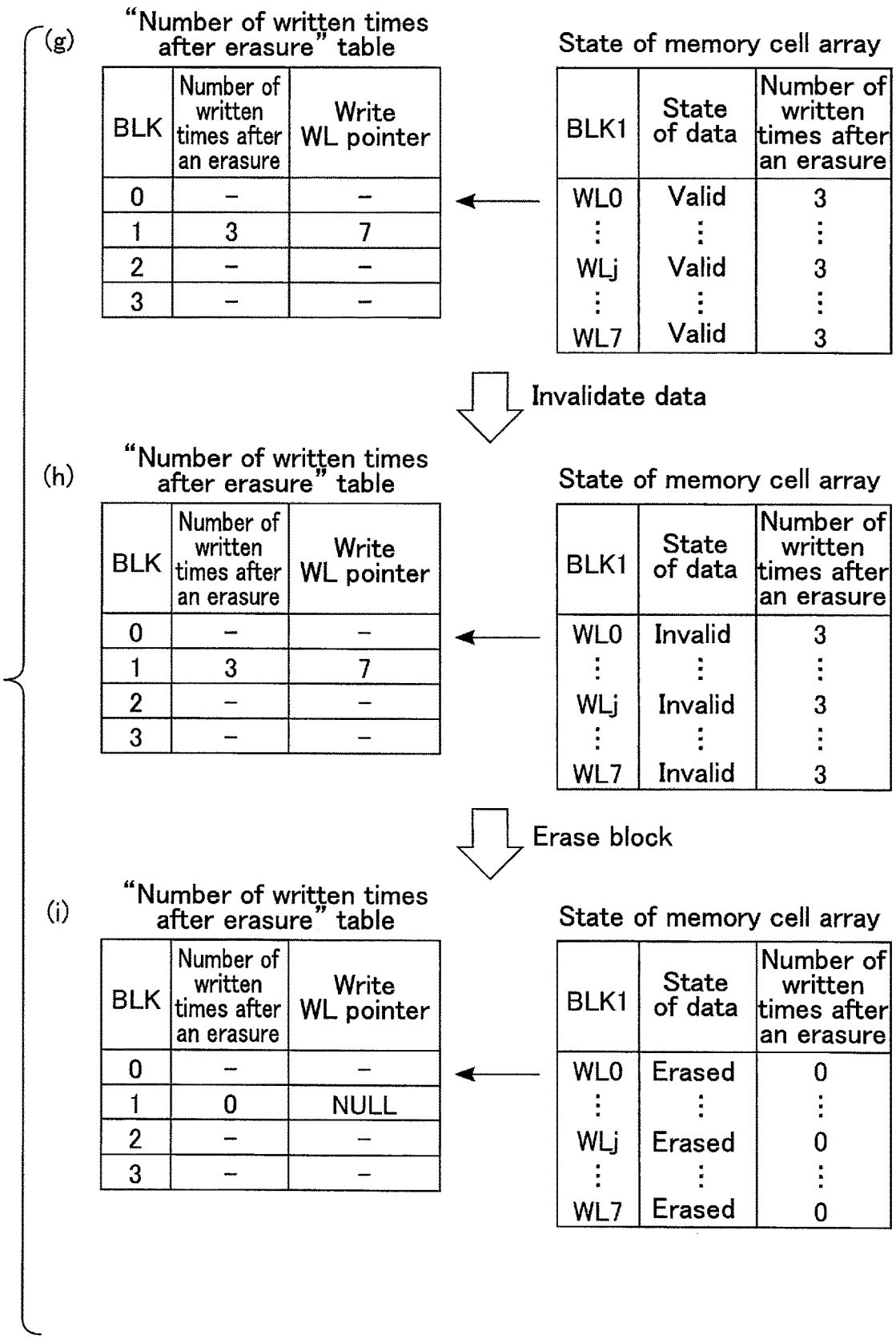

Next, an example of a "Number of written times after erasure" table will be described with reference to FIGS. 5 to 7. The examples of FIGS. 5 to 7 illustrate transitions of the state of the "Number of written times after erasure" table corresponding to an SLC write operation to the block BLK1, and transitions of the state of the memory cell array 109 corresponding thereto. The same applies to the other blocks BLK. It should be noted that in the description below, for the sake of simplification, a case will be described where one string unit SU is included in one block BLK, i.e., a case where one word line WL corresponds to one page (memory cell group MG). In addition, in the present embodiment, the SLC write operation is executed in each block BLK in the order of word lines WL0 to WL7 (hereinafter, also referred to as a "sequential write operation").

For example, the number of written times after an erasure, and the position of a word line WL (hereinafter, referred to as a "write WL pointer") corresponding to the page on which the SLC write operation is executed, is recorded, for example, for each block ELK, in the "Number of written times after erasure" table according to the present embodiment.

First, an erasure in block units (hereinafter, also referred to as a "block erasure") is executed. Where the block BLK 1 is in an erased state (FIG. 5 (*a*)), the BLK/WL management unit 260 sets the number of written times after an erasure of the block BLK1 in the "Number of written times after erasure" table to "0", and sets the write WL pointer to a "NULL" state (i.e., in a state where there are no target word lines WL).

Next, for example, where the first SLC write operation after an erasure is executed on a page corresponding to a word line WL0 in a block BLK1 (FIG. 5 (*b*)), the BLK/WL management unit 260 sets the number of written times after an erasure of the block BLK1 in the "Number of written times after erasure" table to "1". Furthermore, the BLK/WL management unit 260 updates the write WL pointer to "0", correspondingly to the word line WL0. In the example of FIG. 5 (*b*), the data of the page corresponding to the word line WL0 is valid; however, the "Number of written times after erasure" table does not depend on the state of data (i.e., whether the data is valid or invalid).

The memory system 1 includes an address conversion table that associates a logical address received from the host device 2 with a physical address corresponding to the memory area of the memory chip 100. The valid data is data in which the corresponding physical address is associated with any one of the logical addresses. In contrast, invalid data is data in which the corresponding physical address is not associated with a logical address.

Similarly, for example, when the first SLC write operation after an erasure is executed on a page corresponding to the word line WL7 in the block BLK1 (FIG. 5 (*c*)), the BLK/WL management unit 260 maintains the number of written times after an erasure of the block BLK1 at "1" without change, and updates the write WL pointer to "7" in the "Number of written times after erasure" table. It should be noted that in the example of FIG. 5 (*c*), data of pages corresponding to the word lines WL0 to WL7 is valid.

For example, even if the data of the pages corresponding to the word lines WL0 to WL7 of the block BLK1 becomes invalid (FIG. 6 (*d*)), the BLK/WL management unit 260 maintains the data of the "Number of written times after erasure" table. It should be noted that the example of FIG. 6 (*d*) illustrates a case where data becomes invalid in block units; however, the present embodiment is not limited thereto. If data of a page corresponding to at least one of the word lines WL0 to WL7 is invalid, an overwrite operation may be executed on the page corresponding to said word line WL.

Next, for example, where the second SLC write operation after the erasure is executed on a page corresponding to the word line WL0 of the block BLK1, i.e., where a first overwrite operation is executed on that page (FIG. 6 (e)), the BLK/WL management unit 260 sets the number of written times after an erasure of the block BLK1 in the "Number of written times after erasure" table to "2". Then, since the second write operation after an erasure is executed on a page corresponding to the word line WL0, the BLK/WL management unit 260 sets the write WL pointer to "0". It should be noted that in the example of FIG. 6 (e), the data of the page corresponding to the word line WL0 is valid.

Next, for example, when a second SLC write operation, i.e., a first overwrite operation, is executed after an erasure of data up to the page corresponding to the word line WL7 of the block BLK1 (FIG. 6 (f)), the BLK/WL management unit 260 maintains the number of written times after an erasure of the block BLK1 in the "Number of written times after erasure" table at "2" without change. Then, since the second write operation after an erasure has been executed up to the page corresponding to the word line WL7, the BLK/WL management unit 260 sets the write WL pointer to "7". It should be noted that in the example of FIG. 6 (f), the data of the page corresponding to the word lines WL0 to WL7 is valid.

Next, where the data of the pages corresponding to the word lines WL0 to WL7 of the block BLK1 becomes invalid, and a third SLC write operation after the erasure, i.e., a second overwrite operation is executed on the pages corresponding to the word lines WL0 to WL7 (FIG. 7 (g)), the BLK/WL management unit 260 sets the number of written times after an erasure of the block BLK1 in the "Number of written times after erasure" table to "3". Then, since the overwrite operation has been executed up to the page corresponding to the word line WL7, the BLK/WL management unit 260 sets the write WL pointer to "7". It should be noted that in the example of FIG. 7 (g), the data of the pages corresponding to the word lines WL0 to WL7 is valid.

Next, even if the data of the pages corresponding to the block BLK1 becomes invalid (FIG. 7 (h)), the BLK/WL management unit 260 maintains the data of the "Number of written times after erasure" table.

Next, if the data of the block BLK1 is erased (FIG. 7 (i)), the BLK/WL management unit 260 sets the number of written times after an erasure of the block BLK1 in the "Number of written times after erasure" table to "0" and changes the write WL pointer to a "NULL" state, similar to FIG. 5 (a).

1.2.3 Parameter Table

Next, an example of a parameter table depending on the number of written times after an erasure of data will be described with reference to FIG. 8. The example of FIG. 8 includes, as parameters depending on the number of written times after an erasure, a program voltage of an initial value (initial VPGM) and a step-up voltage (DVPGM), in addition to the read voltage and verify voltage described above. The program voltage of an initial value (initial VPG) is a voltage applied to a selected word line WL at the first time of the program loop, i.e., in the first program operation. The program voltage is stepped up every time the program loop is repeated. The increased width of the program voltage at that time is a step-up voltage.

Where the number of written times after an erasure is one, the read voltage VR1, verify voltage VV1, program voltage of the initial value VP1 and step-up voltage VDP1 are set. Where the number of written times after an erasure is two, a read voltage VR2, a verify voltage VV2, a program voltage of the initial value VP2, and a step-up voltage VDP2 are set. Where the number of written times after an erasure is three, a read voltage VR3, a verify voltage VV3, a program voltage of the initial value VP3, and a step-up voltage VDP3 are set. For example, voltages VP1, Vp2 and VP3 have a relationship of VP1<VP2<VP3. That is, the program voltage of the initial value may be set higher as the number of written times after an erasure is increased, similarly to the read voltage and the verify voltage. It should be noted that the voltages VDP1, VDP2 and VDP3 may be either identical to or different from each other.

For example, these parameters are stored in the memory chip 100, and the controller 200 may designate parameters to be used. In addition, for example, the controller 200 may store these parameters in the form of firmware and transmit the parameter values to the memory chip 100. Where a parameter is set, for example, a dedicated command is transmitted from the controller 200 to the memory chip 100. In the description below, a parameter setting operation is referred to as a "Set Feature".

It should be noted that the parameter table may be provided inside the controller 200.

1.2.4 Overall Flow of Write Operation

Figure 9:
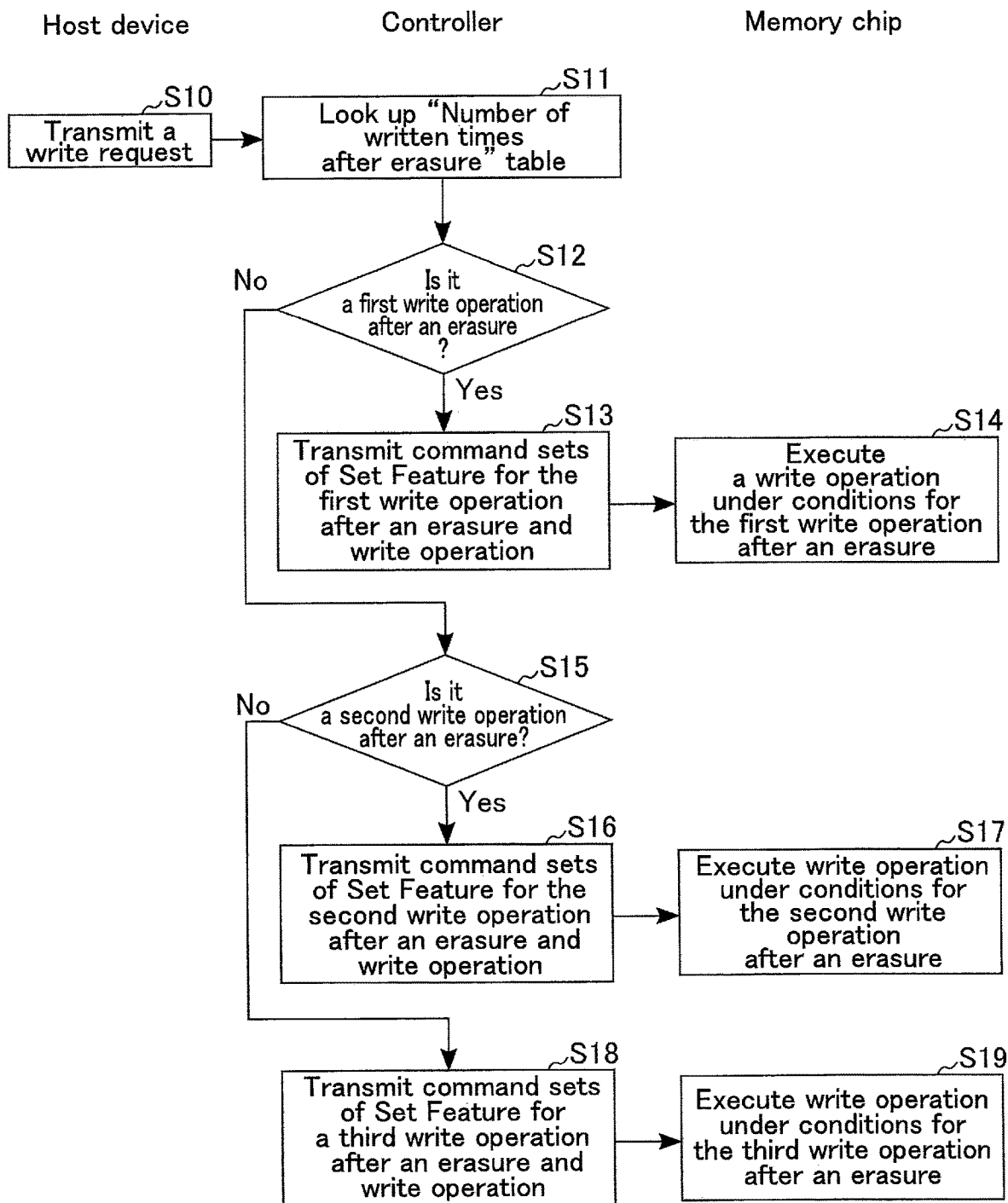
FIG. 9 is a flowchart corresponding to the first to third write operations in the memory system according to the first embodiment.

Next, the overall flow of a write operation will be described with reference to FIG. 9. FIG. 9 is a flowchart of a write operation. In the description below, a combination of commands corresponding to respective operations is referred to as a "command set".

The host device 2 transmits a write request (including written data) to the memory system 1 (S10).

Upon receipt of the write request from the host device 2, the BLK/WL management unit 260 looks up the "Number of written times after erasure" table (S11), and selects a memory address (a block BLK and a word line WL) of a memory chip 100 to be written (write target memory chip).

Where the selected word line WL is a target for the first SLC write operation after an erasure (S12_Yes), CPU 230 issues a command set of a Set Feature to designate use of parameters for the first SLC write operation after an erasure and a command set of the SLC write operation, and transmits the command sets to the target memory chip 100 (S13).

Upon receipt of the command set of the Set Feature that designates the use of the parameters for the first SLC write operation after an erasure and the command set of the SLC write operation, the sequencer 106 executes the first SLC write operation after an erasure (S14).

Where the selected word line WL is a target for a second SLC write operation after the erasure (i.e., a first overwrite operation) (S15_Yes) instead of the target for the first SLC write operation after an erasure (S12_No), CPU 230 issues a command set of the Set Feature that designates use of parameters for the second SLC write operation after the erasure and a command set of the SLC write operation, and transmits the command sets to the target memory chip 100 (S16).

Upon receipt of the command set of the Set Feature that designate the use of parameters for the second SLC write operation after the erasure and the command set of the SLC write operation, the sequencer 106 executes the second SLC write operation after the erasure (S17).

When the selected word line WL is not a target for the second SLC write operation after the erasure (S15_No), i.e., where the selected word line WL is a target for a third SLC write operation after the erasure, CPU 230 issues a command set of the Set Feature that designate the use of parameters for the third SLC write operation after the erasure and the command set of the SLC write operation, and transmits the command sets to a target memory chip 100 (S18).

Upon receipt of the command set of the Set Feature that designates the use of parameters for the third SLC write operation after the erasure and the command set of the SLC write operation, the sequencer 106 executes the third SLC write operation after the erasure (S19).

1.2.5. Command Set of the Set Feature and Command Set of Write Operation

Figure 10:
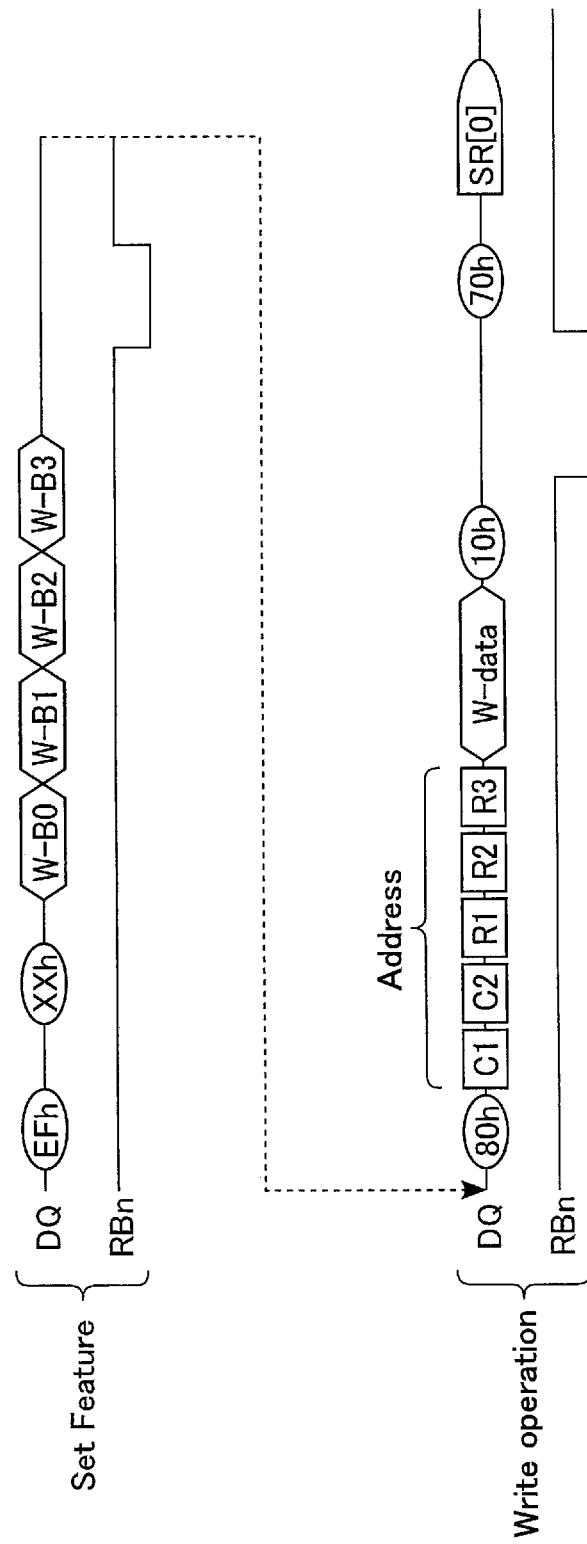
FIG. 10 is a command sequence of a Set Feature and a write operation in the memory system according to the first embodiment.

Next, an example of a command set of a Set Feature and a command set of a write operation will be described with reference to FIG. 10. FIG. 10 illustrates a command sequence of a Set Feature and a command sequence of a write operation. In the example of FIG. 10, signals CEn, CLE, ALE, WEn and a signal REn are omitted for the sake of simplification. A signal DQ and a ready/busy signal RBn are then illustrated. It should be noted that a command CMD input in the memory chip 100 is stored in the command register 105, an address ADD is stored in the address register 104, and data DAT is stored in the data register 112.

First, CPU 230 transmits the command set of a Set Feature to the memory chip 100 to set parameters relating to the write operation in the memory chip 100. More specifically, first, CPU 230 issues a command "EFh" and transmits it to the memory chip 100. The command "EFh" is a command for recognizing a Set Feature.

Next, CPU 230 issues a command "XXh" and transmits it to the memory chip 100. The command "XXh" is a command indicating the settings of the parameters relating to the write operation.

Next, CPU 230 transmits data "W-B0", "W-B1", "W-B2" and "W-B3" to the memory chip 100. The "W-B0", "W-B1", "W-B2" and "W-B3" indicate parameter information to be set. At that time, CPU 230 transmits parameter information (data) in accordance with the number of written times after an erasure to the memory chip 100.

Upon receipt of the command set of the Set Feature, the sequencer 106 sets the ready/busy signal RBn to the "L" level and executes settings of the parameters. Upon completion of the settings of the parameters, the sequencer 106 changes the ready/busy signal RBn to the "H" level.

Upon receipt of the ready/busy signal RBn set at the "H" level, CPU 230 transmits the command set of the write operation.

More specifically, first CPU 230 issues a command "80h" and transmits it to the memory chip 100. The command "80h" is a command to notify a write operation.

Next, CPU 230 transmits, to the memory chip 100, for example, addresses of five cycles (column addresses of two cycles, "C1" and "C2", and row addresses of three cycles "R1", "R2" and "R3"), and written date "W-data" in succession. It should be noted that the number of cycles of an address is discretionarily determined.

Next, CPU 230 issues a command "10h" and transmits it to the memory chip 100. The command "10h" is a command that instructs an execution of a write operation.

When the command "10h" is stored in the command register 105, the sequencer 106 shifts the ready/busy signal RBn to the "L" level and transfers the data "W-data" held in the data register 112 to the sense amplifier 111. The sequencer 106 executes the SLC write operation based on the parameter settings using the Set Feature and the data "W-data" stored in the sense amplifier 111.

When the SLC write operation ends, the sequencer 106 shifts the ready/busy signal RBn to the "H" level.

Upon receipt of the ready/busy signal RBn of the "H" level, CPU 230 transmits a command "70h". The command "70h" is a command to instruct a transmission of status information STS relating to a write operation.

The sequencer 106 transmits, to the controller 200, information "SR [0]" indicating whether or not the SLC write operation has ended normally, based on the command "70h".

In the present embodiment, a case of transmitting a same command set of the write operation has been explained, irrespective of the number of written times after an erasure; however, the present embodiment is not limited thereto. For example, CPU 230 may transmit, to the memory chip 100, a different command set of the write operation in accordance with the number of written times after an erasure. More specifically, CPU 230 may give a different prefix command in accordance with the number of written times after an erasure, for example, before the command "80h".

1.2.6 Voltage of Selected Word Line in SLC Write Operation

Next, an example of a voltage of a selected word line WL in an SLC write operation will be described with reference to FIG. 11. FIG. 11 is a timing chart indicating a voltage of a selected word line WL in the first to third SLC write operations after an erasure. In the example of FIG. 11, for the sake of simplification, the first to fourth iterations of a program loops are shown for each of the first to third SLC write operation after the erasure.

First, the first SLC write operation after an erasure will be described.

In the first program loop, the row decoder 110 applies a program voltage VP1 to the selected word line WL during a program operation (PG). Furthermore, the row decoder 110 applies a verify voltage VV1 to the selected word line WL during a program verify operation (PV). It should be noted that the row decoder 110 also applies the verify voltage VV1 to the selected word line WL during a program verify operation in the second to fourth iterations of the program loop.

In the program operation of the second program loop, the row decoder 110 applies, to the selected word line WL, a program voltage (VP1+VDP1) in which the voltage VP1 is stepped up by a step-up voltage VDP1.

In the program operation of the third program loop, the row decoder 110 applies, to the selected word line WL, a program voltage (VP1+2×VDP1) in which the voltage (VP1+VDP1) is stepped up by the step-up voltage VDP1.

In the program operation of the fourth program loop, the row decoder 110 applies, to the selected word line WL, a program voltage (VP1+3×VDP1) in which the voltage (VP1+2×VDP1) is stepped up by the step-up voltage VDP1.

Next, the second SLC write operation (a first overwrite operation) after the erasure will be described.

In the first program loop, the row decoder 110 applies a program voltage VP2 to the selected word line WL during a program operation. Furthermore, the row decoder 110 applies a verify voltage VV2 to the selected word line WL during a program verify operation. It should be noted that the row decoder 110 also applies the verify voltage VV2 to the selected word line WL during the program verify operation of the second to fourth iterations of the program loop.

In the program operation of the second program loop, the row decoder 110 applies, to the selected word line WL, a program voltage (VP2+VDP2) in which the voltage VP2 is stepped up by a step-up voltage VDP2.

In the program operation of the third program loop, the row decoder 110 applies, to the selected word line WL, a program voltage (VP2+2×VDP2) in which the voltage (VP2+VDP2) is stepped up by the step-up voltage VDP2.

In the program operation of the fourth program loop, the row decoder 110 applies, to the selected word line WL, a program voltage (VP2+3×VDP2) in which the voltage (VP2+2×VDP2) is stepped up by the step-up voltage VDP2.

Next, a third SLC write operation after the erasure (a second overwrite operation) will be described.

In the first program loop, the row decoder 110 applies a program voltage VP3 to a selected word line WL during a program operation. Furthermore, the row decoder 110 applies a verify voltage. VV3 to the selected word line WL during a program verify operation. It should be noted that the row decoder 110 also applies the verify voltage VV3 to the selected word line WL during the program verify operation in the second to fourth iterations of the program loop.

In the program operation of the second program loop, the row decoder 110 applies, to the selected word line WL, a program voltage (VP3+VDP3) in which the voltage VP3 is stepped up by the step-up voltage VDP3.

In the program operation of the third program loop, the row decoder 110 applies, to the selected word line WL, a program voltage (VP3+2×VDP3) in which the voltage (VP3+VDP3) is stepped up by the step-up voltage VDP3.

In the program operation of the fourth program loop, the row decoder 110 applies, to the selected word line WL, a program voltage (VP3+3×VDP3) in which the voltage (VP3+2×VDP3) is stepped up by the program voltage VDP3.

1.3 Read Operation

Next, a read operation will be described.

1.3.1 Overall Flow of Read Operation

Figure 12:
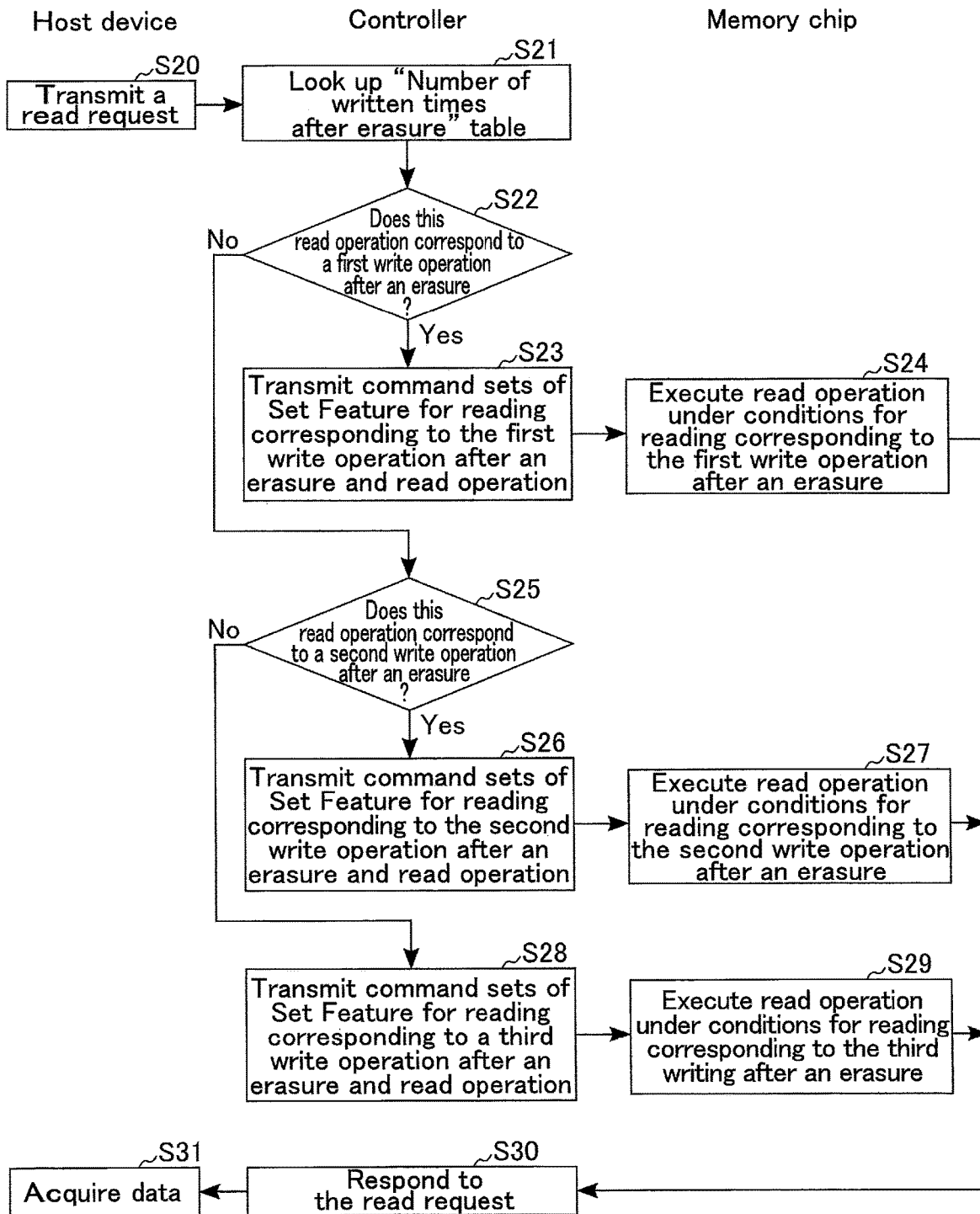
FIG. 12 is a flowchart of a read operation corresponding to the first to third write operations after each erasure in the memory system according to the first embodiment.

Next, the overall flow of a read operation will be described with reference to FIG. 12. FIG. 12 is a flowchart of a read operation.

The host device 2 transmits a read request to the memory system 1 (S20).

Upon receipt of the read request from the host device 2, the BLK/WL management unit 260 looks up the "Number of written times after erasure" table to verify the number of written times after an erasure of a relevant address (S21).

In the case where the number of written times after an erasure is one (S22_Yes), CPU 230 issues a command set of a Set Feature that designates parameters of a read operation corresponding to the first write operation after an erasure and a command set of the read operation, and transmits these command sets to the target memory chip 100 (S23).

Upon receipt of the command set of the Set Feature that designates parameters for the read operation corresponding to the first write operation after an erasure and the command set of the read operation, the sequencer 106 executes the read operation corresponding to the first write operation after an erasure (S24).

In the case where the number of written times after an erasure is two (the number of overwritten times is one) (S22_No and S25_Yes), CPU 230 issues a command set of a Set Feature that designates parameters for a read operation corresponding to the second write operation after the erasure and a command set of the read operation, and transmits the command sets to the target memory chip 100 (S26).

Upon receipt of the command set of a Set Feature that designates parameters for a read operation corresponding to the second write operation after the erasure and the command set of the read operation, the sequencer 106 executes a read operation corresponding to the second write operation after an erasure (S27).

In the case where the number of written times after an erasure is three (the number of overwritten times is three) (S25_No), CPU 230 issues a command set of a Set Feature that designates parameters for a read operation corresponding to the third write operation after an erasure and a command set of the read operation, and transmits these command sets to the target memory chip 100 (S28).

Upon receipt of the command set of a Set Feature that designates parameters for a read operation corresponding to the third write operation after an erasure and the command set of the read operation, the sequencer 106 executes a read operation corresponding to the third write operation after an erasure (S29).

When the read operation has ended, the sequencer 106 transmits the read data to the controller 200.

For example, after performing error checking and correcting (ECC) processing, etc., of the read data received from the memory chip 100, CPU 230 transmits error-corrected read data to the host device 2, as a read response to the read request (S30).

The host device 2 obtains data (S31), and the read operation ends.

1.3.2. Command Set of Read Operation

Next, an example of a command set of the read operation will be described with reference to FIG. 13. FIG. 13 shows a command sequence of the Set Feature and a command sequence of the read operation. In the example of FIG. 13, for the sake of simplification, signals CEn, CLE, ALE, WEn and a signal REn are omitted. Then, a signal DQ and a ready/busy signal RBn are shown.

The command set of the Set Feature is the same as that shown in FIG. 10.

After transmitting the command set of the Set Feature, CPU 230 receives a ready/busy signal RBn of the "H" level and then transmits the command set of the read operation.

More specifically, first, CPU 230 issues a command "00h" and transmits the command to the memory chip 100. The command "00h" is a command for notifying a read operation.

Next, CPU 230 transmits an address of five cycles (column addresses of 2 cycles "C1" and "C2" and a row address of three cycles "R1", "R2" and "R3") to the memory chip 100.

Next, CPU 230 issues a command "30h" and transmits the command to the memory chip 100. The command "30h" is a command that instructs an execution of a read operation.

When the command "30h" is stored in the command register 105, the sequencer 106 shifts the ready/busy signal RBn to the "L" level. The sequencer 106 executes the read operation on the basis of the parameter settings based on the Set Feature. When the read data is stored, for example, in the data register 112, the sequencer 106 shifts the ready/busy signal RBn to the "H" level.

Upon receipt of the ready/busy signal RBn of the "H" level, CPU 230 reads read data "R-data" from the memory chip 100.

1.4 Advantageous Effects of Present Embodiment

According to the configuration of the present embodiment, it is possible to execute the SLC write operation multiple times on one memory cell transistor MC corresponding to the SLC write operation in a period from after the execution of an erase operation to the execution of the next erase operation. That is, an overwrite operation of data can be made. Therefore, in one time write/erase cycle, the volume of writable data increases. In other words, where the same volume of data is to be written, it is possible to reduce the number of times for data erasure. Accordingly, since it is possible to suppress degradation of reliability of the memory chip 100 due to repeated write/erase cycles and to improve the reliability of the memory system.

It should be noted that a case is described where the controller 200 manages the number of written times after an erasure; however, information on the number of written times after an erasure may be included, for example, in a redundancy region contained in a page in which target data is to be written. For example, the sequencer 106 reads information relating to the number of written times after an erasure from the redundancy region and sets parameters for a write operation and a read operation in accordance with the number of written times after an erasure based on the read information. In this case, CPU 230 may not necessarily transmit a command set of a Set Feature for setting parameters for the write operation and the read operation. For example, CPU 230 may read the information relating to the number of written times after an erasure from the data or status information STS, etc. read from the memory chip 100 to verify the number of written times after an erasure in each block BLK.

2. Second Embodiment

Next, the second embodiment will be described. In the second embodiment, a method will be described in which, if the data of the "Number of written times after erasure" table is lost, the information relating to the number of written times after an erasure is read from the memory chip 100 and the data in the "Number of written times after erasure" table is restored (hereinafter, referred to as "Number of written times after erasure" search (estimate) operation"). Hereinafter, a description will be given of the points in which the memory system according to the second embodiment differs from that according to the first embodiment.

For example, when the power source is incorrectly disconnected, the data of "Number of written times after erasure" table stored in RAM 220 is likely to disappear. In such a case, it is necessary to read information relating to the number of written times after an erasure from each memory chip 100 at the time of power source start-up, and update the "Number of written times after erasure" table.

Figure 14:
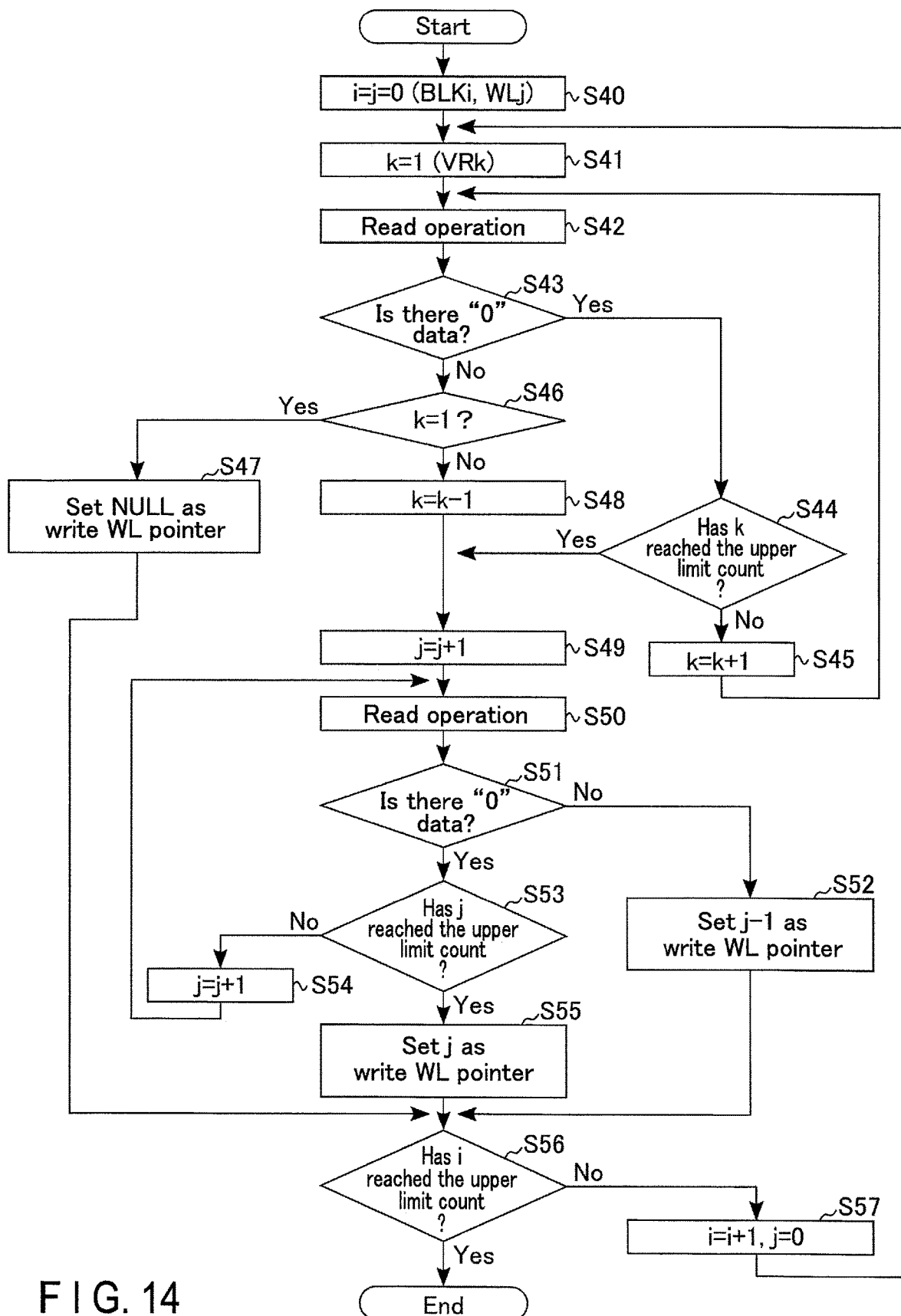
FIG. 14 is a flowchart of a "Number of written times after erasure" search operation in the memory system according to a second embodiment.

2.1 Overall Flow of "Number of Written Times after Erasure" Search Operation First, the overall flow of "Number of written times after erasure" search operation will be described with reference to FIG. 14. FIG. 14 is a flowchart of "Number of written times after erasure" search operation. In the description below, for the sake of simplification, a variable i ($0 \leq i \leq 3$) is used for the numbers of blocks BLK, and a variable j ($0 \leq j \leq 7$) is used for the numbers of word lines WL. A variable k ($1 \leq k \leq 3$) is used for the number of written times after an erasure, i.e., the number of read voltages VR. The variables i, j and k are, for example, variables held by a counter included in the controller 200 and incremented by the control of the controller 200. In the following example, a case will be described where CPU 230 determines the number of written times after an erasure; however, the BLK/WL management unit 260 or sequencer 106 may determine the number of written times after an erasure.

For example, after starting up the power source, the BLK/WL management unit 260 confirms the data in the "Number of written times after erasure" table.

Upon receipt of a report (signal) indicating that there is no data in "Number of written times after erasure" table (Start), CPU 230 sets i=j=0 (S40) as initial values of the variables i and j. That is, CPU 230 selects a word line WL0 of the block BLK0.

Next, CPU 230 sets k=1 (S41) as an initial value of the variable k to execute a read operation corresponding to the first write operation after an erasure (S41). That is, CPU 230 selects a read voltage VR1.

CPU 230 transmits a command set of the Set Feature and a command set of a read operation to the memory chip 100 to execute the read operation corresponding to k times of the write operation after an erasure at a word line WLj in a block BLKi. The memory chip 100 executes a read operation corresponding to k times of the write operation after an erasure at the word line WLj of the block BLKi (S42).

Where "0" data is included in the read data (S43_Yes), CPU 230 confirms whether the variable k has reached the predetermined upper limit count (e.g., k=3) (S44). That is, CPU 230 confirms whether the number of written times after an erasure has reached the predetermined upper limit count.

If the variable k has not reached the predetermined upper limit count (S44_No), CPU 230 increments the variable k and sets it to k=k+1 (S45). After that, CPU 230 returns to S42.

On the other hand, where the variable k has reached the predetermined upper limit count (S44_Yes), CPU 230 maintains the setting of the variable k and proceeds to S49. That is, CPU 230 determines that the number of written times after an erasure at the word line WLj (j=0) is k times, and then sets the read voltage to VRk.

Where "0" data is not included in the read data (S43_No"), CPU 230 confirms whether the variable k is k=1. (S46).

In the case where k=1 (S46_Yes), i.e., in the case where as a result of execution of the read operation corresponding to the first write operation after an erasure, "0" is not included in the read data, CPU 230 determines that data is not written in the block BLKi. Then, CPU 230 sets "NULL" as a write WL pointer in the block BLKi in the "Number of written times after erasure" table (S47) and proceeds to S56.

In the case where k is not equal to 1 (k≠1) (S46_No), CPU 230 sets the variable k to k=k−1 (S48). More specifically, for example, in a read operation corresponding to the kth write operation after an erasure, where "0" data is not included in read data, CPU 230 determines that the number of written times after an erasure at the word line WLj (J=0) is (k−1) times and sets the read voltage to VR (k−1).

After setting the variable k after S44_Yes or in S48, CPU 230 sets the variable j to (S49).

Next, similarly to S42, in order to execute a read operation corresponding to the kth write operation after an erasure at the word line WLj of the block BLKi, CPU 230 transmits a command set of the Set Feature and a command set of the read operation to the memory chip 100. The memory chip 100 executes the read operation corresponding to the kth write operation after an erasure at the word line WLj of the block BLKi (S50).

Where "0" data is not included in the read data (S51_No), CPU 230 sets a variable j−1 (S52) as a write WL pointer in the block BLKi in the "Number of written times after erasure" table (S52). More specifically, CPU 230 determines that the number of written times after an erasure from the corresponding word line WLj to the last word line WL (e.g., word line WL7) is k−1 times.

Where "0" data is included in the read data (S51_Yes), CPU 230 confirms whether the variable j has reached the predetermined upper limit count (e.g., j=7) (S53).

Where the variable j has not yet reached the predetermined upper limit count (S53_No), CPU 230 sets the variable j to j=j+1 (S54). After that, CPU 230 returns to S50.

Where the variable j has reached the predetermined upper limit count (S53_Yes), CPU 230 sets the variable j as a write WL pointer in the block BLKi of the "Number of written times after erasure" table (S55).

In S47, S52 or S55, after setting the write WL pointer in the block BLKi in the "Number of written times after erasure" table, CPU 230 confirms whether the variable i has reached the predetermined upper limit count (e.g., i=3) (S56).

Where the variable i has not reached the predetermined upper limit count (S56_No), CPU 230 sets the variable i to i=i+1 and sets the variable j to 0 (S57). After that, CPU 230 returns to S41.

Where the variable i has reached the predetermined upper limit count (S56_Yes), CPU 230 ends the "Number of written times after erasure" search operation.

2.2 Specific Example of "Number of Written Times after Erasure" Search Operation First, a specific example of the "Number of written times after erasure" search operation will be described with reference to FIG. 15. FIG. 15 illustrates a case of a block BLK0; however, the same applies to the other blocks BLK. It should be noted that the example of FIG. 15 illustrates a case where the predetermined upper limit count of an SLC write operation after an erasure in one memory transistor MC is four (i.e., k=4).

First, the sequencer 106 selects a word line WL0 in a block BLK0 and executes a read operation (read voltage VR1) corresponding to the first write operation after an erasure. Where the threshold voltage of each memory cell transistor MC is lower than the voltage VR1, i.e., where "0" data is not included in the read data, no data is written in the page corresponding to the word line WL0 of the block BLK0. In this case, CPU 230 determines that no data is written in the block BLK0.

Where "0" data is included in the first time read data, the sequencer 106 selects the word line WL0 and executes a read operation (read voltage VR2) corresponding to the second write operation after the erasure. Similarly, the sequence 106 executes a read operation (read voltage VR3) corresponding to the third write operation after an erasure and a read operation (read voltage VR4) corresponding to the fourth write operation after an erasure in sequence until "0" data is not included in the read data. In the example of FIG. 15, an "A4" state, which is higher than the read voltage VR4, does not exist. That is, "0" data is not included in the read data corresponding to the fourth write operation after the erasure. As a result, CPU 230 determines that the number of written times after the erasure at the page corresponding to the word line WL0 is three.

Where the number of written times after an erasure at the page corresponding to the word line WL0 is three, the sequencer 106 selects and executes a read operation corresponding to the third write operation after an erasure, from the word line WL1 in sequence, to search a page corresponding to a word line WL in which "0" data is not included in the read data. In the example of FIG. 15, the "A3" state does not exist at the page corresponding to the word line WLj. That is, "0" data is not included in the read data corresponding to the third write operation after an erasure at the word line WLj. As a result, CPU 230 determines that number of written times after an erasure from the page corresponding to the word line WLj to the page corresponding to the word line WL7 is two. Therefore, CPU 230 sets j−1 as a write WL pointer of the block BLK0 in the "Number of written times after erasure" table. By performing similar processing on each block BLK0, the "Number of written times after erasure" search operation is completed.

2.3 Advantageous Effects of Present Embodiment

According to the configuration of the present embodiment, it is possible to obtain the same advantageous effects as those of the first embodiment.

Furthermore, according to the configuration of the present embodiment, for example, even where the information in the "Number of written times after erasure" table disappears due to a disconnection of the power source, it is possible to search the number of written times after an erasure and update the "Number of written times after erasure" table. With this configuration, it is possible to reduce errors in the number of written times after an erasure and improve data reliability.

3. Third Embodiment

Next, a third embodiment will be described. In the third embodiment, a case will be described where compaction (compaction operation) is performed by a word line-wise (by a page unit). The compaction is an operation in which valid data included in pages of a target memory area are gathered to move the data to another block BLK. A description will be given of points different than the first and second embodiments.

3.1 Outline of Compaction by Word Line-Wise

Figure 16:
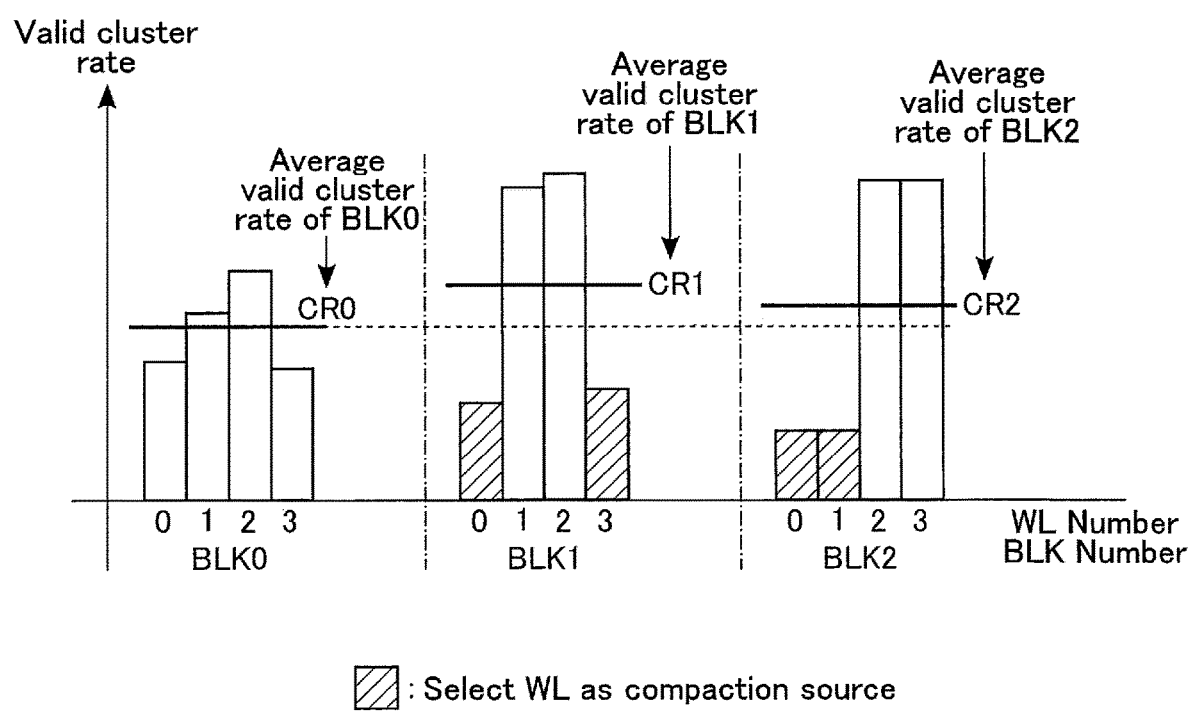
FIG. 16 is a conceptual diagram of a WL compaction operation in a memory system according to a third embodiment.

First, the outline of compaction by a word line-wise will be described with reference to FIG. 16. FIG. 16 is a graph illustrating an example of a valid cluster rate at a page corresponding to each word line WL. The example of FIG. 16 illustrates a case where three blocks BLK0 to BLK2 respectively include four word lines WL0 to WL3. In the present embodiment, one word line WL corresponds to one page. One page can be divided into a plurality of clusters. Different data has been written in each cluster.

As the data processing proceeds, clusters in which valid data is not included (hereinafter, referred to as "invalid cluster(s)") arise(s) in the page. Therefore, the number of clusters including valid data (hereinafter, referred to as "valid cluster") of a corresponding page differs on a word line WL basis. That is, the ratio of the number of valid clusters (hereinafter, referred to as "valid cluster rate") based on the total number of clusters of one page differs. A value obtained by averaging the valid cluster rates of the respective word lines WL in one block BLK is defined as an "average valid cluster rate". Then, where average valid cluster rates of word lines WL in the blocks BLK0 to BLK2 are defined as CR0 to CR2, respectively, the average valid cluster rates have, for example, a relationship of CR0<CR2<CR1. For example, when compaction is executed in a block-wise (hereinafter, referred to as a "block-wise compaction"), the block BLK0 having a lower average valid cluster rate is selected as a target for the block-wise compaction. In this case, the word lines WL1 and WL2 having a higher valid cluster rate of their corresponding pages than the average valid cluster rate CR0 are also included in the target for the compaction.

In contrast, in the present embodiment, it is possible to execute compaction in a word line-wise (hereinafter, referred to as "word line-wise compaction"), for example, based on statistics calculated by a word line-wise. In this case, as a target for compaction (hereinafter, referred to as a "compaction source"), word lines WL are selected in sequence from a word line WL, at which the number of written times after an erasure has not reached the predetermined upper limit count and which has a lower valid cluster rate of its corresponding page. However, the page whose valid cluster rate is 0 allows a direct overwrite operation of data. Therefore, a word line WL whose valid cluster rate of its corresponding page is 0 is excluded from the target for compaction. In the example of FIG. 16, where four word lines WL corresponding to one block BLK portion are selected as a compaction source of the word line-wise compaction, word lines WL0 and WL3 in the block BLK1 and word lines WL0 and WL1 in the block BLK2 are selected. An increase in the written volume involved with compaction is suppressed by selecting a word line WL whose valid cluster rate of the corresponding page is low.

In the present embodiment, it is possible to execute an SLC write operation while selecting word lines WL as targets for writing in any order. Therefore, in the case of executing the word line-wise compaction, word lines WL capable of being overwritten can be selected randomly. In the description below, the write operation in which word lines WL0 to WL7 are selected in sequence is referred to as a "sequential write operation", and the write operation in which word lines WL are selected in a random order is referred to as a "random WL order write operation".

For example, in the first SLC write operation after a block erasure, word lines are selected in the order of the word lines WL0 to WL7, and the write operation is executed sequentially. In the SLC write operation of word lines WL after execution of compaction, the order thereof is discretionarily determined, and a random WL order write operation is thus executed. That is, a random WL order write operation is used for a data overwrite operation.

In the present embodiment, a case will be described where a compaction source is selected based on a valid cluster rate; however, a compaction source may be selected based on the total volume of valid data with respect to the total volume of data that can be stored in one page, i.e., a ratio of the total value of the size of valid clusters (also referred to as a "valid data rate").

3.2 State Transition of Block

Next, a state transition of a block ELK will be described with reference to FIG. 17. FIG. 17 is a state transition diagram of a block BLK.

The block BLK includes five states. The five states are referred to as an "erased block ELK", an "input block BLK", an "active block BLK", a "compaction source block ELK", and a "free block ELK".

The erased block BLK is a block BLK in a state where data in the block BLK is erased. For example, CPU 230 selects any one of the free blocks BLK and executes a block erasure to change the block BLK to an erased block BLK.

The input block BLK is a block BLK selected as a writing target (data input target) from among erased blocks BLK. CPU 230 executes a write operation on the input block BLK. It should be noted that in the example of FIG. 17, an input block BLK is selected from among the erased blocks BLK; however, when an overwrite operation is performed, an input block BLK may be selected from free blocks BLK in which the number of written times after an erasure has not reached the predetermined upper limit count.

The active block BLK is a block BLK in which data writing to all pages has ended at least once.

The compaction source block BLK is a block BLK selected as a compaction source from among active blocks BLK. CPU 230 executes a compaction on the compaction source block.

The free block BLK is an active block BLK in which valid clusters have been invalidated, or a compaction source block BLK in which valid clusters have been invalidated due to a compaction.

3.3 State Transition of Word Line

Figure 18:
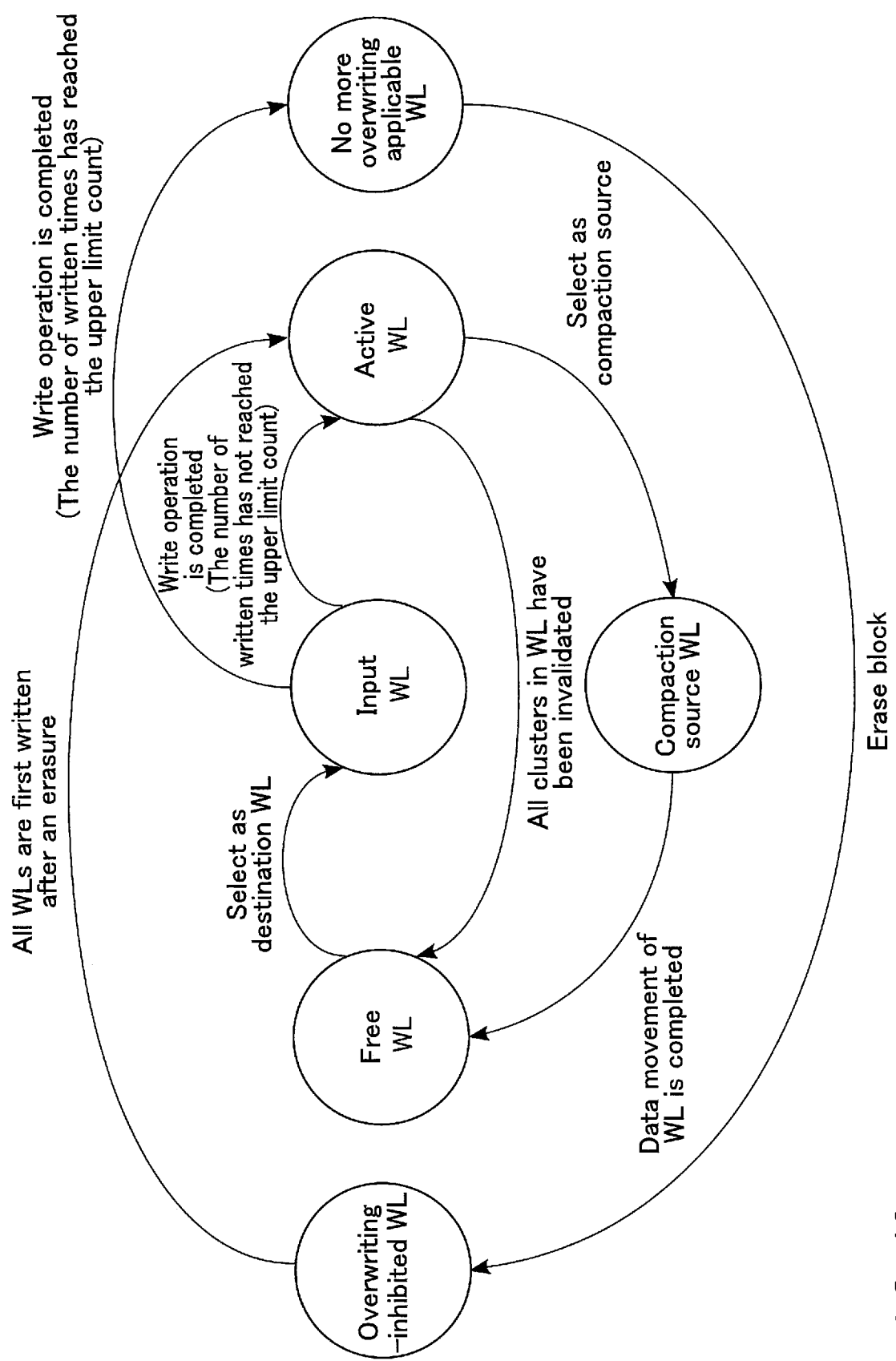
FIG. 18 is a state transition diagram of a word line in the memory system according to the third embodiment.

Next, a state transition of a word line WL will be described with reference to FIG. 18. FIG. 18 is a state transition diagram of a word line WL.

The word line WL includes six states. The six states are referred to as a "free word line WL", an "input word line WL", an "active word line WL", a "compaction source word line WL", a "no more writing applicable word line WL", and an "overwrite-inhibited word line WL".

The free word line WL is a word line WL in which a corresponding page includes no valid cluster, and the number of written times after an erasure has not reached the predetermined upper limit count.

The input word line WL is a word line WL selected as a writing target (data input target) from among free word lines WL. CPU 230 executes a write operation on the input word line WL.

The active word line WL is a word line WL in which a corresponding page includes valid clusters, and the number of written times after an erasure has not reached the predetermined upper limit count. When the valid clusters in the active word line WL have been invalidated, the active word line WL is changed to a free word line WL.

The compaction source word line WL is a word line WL selected as a compaction source from among active word lines WL. CPU 230 executes a word line-wise compaction for a page corresponding to the compaction source word line WL. The compaction source word line WL after execution of compaction (after data migration) is changed to a free word line WL, since the corresponding page include no valid cluster.

The no more writing applicable word line WL is a word line WL in which data has been written on a corresponding page up to the predetermined upper limit count for the number of written times after an erasure. The ready for block erasing word line WL is in a standby state until data of the block BLK including the ready for block erasing word line WL is erased.

The overwrite-inhibited word line WL is a word line WL included in a block BLK for which the first write operation has not been completed after block erasure. When data from the first time after the erasure is written on pages corresponding to all word lines WL within the block BLK, the overwrite-inhibited word line WL is changed to an active word line WL.

3.4 BLK/WL Management Unit

Figure 19:
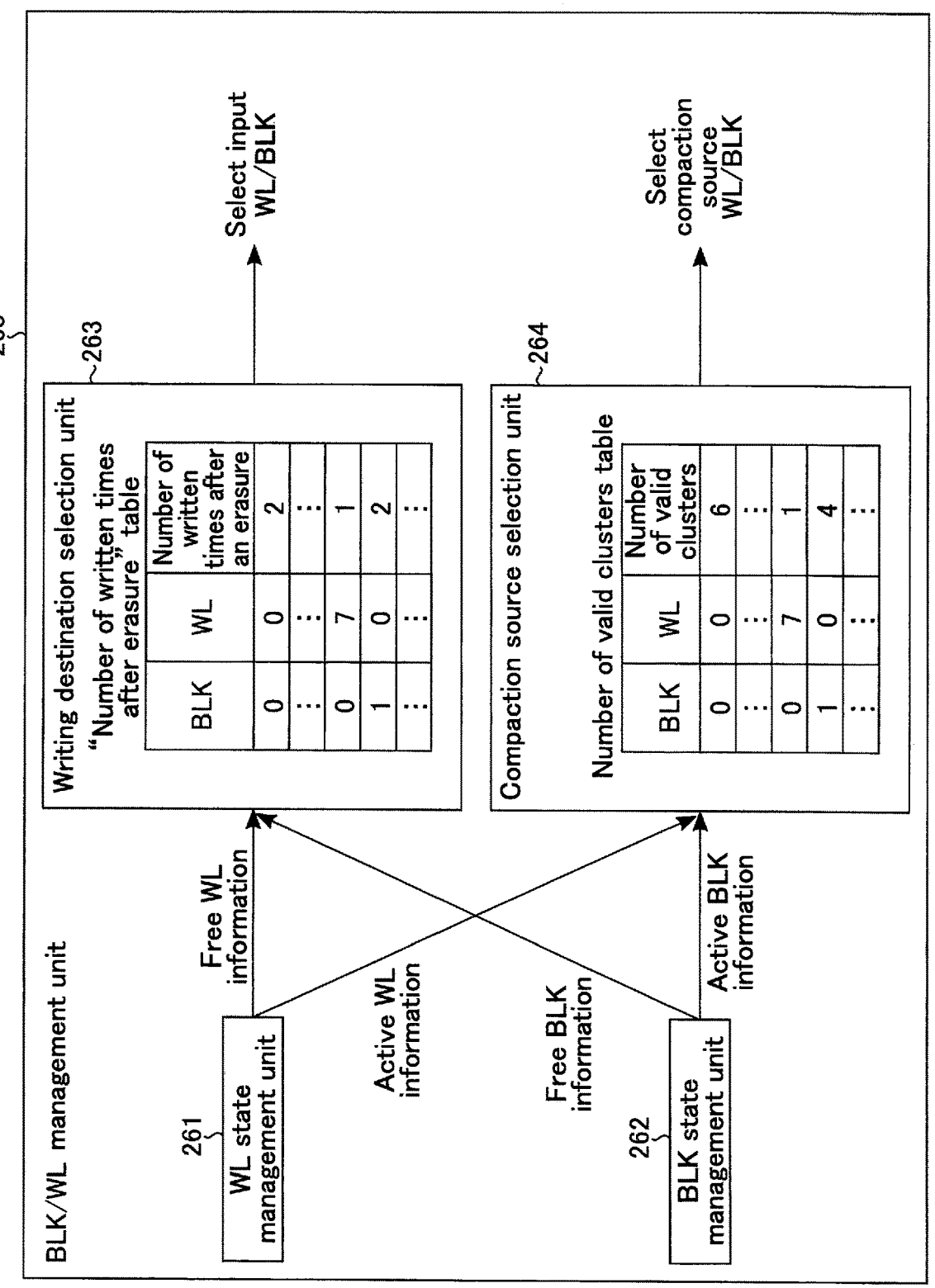
FIG. 19 is a diagram illustrating a BLK/WL management unit in the memory system according to the third embodiment.

Next, the detailed configuration of the BLK/WL management unit 260 in the present embodiment and the operations thereof will be described with reference to FIG. 19. FIG. 19 is a schematic diagram of the BLK/WL management unit 260.

The BLK/WL management unit 260 includes a WL state management unit 261, a BLK state management unit 262, a writing destination selecting unit 263, and a compaction source selecting unit 264.

The WL state management unit 261 manages states of word lines WL.

The BLK state management unit 262 manages states of blocks BLK.

The writing destination selecting unit 263 manages the number of written times after an erasure of a page corresponding to each word line WL (i.e., "Number of written times after erasure" table) and selects an input block BLK and an input word line WL, in which data will be written (writing destination), based on free word line WL information acquired from the WL state management unit 261 and free block ELK information acquired from the BLK state management unit 262. Hereinafter, a combination of an input block BLK and an input word line WL is referred to as an "input BLK/WL".

The compaction source selecting unit 264 manages the number of valid clusters in a page corresponding to each word line WL (i.e., the number of valid clusters table), and selects a compaction source word line WL and a compaction source block BLK based on the active word line WL information acquired from the WL state management unit 261 and the active block BLK information acquired from the BLK state management unit 262. The number of valid clusters table is held in RAM 220, for example.

3.5 Selection Operation of Input Block and Input Word Line

Figure 20:
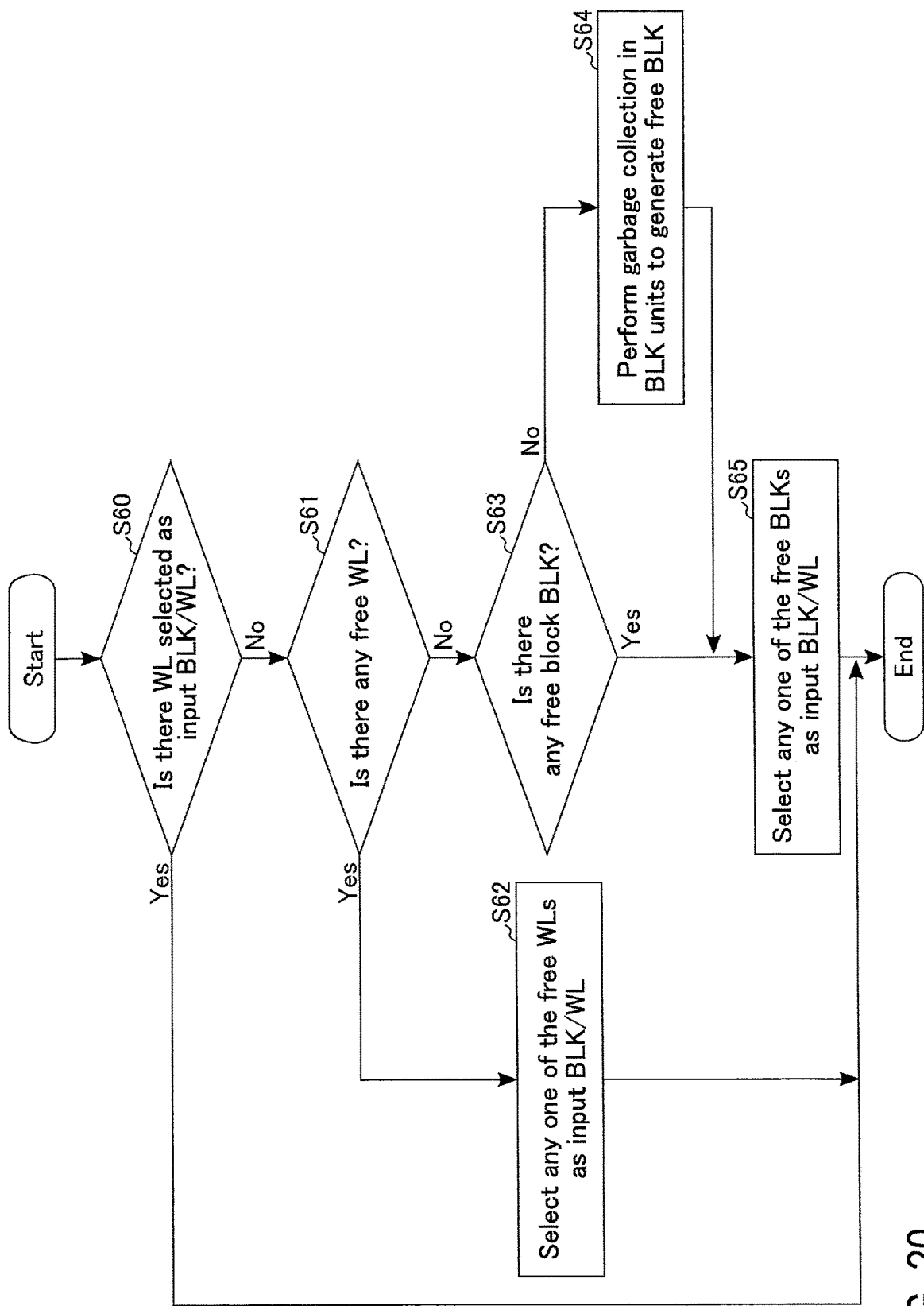
FIG. 20 is a flowchart illustrating a selection operation of an input block and an input word line in the memory system according to the third embodiment.

Next, a selection operation of an input block BLK and an input word line WL will be described with reference to FIG. 20. FIG. 20 is a flowchart showing a section operation of an input block BLK and an input word line WL.

Upon receipt of a write request from a host device 2, the writing destination selecting unit 263 confirms whether there is a word line WL selected as an input BLK/WL of the writing destination (S60).

Where there is a word line WL selected as an input BLK/WL (S60_Yes), a writing destination selecting unit 263 transmits information on the input BLK/WL to CPU 230 and ends the selection operation.

Where there is no word line WL selected as an input BLK/WL (S60_No), the writing destination selecting unit 263 acquires free word line WL information from a WL state management unit 261 and confirms whether there is a free word line WL (S61).

Where a free word line WL is found (S61_Yes), the writing destination selecting unit 263 refers to the "Number of written times after erasure" table and selects any one of the free word lines WL in which the number of written times after an erasure is relatively small as an input word line WL (S62) The writing destination selecting unit 263 transmits information on the input BLK/WL to CPU 230 and terminates the selection operation.

If there is no free word line WL (S61_No), the writing destination selecting unit 263 acquires free block BLK information from the BLK state management unit 262 and confirms whether there is a free block BLK (S63).

If there is no free block BLK (S63_No), CPU 230 executes, for example, garbage collection GC in a block-wise. The garbage collection GC is an operation to move valid data included in the pages of a target memory region to another block BLK. The garbage collection GC may be executed in block-wise or word line-wise. The BLK/WL management unit 260 changes said block BLK for which the garbage collection GC is executed to a free block BLK (S64).

If there is a free block BLK (S63_Yes), or where the garbage collection GC is executed to generate a free block BLK (S64), the writing destination selecting unit 263 selects any one of free blocks BLK as an input BLK/WL (S65). The writing destination selecting unit 263 transmits information on the input BLK/WL to CPU 230 and ends the selection operation.

3.6 Compaction Source Selection Operation

Next, a compaction source selection operation will be described with reference to FIG. 21. FIG. 21 is a flowchart indicating a selection operation of a compaction source word line WL in a word line-wise compaction.

For example, where the memory system 1 is in an idling state, or where a free block BLK and a free word line WL necessary for executing a write operation run short, CPU 230 executes the word line-wise compaction. At that time, a compaction source selection unit 264 confirms whether there is a compaction source word line WL in an active block BLK through the control of CPU 230 (S70).

If there is a compaction source word line WL (S70_Yes), the compaction source selection operation ends.

If there is no compaction source word line WL (S70_No), the compaction source selection unit 264 acquires active block BLK information from a BLK state management unit 262. Also, the compaction source selection unit 264 acquires active word line WL information in an active block BLK from a WL state management unit 261 to confirm whether there is an active word line WL (S71).

If there is an active word line WL (S71_Yes), the compaction source selection unit 264 refers to the number of valid clusters table and selects, as a compaction source word line WL, a word line WL with a valid cluster rate of its corresponding page being the lowest (the number of valid clusters is the smallest) from among active word lines WL (S72). It should be noted that for example, where there are a plurality of word lines WL with the valid cluster rate of their corresponding pages being the lowest, the compaction source selection unit 264 may acquire information on the number of written times after an erasure from the writing destination selecting unit 263. Furthermore, the compaction source selection unit 264 may select a word line WL with the number of written times after an erasure of its corresponding page being the smallest from among the word lines WL with the valid cluster rate of their corresponding pages being the lowest. The compaction source selection unit 264 selects a block BLK including the compaction source word line WL as a compaction source block BLK.

If there is no active word line WL (S71_No), CPU 230 terminates the word line-wise compaction and executes a block-wise compaction (S73). More specifically, where there is no selectable active word line WL, the compaction source selection unit 264 terminates the selection operation of the compaction source word line WL and reports it accordingly to CPU 230. CPU 230 terminates the word line-wise compaction and switches it to the block-wise compaction. The compaction source selection unit 264 selects a compaction source block BLK for executing block-wise compaction from among active blocks BLK through the control of CPU 230.

After the processing in step S72 or S73 ends, the compaction source selection unit 264 transmits information on the compaction source block BLK and compaction source word line WL to CPU 230.

3.7 Specific Example of Compaction Source Selection Operation

Figure 22:
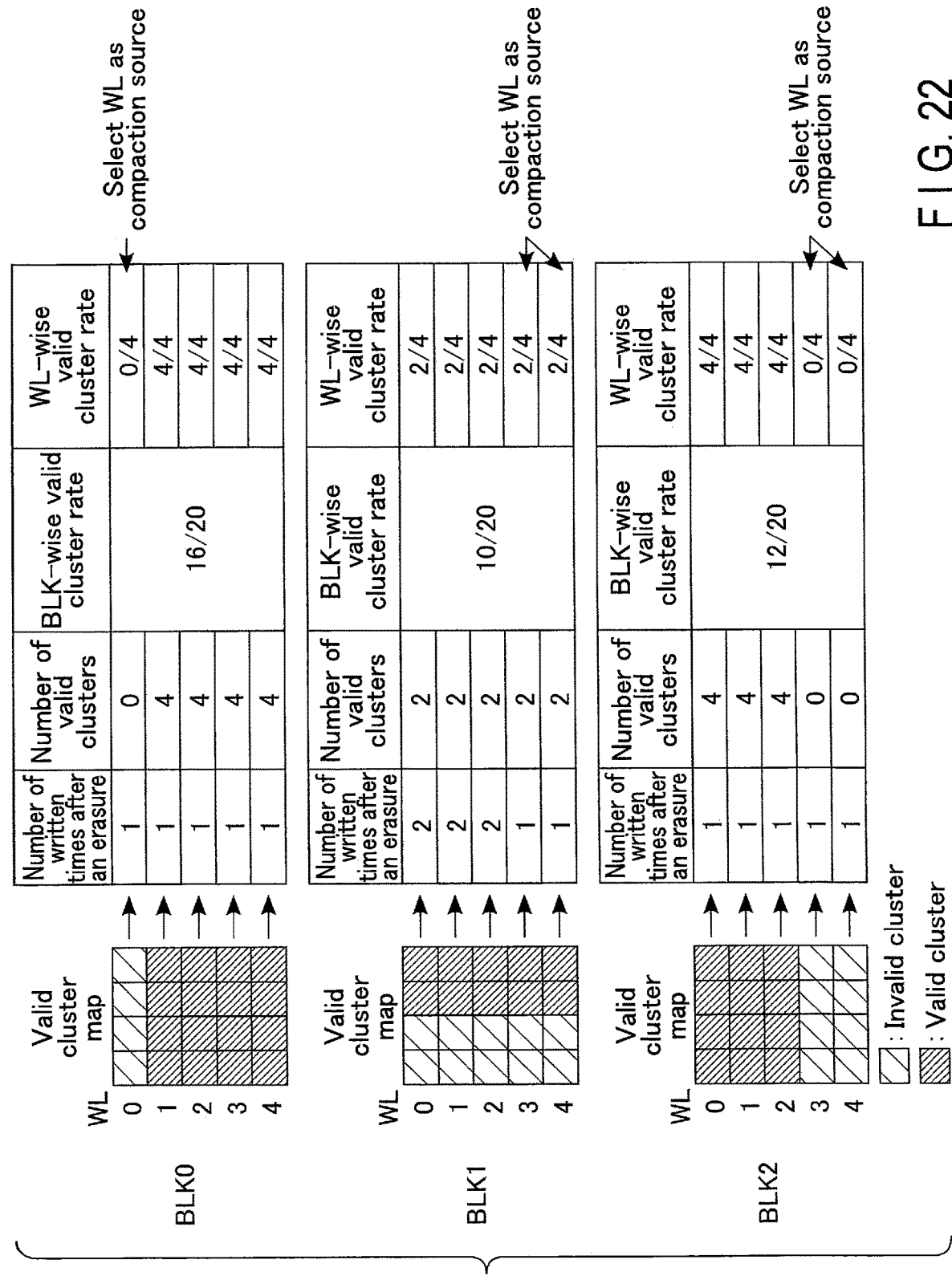
FIG. 22 is a diagram illustrating one example of a compaction operation in the memory system according to the third embodiment.

Next, a specific example of the compaction source selection operation will be described with reference to FIG. 22. FIG. 22 is an exemplary diagram showing a selection operation of a compaction source word line WL. In the example of FIG. 22, blocks BLK0 to BLK2 are active blocks ELK. Each block ELK includes five word lines WL0 to WL4, and a page corresponding to each word line WL includes four clusters.

A page corresponding to the word line WL0 in the block BLK0 has four invalid clusters, and pages corresponding to the word lines WL1 to WL4 have four valid clusters. In this case, the average valid cluster rate of the block BLK0 is 16/20.

A page corresponding to each of the word lines WL0 to WL4 in the block BLK1 has two invalid clusters and two valid clusters. In this case, the average valid cluster rate of the block BLK1 is 10/20. For example, in the case where compaction is executed in a block-wise, the block BLK1 with the lowest average valid cluster rate is selected. When the block-wise compaction is executed to the block BLK1, a write operation of ten valid clusters (movement of data) is executed through a compaction operation for 1 block BLK to obtain a free area of ten clusters corresponding to an invalid cluster.

Pages corresponding to the word lines WL0 to WL2 in the block BLK2 have four valid clusters, and pages corresponding to the word lines WL3 and WL4 have four invalid clusters. In this case, the average valid cluster rate of the block BLK2 is 12/20.

In this state, for example, in the case where five word lines WL corresponding to 1 block BLK portion are selected as a compaction source, and the word line-wise compaction is subsequently executed, the compaction source selection unit 264 selects word lines WL from those with lower valid cluster rates of their corresponding pages sequentially, irrespective of the average valid cluster rate of its block BLK. More specifically, first, the compaction source selection unit 264 selects three word lines, i.e., the word line WL0 in the block BLK0, the word lines WL3 and WL4 in the block BLK2 with the lowest valid cluster rate of its corresponding page being 0/4. Furthermore, the compaction source selection unit 264 selects the word lines WL3 and WL4 in the block BLK1 with the number of written times after an erasure of their corresponding pages being small from among five word lines WL0 to WL4 in the block BLK1 with the second lowest valid cluster rate of corresponding pages being 2/4. In the case where the word line-wise compaction is executed under the selection conditions described above, a write operation of four valid clusters (movement of data) is executed by a compaction operation for one block BLK portion, and a free area of 16 clusters is obtained. Therefore, the word line-wise compaction allows an acquisition of a free area of clusters more effectively than in an acquisition of the block-wise compaction. In the example of FIG. 22, the case has been described where three word lines WL having a valid cluster rate of 0/4, i.e., the word line WL0 in the block ELK0, the word lines WL3 and WL4 in the block BLK2, are also selected as compaction sources; however, these word lines WL may be excluded from compaction source targets because these word lines WL do not include a valid cluster and can be selected as free word lines WL.

3.8 Advantageous Effects of Present Embodiment

According to the configuration of the present embodiment, the same advantageous effects as those of the first and second embodiments can be obtained.

Furthermore, according to the configuration of the present embodiment, it is possible to improve the reliability of the memory system 1. The advantageous effects will be described in detail.

The valid cluster rate of compaction sources alters the efficiency of generating free blocks BLK, i.e., a write amplification factor (WAF) WAF indicates a proportion between the volume of data received from the host device 2 and written in a memory chip 100 and the volume of data written in the memory chip 100, and represented by WAF=1/(1−r) (r is a validity rate of data stored in the memory chip 100). Therefore, a WAF having a large value indicates that the validity rate of data, i.e., the valid cluster rate, is high.

With the configuration according to the present embodiment, the memory system 1 can execute word line-wise (page unit) compaction. In the word line-wise compaction, word lines WL with valid cluster rates of their corresponding pages being lower are selected on a priority basis. The word line-wise compaction can therefore make the WAF smaller. This can reduce the number of compaction times and reduce the number of times of an erase operation of blocks BLK resulting from compaction. It is therefore possible to suppress reliability degradation of the memory chips 100 caused by repeated write/erase cycles. The reliability of the memory system 1 can therefore be improved.

According to the configuration of the present embodiment, the number of erasing times of block erasure can be reduced, and it is thus possible to extend the lifetime of the memory chips 100.

Furthermore, according to the configuration of the present embodiment, an increase in write volume in a compaction can be suppressed, and it is therefore, possible to shorten the processing time of the compaction. It is therefore possible to improve the processing capability of the memory system 1.

4. Fourth Embodiment

Next, the fourth embodiment will be described. In the fourth embodiment, a case will be described where part of the memory area of the memory chip 100 is used as a data buffer. Hereinafter, a description will be given of the points in which the memory system 1 according to the fourth embodiment differs from those according to the first to third embodiments.

4.1 Configuration of Memory Cell Array

Figure 23:
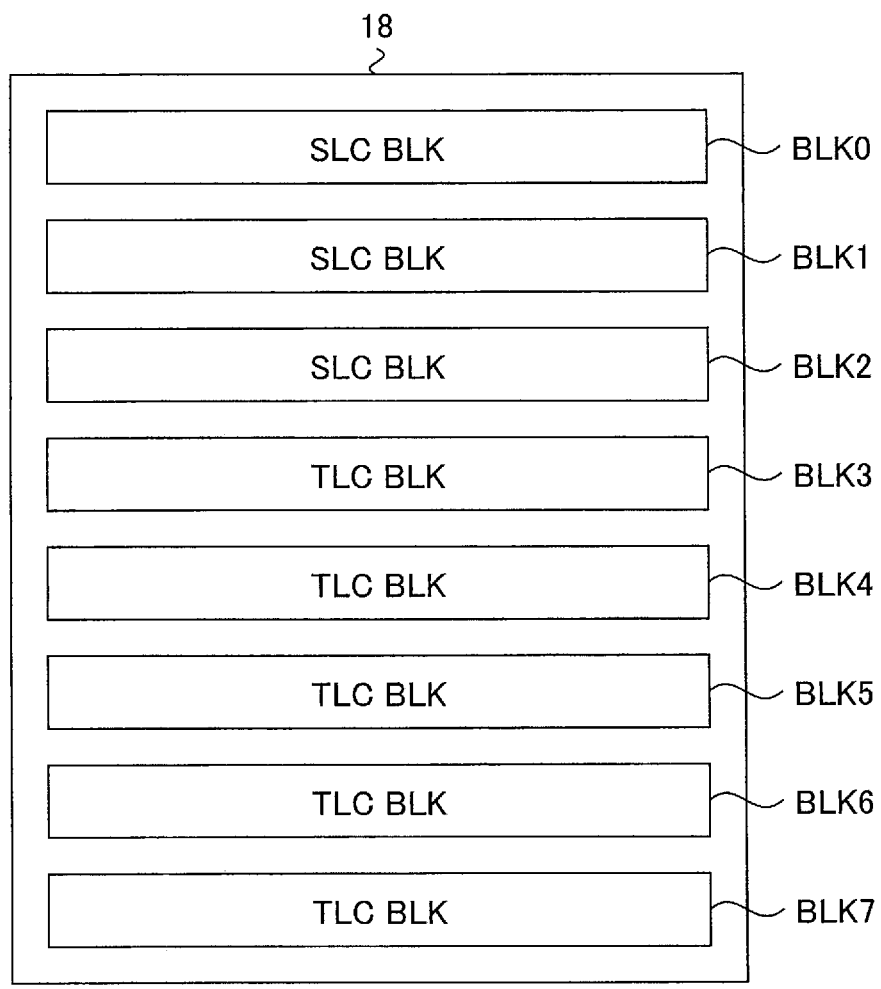
FIG. 23 is a block diagram of a memory cell array in a semiconductor memory medium included in a memory system according to a fourth embodiment.

First, the configuration of a memory cell array 109 according to the present embodiment will be described with reference to FIG. 23. FIG. 23 is a block diagram of the memory cell array 109.

The memory cell array 109 includes, for example, three SLC blocks BLK (BLK0 to BLK2) corresponding to SLC, and five TLC blocks BLK (BLK3 to BLK7) corresponding to 3-bit-data writable triple level cells (TLC). For example, an SLC block BLK corresponds to an overwrite operation of data, and a TLC block BLK does not correspond to an overwrite operation of data.

For example, the processing time of an operation of writing 3-bit data in a TLC (hereinafter, referred to as "TLC write operation") is sometimes longer than the processing time for performing an SLC write operation tree times. Therefore, in the present embodiment, in order to speed up a write operation, first, data corresponding to TLC is written in an SLC block BLK, and the data is moved from the SLC block BLK to the TLC block BLK, for example, when the memory chip 100 is in an idling state. That is, an SLC block BLK is used as a data buffer (hereinafter, also referred to as an "SLC buffer").

For example, when data is written in one TLC block BLK, data for the portion of at least three SLC blocks BLK is required. That is, TLC data (3-bit data) for one page is stored as SLC data for three pages (1-bit data) in an SLC block BLK. However, if the number of blocks of the SLC blocks BLK is excessively increased, the effective memory capacity of the memory chip 100 is reduced, and the area of an SLC block BLK thus becomes limited on occasion. For this reason, the number of written/erased times in an SLC block BLK tends to be larger than that for a TLC block BLK.

Therefore, in the present embodiment, a case will be described where a sequential write operation is used for a first SLC write operation after an erasure in an SLC block BLK, and a random WL order write operation is used for second and subsequent write operations after an erasure (overwrite operations of data). It should be noted that the sequential write operation may be used for the second or subsequent write operations in an SLC block BLK. With this configuration, it is possible to extend a period in which the write performance of an SLC write operation is maintained without increasing the frequency of an erase operation by the garbage collection; that is, it is possible to increase the volume in which write data received from the host device 2 can be written speedily.

4.2 State Transition of SLC Block and TLC Block and Data Flow

Next, the state transitions and data flows of SLC block BLK and TLC block BLK will be described with reference to FIG. 24. FIG. 24 is a state transition diagram of an SLC block BLK and a TLC block BLK.

First, the SLC block BLK will be described.

The SLC block ELK includes three states. The three states are referred to as an "SLC free block BLK", an "SLC host input block BLK" and an "SLC active block BLK".

The SLC free block BLK is a block BLK which does not include valid data, i.e., valid clusters.

The SLC host input block BLK is a block BLK selected as a writing target of writing data received from the host device 2.

The SLC active block BLK is a block BLK in which a page or pages corresponding to at least one or more word lines WL within the block BLK include (s) valid data (however, SLC input blocks ELK are excluded).

Upon receipt of a write request from the host device 2, first, CPU 230 executes an SLC write operation in an SLC host input block BLK. If the SLC host input block BLK is not set, a BLK/WL management unit 260 selects an SLC host input block BLK from among SLC active blocks ELK, including SLC free blocks BLK, or free word lines WL.

If the number of written times after an erasure of the selected SLC free block BLK has not reached the predetermined upper limit count, the selected SLC free block BLK can be used directly as an SLC host input block BLK without executing block erasure. When there is no free word line WL within an SLC host input block ELK, the BLK/WL management unit 260 changes the SLC host input block BLK to an SLC active block BLK.

For example, when no SLC free block BLK is found, CPU 230 executes garbage collection GC of the active block BLK. The garbage collection GC is an operation for evacuating valid data present in a memory region of an erasing target to another memory region when an erase operation is performed. The BLK/WL management unit 260 changes said block BLK for which the garbage collection GC has been executed to a free block BLK. It should be noted that there is a case where the data in said block BLK is nullified (the association of a logical address and a physical address is cancelled) by a write operation in accordance with an update of write data corresponding to the same logical address, without executing the garbage collection GC, and the block BLK is transitioned to a free block BLK.

Next, the TLC block ELK will be described.

Blocks included in a TLC block BLK include four states. The four states are referred to as a "TLC free block ELK", a "TLC host input block ELK", a "TLC active block BLK", and a "TLC_GC input block BLK".

A TLC free block BLK is a block BLK in which all three page-data each corresponding to a plurality of word lines WL within the block BLK do not include valid data.

The TLC host input block BLK is a block BLK selected as a writing target of write data received from the host device 2. In the case where the data in an SLC block BLK is written as three-page data in a TLC block BLK, or where a write area cannot be ensured in an SLC block BLK, and a TLC write operation is directly executed in response to a write request from the host device 2, CPU 230 uses a TLC host input block ELK. When there is no writable page in a TLC host input block BLK, the BLK/WL management unit 260 changes the TLC host input block BLK to a TLC active block BLK.

The TLC active block BLK is a block BLK in which any one of three-page data corresponding to a plurality of word lines WL in a block BLK includes valid data. When said block enters a free state of not including valid data, for example, by execution of the garbage collection etc., the BLK/WL management unit 260 changes the TLC active block BLK to a TLC free block BLK.

The TLC_GC input block BLK is a block BLK selected as a writing target of data in the garbage collection GC. In the case where the garbage collection GC is executed in an SLC active block BLK and a TLC active block BLK, the TLC_GC input block BLK is used as a data writing destination. When there is no data-writable page in the TLC_GC input block BLK, the BLK/WL management unit 260 changes the TLC_GC input block BLK to the TLC active block BLK.

4.3 Specific Example of Write Operation to SLC Block BLK

Figure 25:
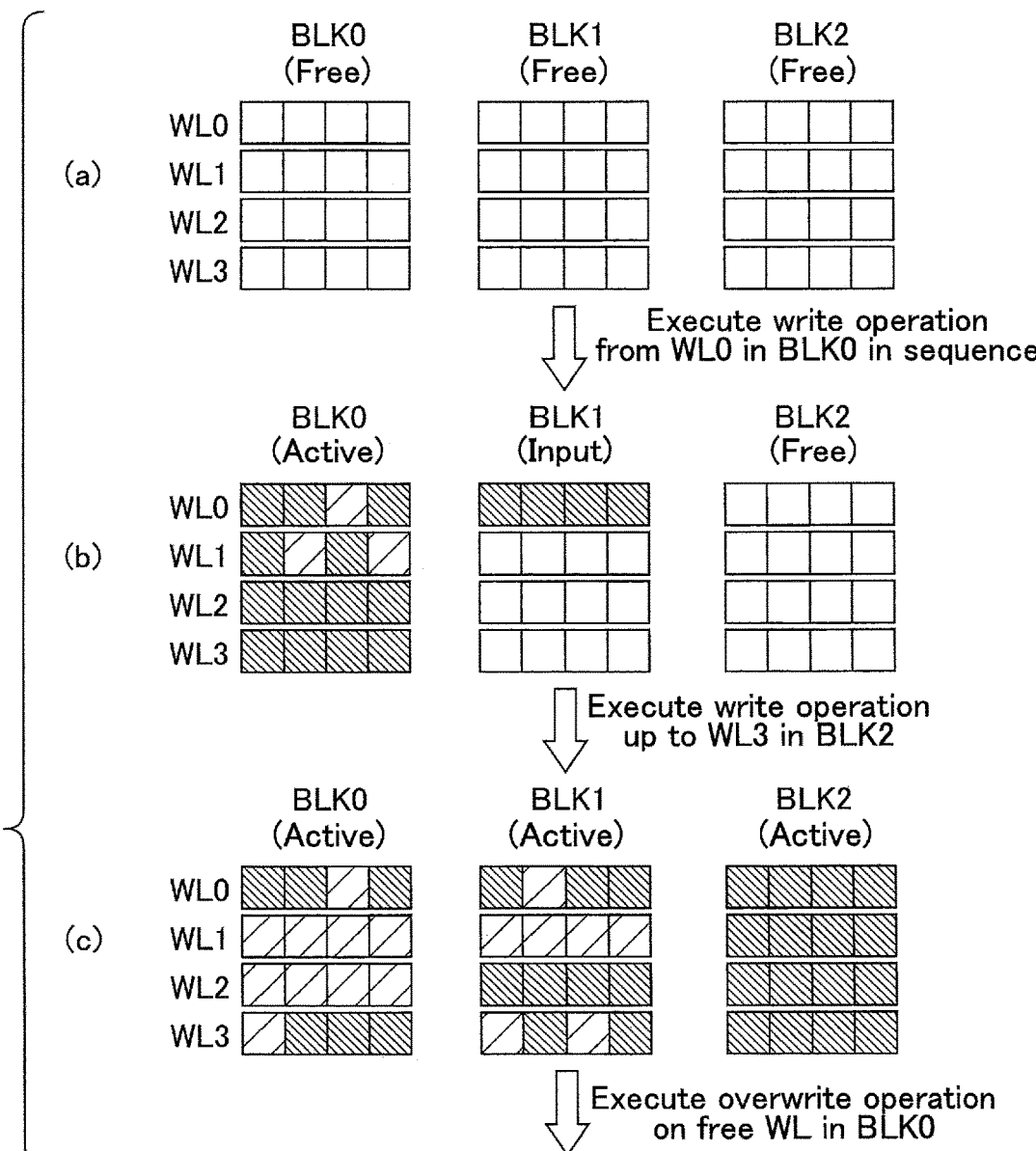
FIGS. 25 and 26 are diagrams illustrating transitions of the state of a cluster corresponding to an SLC write operation in an SLC block BLK, in the semiconductor memory medium included in the memory system, according to the fourth embodiment.
Figure 26:
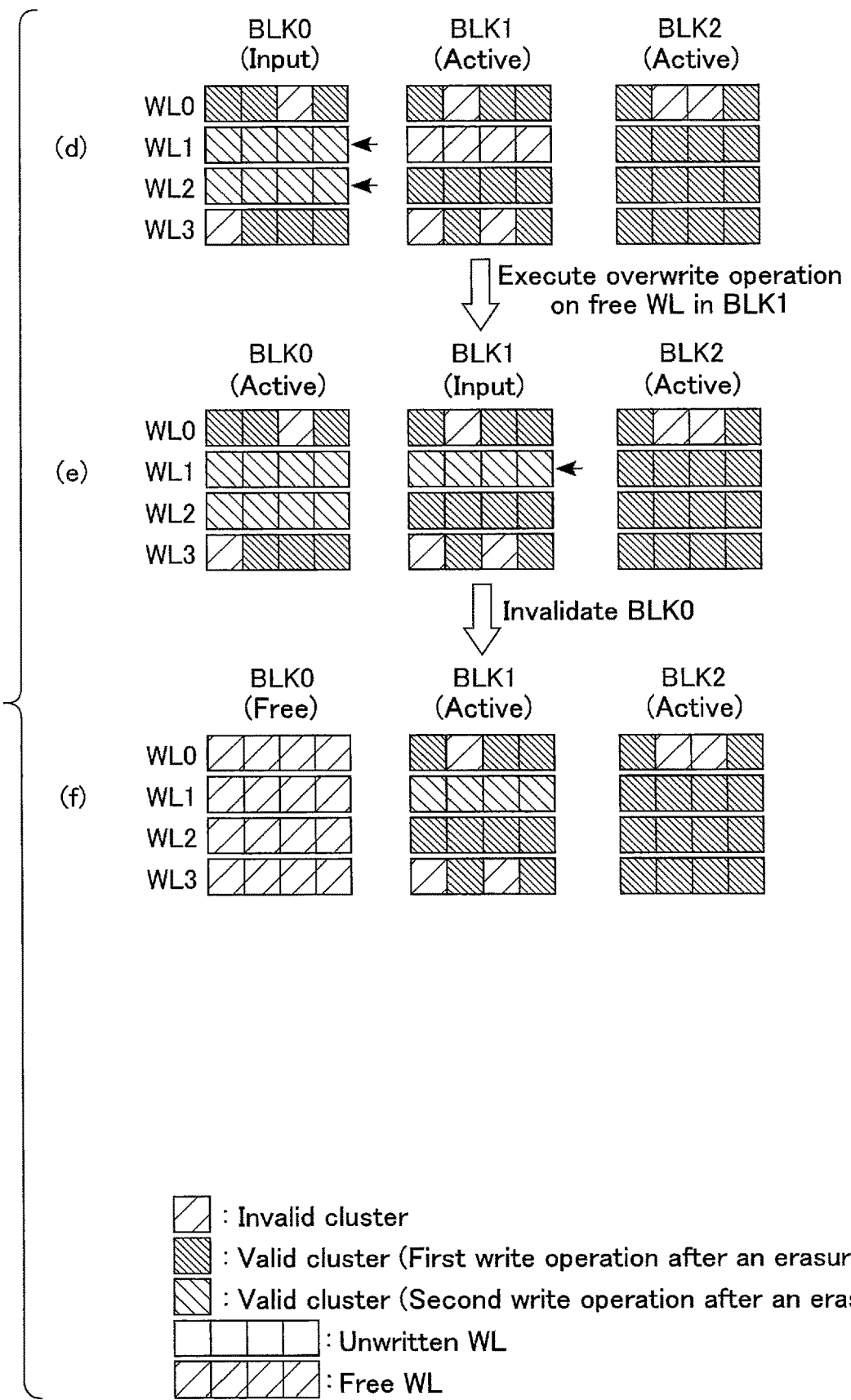

Next, a specific example of an SLC write operation to an SLC block BLK will be described with reference to FIGS. 25 and 26. FIGS. 25 and 26 show transitions of a state of a cluster corresponding to an SLC write operation in an SLC block BLK. The examples of FIGS. 25 and 26 show a case where each SLC block BLK includes four word lines WL0 to WL3, and a page corresponding to each word line WL has four clusters.

CPU 230 executes block erasing relative to three SLC free blocks BLK0 to BLK3. A page corresponding to each word line WL is in an unwritten state (FIG. 25 (a)).

Next, CPU 230 selects word lines WL from a word line WL0 in a block BLK0 in sequence and executes a sequential write operation. In the example of FIG. 25 (b), data has been written on pages respectively corresponding to the word lines WL0 to WL3 of the block BLK0. Therefore, the block BLK0 is taken as an SLC active block BLK. A block BLK1 is set as an SLC host input block BLK, and data has been written on the page corresponding to the word line WL0.

More specifically, the page corresponding to the word line WL0 of the block BLK0 includes three valid clusters and one invalid cluster. For example, there is a case where an invalid cluster is generated because the data is nullified in accordance with an update of written data corresponding to the same logical address. The page corresponding to the word line WL1 of the block BLK0 includes two valid clusters and two invalid clusters. The pages corresponding to the word lines WL2 and WL3 of the block BLK0 each include four valid clusters. The block BLK1 is selected as an input block BLK, and data has been written on a page corresponding to the word line WL0. The page corresponding to the word line WL0 of the block BLK1 includes four valid clusters.

Furthermore, CPU 230 executes a sequential write operation and writes data up to a page corresponding to the word line WL3 of the block BLK2. In the example of FIG. 25 (c), the blocks BLK0 to BLK3 are taken as SLC active blocks BLK. More specifically, the page corresponding to the word line WL0 of the block BLK0 includes three valid clusters and one invalid cluster. The pages corresponding to the word lines WL1 and WL2 of the block BLK0 include, for example, four invalid clusters that have been nullified in accordance with an update of written data corresponding to the same logical address. The page corresponding to the word line WL3 of the block BLK0 includes three valid clusters and one invalid cluster. The page corresponding to the word line WL0 of the block BLK1 includes three valid clusters and one invalid cluster. The page corresponding to the word line WL1 of the block BLK1 includes four invalid clusters. The page corresponding to the word line WL2 of the block BLK1 includes four valid clusters. The page corresponding to the word line WL3 of the block BLK1 includes two valid clusters and two invalid clusters. The pages corresponding to the word lines WL0 to WL3 of a block BLK2 respectively include four valid clusters. The BLK/WL management unit 260 changes the word lines WL1 and WL2 of the block BLK0 and the word line WL1 of the block BLK1, in which the corresponding pages respectively include four invalid clusters, to free word lines WL.

CPU 230, first, selects a free word lines WL of a block BLK0 and executes a second SLC write operation (overwrite operation) after an erasure. In the example of FIG. 26 (d), data obtained through the second write operation after an erasure has been written on pages corresponding to the word lines WL1 and WL2 of the block BLK0, and each of the pages includes four valid clusters.

Next, CPU 230 executes the second SLC write operation after an erasure on the page corresponding to the word line WL1 of a block BLK1. In the example of FIG. 26 (e), data obtained through the second write operation after an erasure has been written on a page corresponding to the word line WL1 of the block BLK1, and said page includes four valid clusters.

For example, all clusters in the block BLK0 are nullified in accordance with an update of written data corresponding to the same logical address. Through this process, the block BLK0 is set to an SLC free block BLK (FIG. 26 (f)).

4.4 Flow of Write Operation

Figure 27:
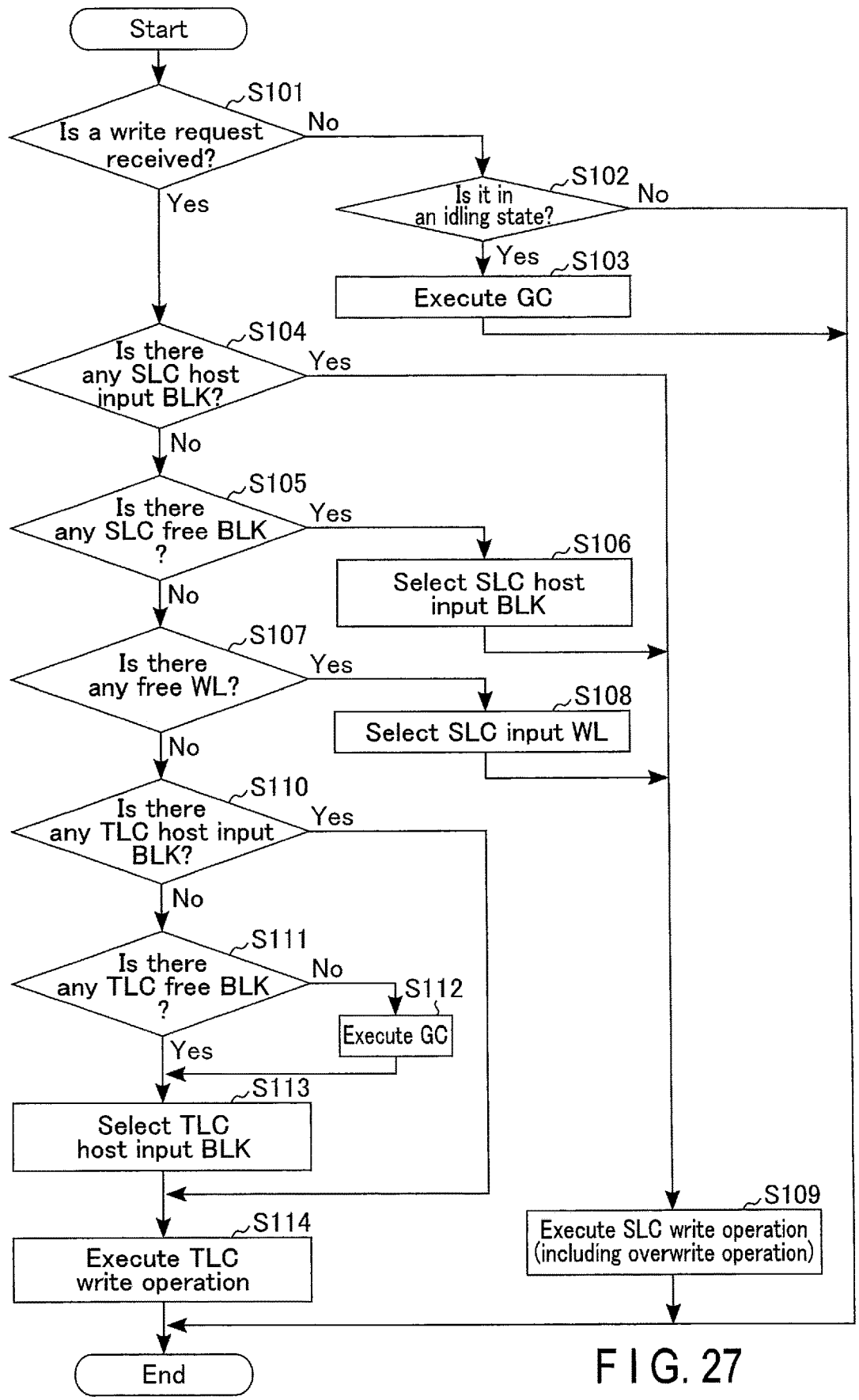
FIG. 27 is a flowchart of a write operation in the memory system according to the fourth embodiment.

Next, the flow of a write operation will be described with reference to FIG. 27. FIG. 27 is a flowchart of a write operation.

For example, if the memory system 1 has not received a write request from the host device 2 (S101_Yes) or has not received another request from the host device 2, CPU 230 confirms whether the memory system 1 is in an idling state (S102). For example, when the period in which CPU 230 has not received a request (command) from the host device 2 is longer than a predetermined period, CPU 230 shifts the state of the memory system 1 from a normal operation state to an idling state.

Where the memory system 1 is in an idling state (S102_Yes), CPU 230 executes the garbage collection GC intended for SLC active blocks BLK (S103). In contrast, where the memory system 1 is not in an idling state (S102_No), CPU 230 does not execute the garbage collection GC.

Where CPU 230 has received a write request from the host device 2 (S101_Yes), CPU 230 confirms with the BLK/WL management unit 260 the presence or absence of an SLC host input block BLK (S104).

If there is an SLC host input block BLK (S104_Yes), CPU 230 executes an SLC write operation (S109). It should be noted that the SLC write operation also includes a case of an overwrite operation. That is, the SLC write operation also includes a case of the second or subsequent SLC write operations after an erasure.

If there is no SLC host input block ELK (S104_No), the BLK/WL management unit 260 confirms the presence or absence of an SLC free block BLK (S105).

If there is an SLC free block BLK (S105_Yes), the BLK/WL management unit 260 selects any one of the SLC free blocks BLK, as an SLC host input block BLK (S106). Thereafter, CPU 230 executes the SLC write operation (S109).

If there is no SLC free block BLK (S105_No), the BLK/WL management unit 260 confirms whether there is a free word line WL in the SLC active block BLK (S107). More specifically, the BLK/WL management unit 260 selects, as a free word line WL, a word line WL with a valid data volume (valid cluster rate) being equal to or lower than a predetermined threshold from among the active word lines WL in the SLC active block BLK. In this case, the threshold is 0, for example. That is, an active word line WL in which valid data is included in the corresponding page is not selected as a free word line WL.

If there is an SLC free block BLK (S107_Yes), the BLK/WL management unit 260 selects, as an SLC input block BLK, an SLC active block BLK including a free word line WL (S108). More specifically, the BLK/WL management unit 260 selects an input word line WL from among free word lines WL in the SLC input block BLK. CPU 230 executes an SLC write operation (overwrite operation) on the selected input word line WL (S109).

If there is no free word line WL (S107_No), the BLK/WL management unit 260 confirms a TLC block BLK as a write region because there is no writable region in the SLC block BLK. First, the BLK/WL management unit 260 confirms whether there is a TLC host input block BLK (S110).

If there is a TLC host input block BLK (S110_Yes), CPU 230 executes a TLC write operation (S114).

If there is no TLC host input block BLK (S110_No), the BLK/WL management unit 260 confirms the presence or absence of a TLC free block BLK (Sill).

If there is a TLC free block BLK (S111_Yes), the BLK/WL management unit 260 selects any one of TLC free blocks BLK as a TLC host input block BLK (S113).

If there is no TLC free block BLK (S111_No), the BLK/WL management unit 260 executes the garbage collection GC of the TLC active block BLK (S112). Thereafter, the BLK/WL management unit 260 selects, as a TLC host input block BLK, a block BLK in which the garbage collection GC has been executed (S113).

CPU 230 executes a TLC write operation after selecting a TLC host input block BLK (S114).

4.5 Relationship Between Writing Speed and Written Data Volume

Next, the relationship between a writing speed and a written data volume will be described with reference to FIG. 28.

Figure 28:
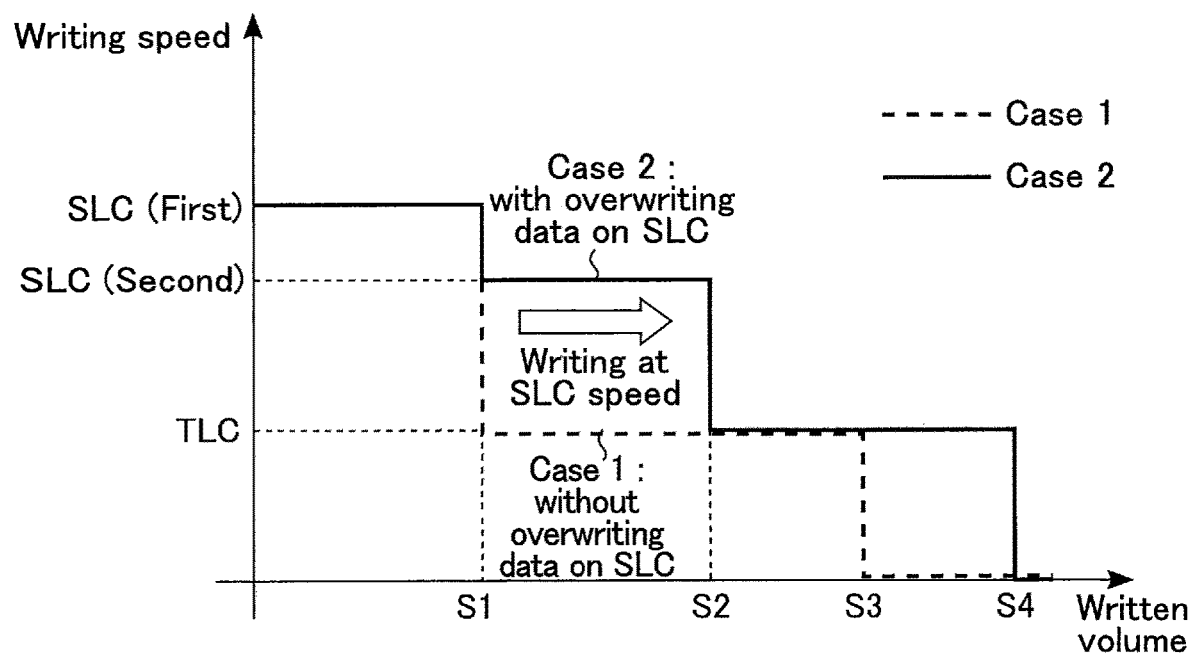
FIG. 28 is a graph illustrating the relationship between a writing speed and a written volume in the memory system according to the fourth embodiment.

FIG. 28 is an exemplary diagram showing the relationship between a writing speed and a written data volume.

The writing speed of an SLC write operation for writing 1-page data (hereinafter, also referred to as "SLC speed") is faster than a writing speed of a TLC write operation (hereinafter, also referred to as "TLC speed") for writing 3-page data. In addition, in a first SLC write operation after an erasure, the write operation is executed using parameters corresponding to the first write operation after an erasure. In the second SLC write operation after an erasure, the write operation is executed using parameter corresponding to the second write operation after an erasure. For example, depending on the difference in parameter, etc., the writing speed of the first SLC write operation after an erasure is sometimes faster than that of the second SLC write operation (overwrite operation) after an erasure. The example of FIG. 28 indicates a case where the writing speed of the first SLC write operation after an erasure is faster than that of the second SLC write operation after an erasure.

Where data is written in a memory chip 100, first, CPU 230 executes the first SLC write operation after an erasure. Then, at a written volume of S1, an SLC free block BLK (SLC free word line WL) for executing the first write operation after an erasure is not present.

For example, as shown in a thick broken line in FIG. 28, without overwriting data on an SLC block BLK (case 1), i.e., when it is not applied to execute the second SLC write operation after an erasure, CPU 230 executes a TLC write operation. Therefore, at the written volume S1, the writing speed decreases from the SLC speed to the TLC speed. Furthermore, if a TLC free block BLK is not present at a written volume S3, the garbage collection GC is required.

In contrast, as shown by a thick solid line in FIG. 28, with overwriting data on an SLC block BLK (case 2), i.e., when it is applied to execute the second SLC write operation after an erasure, CPU 230 executes an overwrite operation (a second SLC write operation after an erasure) in the SLC block BLK, for example, from the written volume S1 to the written volume S2. Therefore, the memory system 1 can maintain the SLC speed up to the written volume S2. Then, at the written volume S2, CPU 230 executes a TLC write operation. In this case, CPU 230 can execute the TLC write operation up to a written volume S4, the data volume that can be written at a relatively high speed without performing the garbage collection GC with respect to an SLC block increases from the written volume S1 to the written volume S2, compared to the case where an overwrite operation of the SLC block BLK cannot be executed.

4.6 Advantageous Effects of Present Embodiment

With the configuration of the present embodiment, the same advantageous effects as those of the first to third embodiments can be obtained.

Furthermore, with the configuration according to the present embodiment, an SLC write operation can be executed multiple times per erase operation in an SLC block. With this configuration, the volume of data writable per erase operation can be increased. In other words, the execution frequency of an erase operation relative to the same written volume can be reduced in an SLC block. It is therefore possible to improve the writing performance. In addition, since the execution frequency of an erase operation can be reduced with respect to the same written volume, it is possible to extend the lifetime of SLC blocks. Therefore, it is possible to improve the processing capacity of the memory system 1.

Furthermore, the configuration of the present embodiment can be applied to the third embodiment. That is, the word line-wise compaction can be executed in SLC blocks. With this, the WAF can be improved, and the lifetime of the memory chip 100 can be extended. Furthermore, writing performance can be improved by reducing the execution frequency of the garbage collection GC.

5. Fifth Embodiment

Next, a fifth embodiment will be described. In the fifth embodiment, a case will be described where written data received from the host device 2 and data of the garbage collection GC are written together in an SLC host input block ELK. Hereinafter, a description will be given of the points in which the memory system according to the fifth embodiment differs from that according to the fourth embodiment.

5.1 State Transition and Data Flow of SLC Block and TLC Block

Figure 29:
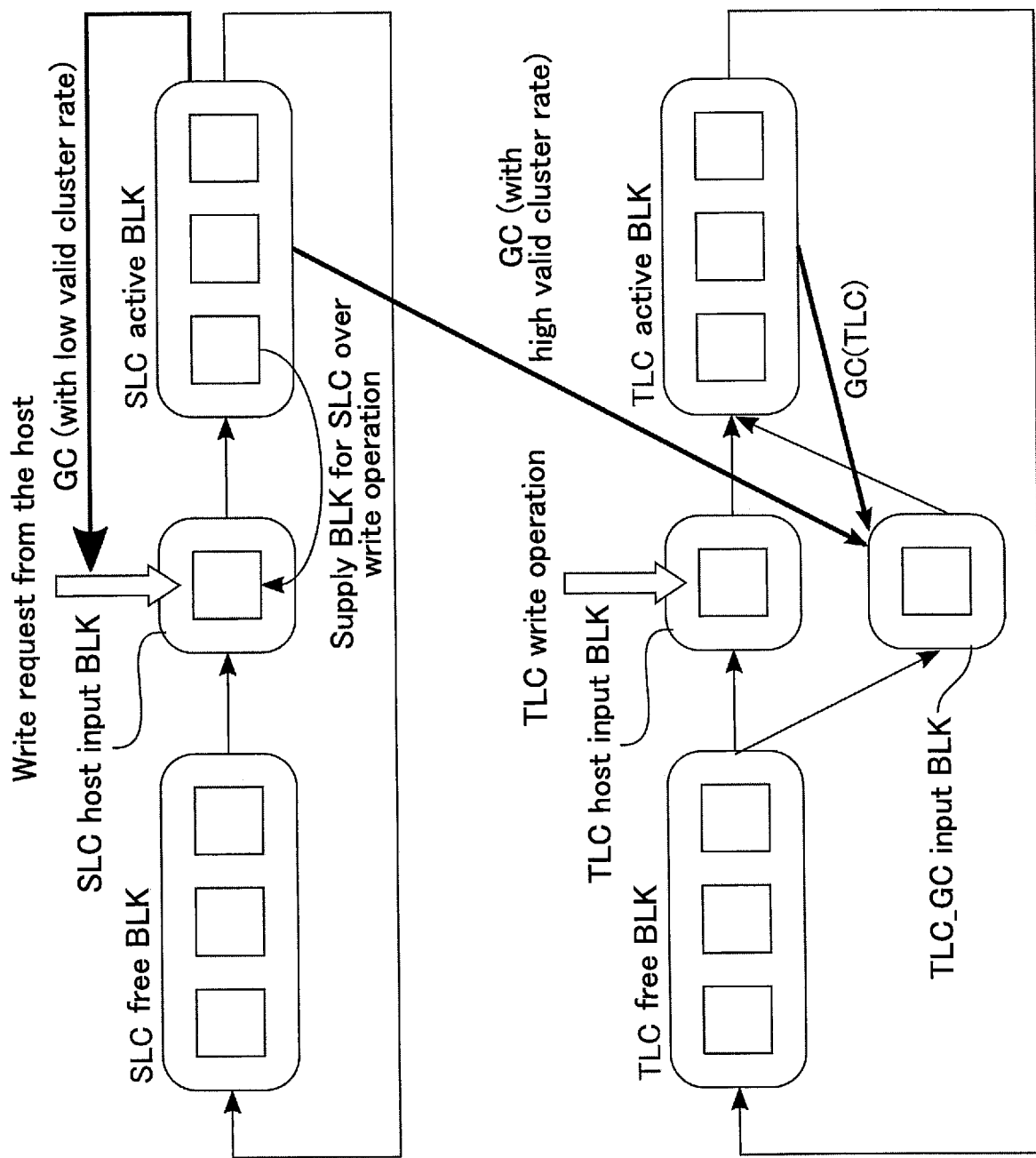
FIG. 29 is a state transition diagram of an SLC block BLK and a TLC block BLK in a semiconductor memory medium included in a memory system according to a fifth embodiment.

First, the state transition and a data flow of an SLC block BLK and a TLC block BLK will be described with reference to FIG. 29. FIG. 29 is a state transition diagram of an SLC block BLK and a TLC block BLK.

In the present embodiment, as described in FIG. 24 of the fourth embodiment, CPU 230 may move, in an SLC active block BLK, data targeted for the garbage collection GC to a TLC_GC input block BLK to generate an SLC free block BLK. In addition, CPU 230 selects, as a target, a word line WL with a valid data volume (valid cluster rate) of its corresponding page being equal to or lower than a predetermined threshold and evacuates valid data. Then, CPU 230 may select said word line WL as an input word line WL and use a block BLK including the word line WL as an SLC host input block BLK. The evacuated valid data is overwritten together with the written data received from the host device 2 in the input word line WL in the SLC input block BLK. More specifically, CPU 230 temporarily stores targeted valid data in an SLC active block BLK, for example, in RAM 220. If CPU 230 has received a write request from the host device 2, CPU 230 then mixes, in an SLC host input block BLK, the written data received from the host device 2 and the data of valid clusters stored in RAM 220, and writes the mixed data within one page.

5.2 Flow of Write Operation

Figure 31:
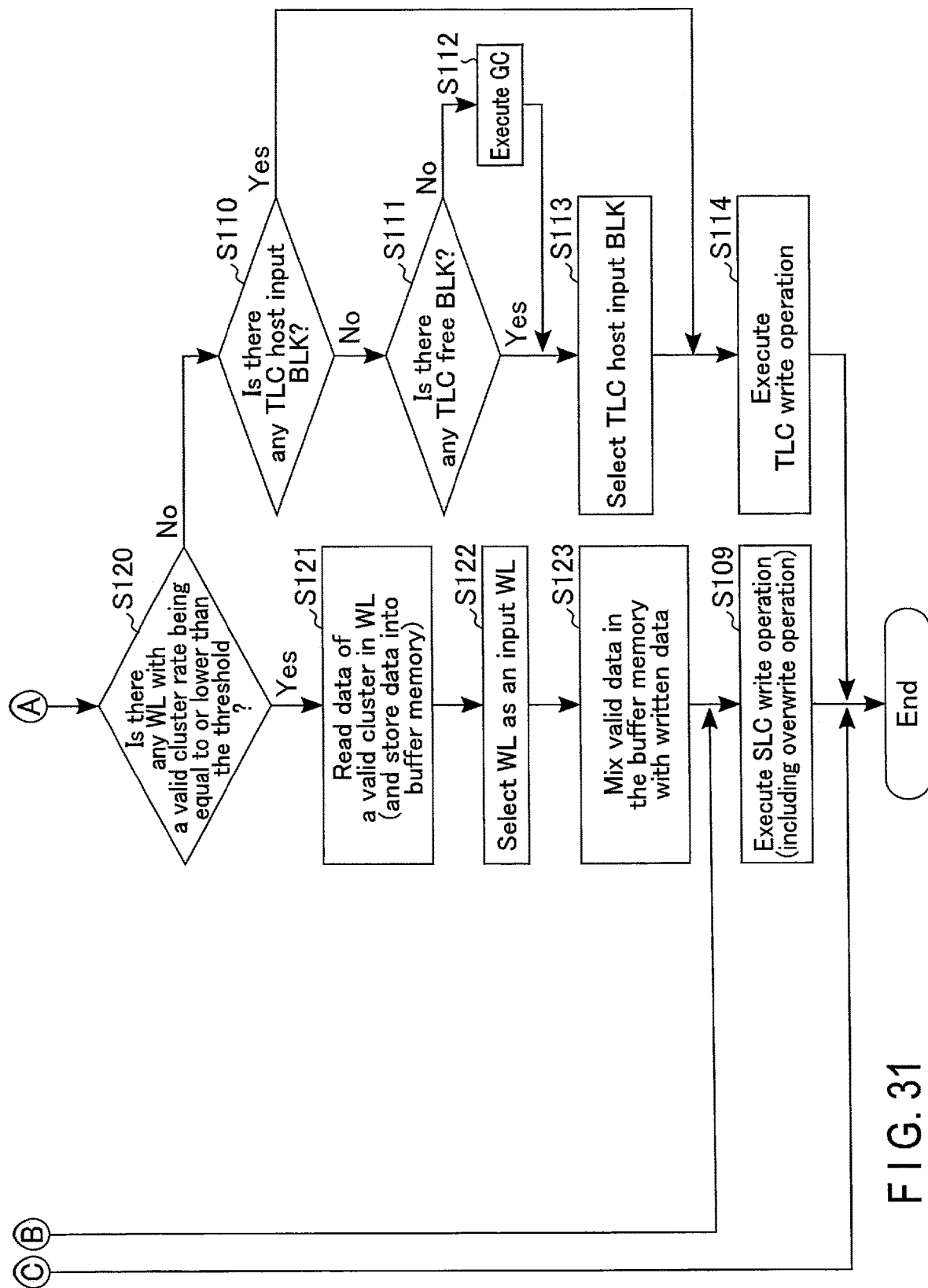

Next, a flow of a write operation will be described with reference to FIGS. 30 and 31. FIGS. 30 and 31 illustrate a flowchart of a write operation.

The operations from S101 to S108 are the same as those of FIG. 27 of the fourth embodiment.

If there is no free word line WL (S107_No), the BLK/WL management unit 260 confirms whether there is an active word line WL having a valid data volume (valid cluster rate) of its corresponding page being equal to or lower than a predetermined threshold (S120). In the present embodiment, the threshold may be not zero (0).

If there is no word line WL having a valid cluster with a valid data volume (valid cluster rate) being equal to or lower than the threshold (S120_No) CPU 230 executes a TLC write operation in the same manner as in S110 to S114 of FIG. 27 of the fourth embodiment.

If there is a word line WL including valid clusters having a valid data volume (valid cluster rate) being equal to or lower than the threshold (S120_Yes) CPU 230 selects a target active word line WL, reads data of the valid clusters (executes the garbage collection GC), and stores the data, for example, in RAM 220 (S121).

The BLK/WL management unit 260 selects, as an input word line WL, the word line WL from which valid data of its corresponding page has been read out (S122). That is, the BLK/WL management unit 260 selects, as an SLC host input block BLK, a block ELK including said word line WL. It should be noted that if the data is read from a plurality of blocks BLK, the BLK/WL management unit 260 may use a block BLK not selected as an SLC host input block BLK, as an SLC free block ELK.

Next, after mixing, as data to be written within one page, the written data received from the host device 2 and the valid data of valid clusters stored in RAM 220 (S123), CPU 230 executes an SLC write operation (overwrite operation) (S109). It should be noted that the valid data in RAM 220 may be written either on the same page as that from which the valid data has been read out, or on a different page. Furthermore, in the case where the valid data in RAM 220 is written on a different page, said page may be different to that corresponding to the same word line WL as the word line WL, in turn corresponding to the page from which the valid data has been read out, or be a different page corresponding to a word line WL different from the word line WL corresponding to the page from which valid data has been read out. In addition, the valid data within RAM 220 to be written on one page may include valid data that have been read from a plurality of pages. In this case, the plurality of pages from which the valid data has been read out may be a plurality of pages corresponding to one word line WL, or a plurality of pages each corresponding to each of the plurality of word lines WL. Furthermore, one of the plurality of pages may be selected as a target page on which valid data is to be written.

5.3 Advantageous Effects of Present Embodiment

According to the configuration of the present embodiment, similar advantageous effects to those of the first to fourth embodiments are obtained.

Furthermore, according to the configuration of the present embodiment, it is possible to select a word line WL having a valid cluster rate of its corresponding page being equal to or lower than a predetermined threshold as a target, evacuate data of valid clusters in said word line WL, and use a block BLK including said word line WL as an SLC host input block ELK. This configuration can shorten the period of garbage collection GC as compared to the case of moving the entire data of a block BLK. It is therefore possible to suppress degradation in the processing capacity of the memory system 1.

6. Sixth Embodiment

Next, a sixth embodiment will be described. In the sixth embodiment, in the case of executing a write operation in sequence, a case will be described where, when an overwrite operation (the second time or subsequent time write operation after an erasure) is executed, a weak erase operation is executed on a target block BLK prior to a write operation being executed. Therefore, an overwrite operation according to the embodiment includes a weak erase operation and a write operation. The weak erase operation is an operation to reduce a threshold voltage of a memory cell transistor MC. In a normal erase operation, a threshold voltage of a memory cell transistor MC is reduced, and then shifted to the "Er" state without fail. In contrast, in the weak erase operation, a threshold voltage of a memory cell transistor MC is reduced; however, the threshold voltage of the memory cell transistor MC may not necessarily be shifted to the "Er" state, in contrast to the normal erase operation. Furthermore, for example, in the case where, after completion of a normal erase operation, the threshold voltage of a memory cell transistor MC moves a negative voltage, the threshold voltage of a memory cell transistor MC after completion of a weak erase operation may or may not become a negative voltage. It should be noted that similarly to the normal erase operation, valid data in a block BLK to be erased is moved to another block BLK before execution of the weak erase operation, by means of the garbage collection GC, etc.

It should be noted that the "erase" operation in a write operation after an erasure indicates a normal erase operation, and the weak erase operation is not included in "erase", unless otherwise described.

The normal erase operation includes an erasure pulse applying operation for applying an erasure voltage to a word line WL, and an erasure verification operation for verifying whether or not the threshold voltages of the memory cell transistors MC have reached the "Er" state. In contrast, the weak erase operation includes the erasure pulse applying operation and may not include the erasure verification operation. Alternatively, for the verification voltage of the erasure verification operation in the weak erase operation, a voltage value higher than the verification voltage of the normal erase operation may be set. In addition, in the normal erase operation, an erasure pulse applying operation is sometimes repeated multiple times until the threshold voltages of the memory cell transistors MC have reached the "Er" state. In contrast, in the weak erase operation, the number of times of the erasure pulse applying operation execution may be set to one. It should be noted that the conditions for the erase pulse applying operation in the normal erase operation and the conditions for the erasure pulse applying operation in the weak erase operation may be identical to or different from one another. A description will be given of the points in which the memory system according to the sixth embodiment differs from that according to the first embodiment.

6.1 Threshold Voltage Distribution of SLC Write Operation

First, an example of a threshold voltage distribution of an SLC write operation will be described with reference to FIG. 32. The example of FIG. 32 shows a case where two times of an SLC write operation are executed for one memory cell group MG after an erasure (normal erase operation), i.e., a case where one time overwrite operation is executed after an erasure.

The state of the first write operation after an erasure is the same as that of FIG. 4 of the first embodiment. Next, in the present embodiment, a weak erase operation is executed before execution of the second write operation after an erasure. The threshold voltage of the memory cell transistor MC decreases due to the weak erase operation. More specifically, an "Er0" state shifts to an "Er0'" state, and an "A1" state shifts to an "A1'" state. For example, the threshold voltages of part of the memory cell transistors MC corresponding to the "A1'" state may become lower than a voltage VR1.

In the second SLC write operation, data is written such that the threshold voltage of the memory cell transistor MC to be written increases from the "Er0'" state or "A1'" state to an "A2" state. After the second write operation after an erasure, the "A1'" state is also treated as an erased state, and the "A1'" state is thus referred to as "Er1" state. For example, "1" data is allocated, for example, to the "Er0'" state and "Er1" state, and "0" data is allocated to the "A2" state. Where a read voltage corresponding to the second SLC write operation after an erasure is denoted by VR2', and a verify voltage corresponding thereto is denoted by "VV2'", the VR2' and VV2' have a relationship of VR1<VV1<VR2' VV2'<Vread. The threshold voltage of the memory cell transistor in the "Er0'" state and "Er1" state is lower than the voltage VR2'. The threshold voltage of the memory cell transistor MC in the "A2" state is equal to or higher than the voltage VV2' and lower than the voltage Vread. The threshold voltage decreases entirely by executing a weak erase operation before the execution of an overwrite operation.

Therefore, the voltages VR2' and VV2' can be set to be lower than each of the voltages VR2 and VV2 described in FIG. 4 of the first embodiment.

It should be noted that the present embodiment indicates a case where an SLC write operation is executed two times after an erasure; however, the same applies to a case where an SLC write operation is executed three or more times after an erasure. For example, before a third SLC write operation after an erasure, a weak erase operation is executed. With this configuration, the read voltage and verify voltage corresponding to the third SLC write operation after an erasure can be set to be lower than the voltages VR3 and VV3 described in FIG. 4 of the first embodiment. Furthermore, the "number of written times after an erasure" at the timing of executing the weak erase operation may be set discretionarily. For example, in the case where an Lth (L being an integer of 2 or more) or subsequent write operation after an erasure is executed, the weak erase operation may be executed every time before executing a write operation corresponding to a word line WL first selected within a block BLK. In addition, for example, the weak erase operation may be executed before executing a write operation corresponding to a word line WL first selected within a block BLK when the number of written times after an erasure is odd (2, 4, . . . ). Alternatively, the weak erase operation may be executed before executing a write operation corresponding to a word line WL first selected within a block BLK when the number of written times after an erasure is even (3, 5, . . . ). In addition, for example, every M times (M being an integer of 2 or more) of the number of written times after an erasure, the weak erase operation may be executed before executing a write operation corresponding to a word line WL first selected within a block BLK. The weak erase operation may be executed before executing a write operation corresponding to a word line WL first selected within a block BLK, for example, when the number of written times after an erasure has become a predetermined discretional number of times (one or more discretional numbers of times may be set). Furthermore, for the selection of presence or absence of a weak erase operation, two or more of the above-mentioned weak erase operations may be combined.

If a weak erase operation is executed, the number of written times for one page after an erasure can be set higher than in a case where a weak erase operation is not executed, because the threshold voltage has been decreased entirely.

6.2 Overall Flow of Write Operation

Figure 33:
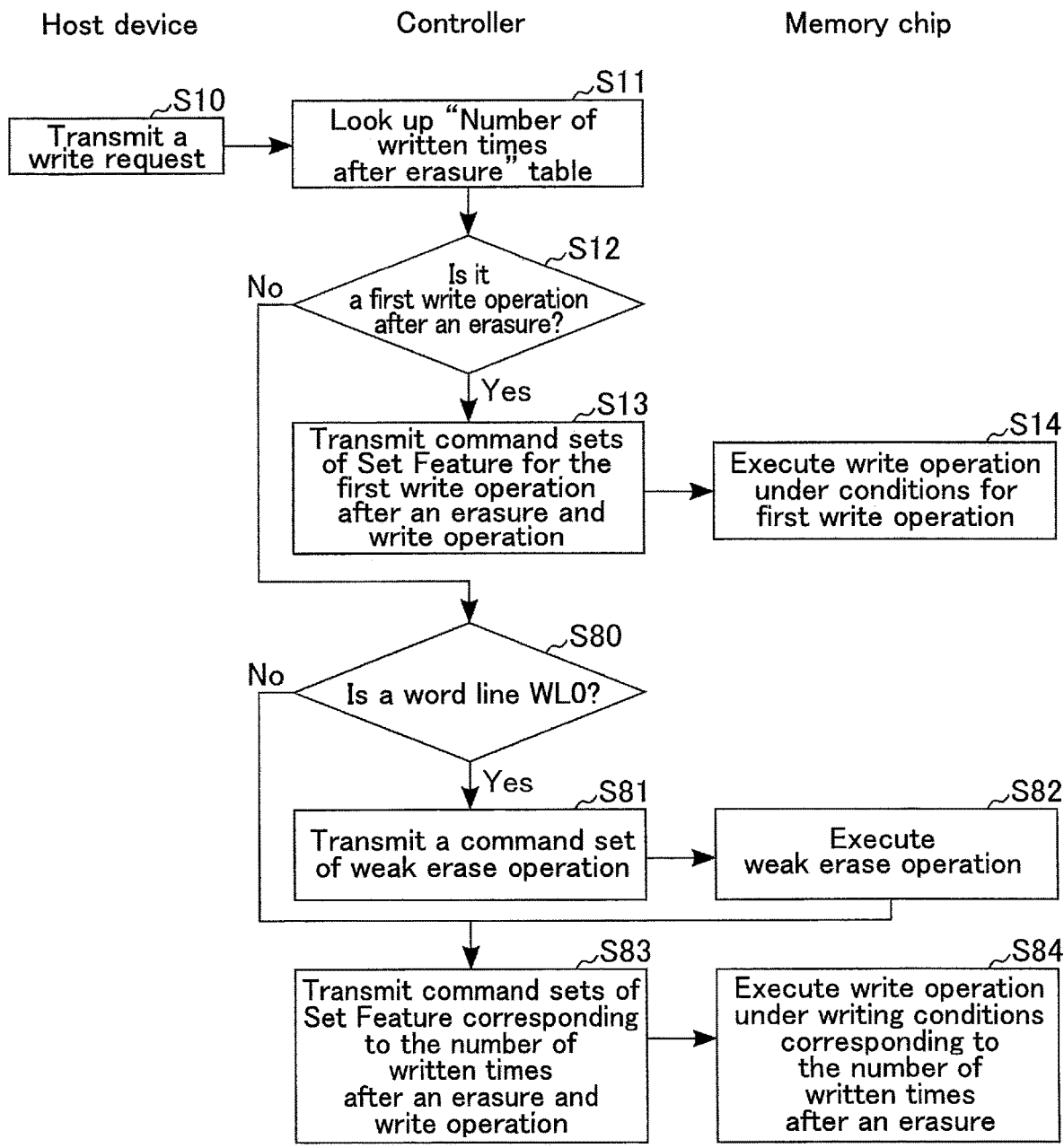
FIG. 33 is a flowchart corresponding to the first to third write operations after an erasure in the memory system according to the sixth embodiment.

Next, an overall flow of a write operation will be described with reference to FIG. 33. FIG. 33 is a flowchart of a write operation. The example of FIG. 33 shows a case where an SLC write operation is executed three times for one memory cell group MG.

The operation from S10 to S14 is the same as that in FIG. 9 of the first embodiment. In the case of a first write operation after an erasure (normal erase operation), the first write operation after an erasure is executed in a block BLK to be written by a sequential write operation.

If the number of written times after an erasure is not the first iteration, (S12_No), i.e., in the case of the second and subsequent write operations after an erasure, CPU 230 confirms whether the selected word line WL is the leading word line WL0 of the sequential write operation in said block BLK (S80). If the selected word line WL is a word line WL0 (S80_Yes), CPU 230 issues a command set of a weak erase operation after executing the garbage collection GC and transmits the command set to a targeted memory chip 100 (S81). It should be noted that CPU 230 determines the presence or absence of an execution of a weak erase operation in accordance with the number of written times after an erasure and the selected word line WL. If the number of written times after an erasure is counted, CPU 230 starts counting the number of written times after a normal erase operation and then resets the counted number at the time of executing the next normal erase operation. Therefore, the counted number of the "number of written times after an erasure" is not reset even if the weak erase operation is executed. Furthermore, CPU 230 may issue a command set of the Set Feature which instructs use of parameters for a weak erase operation and a command set of the weak erase operation, and transmits the commands to the memory chip 100.

Upon receipt of the command set of a weak erase operation, the sequencer 106 executes the weak erase operation (S82).

If the selected word line WL is not WL0 (S80_No), or when the weak erase operation ends at the memory chip 100, CP 230 issues a command set of the Set Feature that instructs use of parameters for an SLC write operation in accordance with number of written times after an erasure and a command set of the SLC write operation and transmits them to a targeted memory chip 100 (S83).

Upon receipt of the command set of the Set Feature that instructs use of parameters for an SLC write operation in accordance with the number of written times after an erasure and the command set of the SLC write operation, the sequencer 106 executes the SLC write operation under writing conditions in accordance with the number of written times after an erasure (S84).

6.3 Advantageous Effects of Present Embodiment

According to the configuration of the present embodiment, the same advantageous effects as those of the first embodiment can be obtained.

Furthermore, according to the configuration of the present embodiment, a weak erase operation can be executed before execution of the write operation in an overwrite operation. With this configuration, the read voltage and verify voltage corresponding to the overwrite operation can be set to be lower than in the case where a weak erase operation is not executed. In addition, since the threshold voltage can be reduced, it is possible to increase the difference in voltage between a threshold voltage distribution of "0" data and the voltage Vread. Therefore, the number of times of data writable to a memory cell transistor MC may be sometimes set to be larger than in the case where no weak erase operation is not executed. In addition, when a write operation is performed the same number of times as in the case where a weak erase operation is not executed, it is possible to widen the intervals between a threshold voltage distribution corresponding to "1" data and a threshold voltage distribution corresponding to "0" data and to suppress overlapping of the threshold voltage distributions due to disturbance, etc. Therefore, it is possible to suppress occurrence of error reading and improve data reliability.

It should be noted that the embodiments are not limited to those described above, and various modifications can be made. For example, the first to sixth embodiments can be combined as appropriate. For example, the fourth embodiment and the sixth embodiment may be combined. More specifically, when a sequential write operation is applied to the second or subsequent write operation after an erasure (normal erase operation) in an SLC block BLK, a write operation may be executed in which a weak erase operation is executed for a targeted block BLK and then a word line WL0 is selected, at the time of executing the second or subsequent write operation after an erasure.

Furthermore, the term "coupling" as used in the above embodiments is intended to include a state where coupled elements are indirectly connected with a transistor, a resistor or the like being interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory medium comprising:
    a first memory cell;
    a first word line coupled to the first memory cell; and
    a row decoder coupled to the first word line,
    wherein a write operation is executed multiple times on the first memory cell within a first period from after an execution of an erase operation to an execution of a next erase operation,
    the write operation includes at least one of program loops each including a program operation and a verify operation, and
    in the verify operation, the row decoder applies a verify voltage to the first word line, the verify voltage being set in accordance with a number of executed write operations on the first memory cell within the first period.

2. The semiconductor memory medium according to claim 1, wherein the verify voltage is set to be increased in accordance with an increase in the number of executed write operations on the first memory cell within the first period.

3. The semiconductor memory medium according to claim 1, wherein a read voltage applied to the first word line in a read operation is set to be increased in accordance with an increase in the number of executed write operations on the first memory cell within the first period.

4. The semiconductor memory medium according to claim 1, wherein a program voltage in the program operation of a first program loop of the write operation is set to be increased in accordance with the number of executed write operations on the first memory cell within the first period.

5. The semiconductor memory medium according to claim 1, wherein, when a second write operation is executed on the first memory cell within the first period, an operation for reducing a threshold voltage of the first memory cell is executed, and the write operation is then executed.

6. The semiconductor memory medium according to claim 1, wherein the first memory cell is capable of storing 1-bit data.

7. A memory system comprising:
    a semiconductor memory medium including a first memory cell, a first word line coupled to the first memory cell, and a row decoder coupled to the first word line; and
    a controller configured to control an erase operation, a write operation, and a read operation, in the semiconductor memory medium,
    wherein the write operation includes at least one of program loops each including a program operation and a verify operation, and
    the controller is configured to instruct, to the semiconductor memory medium, the write operation multiple times on the first memory cell within a first period from after an execution of an erase operation to an execution of a next erase operation, and in the verify operation, to apply a verify voltage to the first word line, the verify voltage being set in accordance with a number of executed write operations on the first memory cell within the first period.

8. The memory system according to claim 7, wherein the controller includes a management unit that manages information corresponding to the number of executed write operations on the first memory cell within the first period.

9. The memory system according to claim 8, wherein the controller is further configured to transmit, in the write operation, a first command set for setting parameters based on the information and a second command set for executing the write operation to the semiconductor memory medium.

10. The memory system according to claim 8, wherein the controller is further configured to transmit, in the read operation, a third command set for setting parameters based on the information and a fourth command set for executing the read operation to the semiconductor memory medium.

11. The memory system according to claim 9, wherein the verify voltage applied to the first word line in the write operation is set in accordance with the first command set.

12. The memory system according to claim 10, wherein a read voltage applied to the first word line in the read operation is set in accordance with the third command set.

13. The memory system according to claim 7, wherein the first memory cell is capable of storing 1-bit data.

14. The memory system according to claim 7, wherein the semiconductor memory medium further includes:
    a second memory cell coupled in series to the first memory cell;
    a select transistor with one end being coupled to a source line and the other end to which the first memory cell is coupled; and
    a second word line coupled to the second memory cell,
    wherein, when estimating each number of executed write operations on the first and second memory cells after the erase operation, the controller is configured to;
    execute a read operation of the first memory cell multiple times while increasing a read voltage to estimate the number of executed write operations on the first memory cell after the erase operation; and
    set the read voltage in the second memory cell, based on the number of executed write operations on the first memory cell after the erase operation.

15. The memory system according to claim 14, wherein the controller is configured to generate the information based on a result of the operation of estimating the number of executed write operations after the erasure.

16. A memory system comprising:
    a semiconductor memory medium including a memory block that includes a plurality of memory strings including a plurality of memory cells each being coupled in series, and a plurality of word lines respectively coupled to the plurality of memory cells; and
    a controller configured to control an erase operation, a write operation, and a read operation in the semiconductor memory medium,
    wherein the controller is configured to instruct, to the semiconductor memory medium, the write operation multiple times on at least one of the plurality of memory cells within a first period from after an execution of an erase operation to an execution of a next erase operation.

17. The memory system according to claim 16, wherein the controller includes a table for managing a number of executed write operations within the first period corresponding to each of the plurality of word lines.

18. The memory system according to claim 16, wherein, the controller includes a management unit configured to select, as a target of the write operation, a word line to which the plurality of memory cells are coupled that does not include the valid data, from among the plurality of word lines, when a second write operation is executed in any one of the plurality of memory cells within the first period.

19. The memory system according to claim 18, wherein the management unit is configured to select the word line as the target of the write operation based on the number of executed write operations within the first period corresponding to each of the plurality of word lines.

20. The memory system according to claim 16, wherein the controller includes a management unit configured to select, as a compaction source, at least one word line of the plurality of word lines, based on statistics calculated by a word line-wise, when the controller executes a compaction operation.

21. The memory system according to claim 20, wherein the management unit is configured to select the compaction source based on a number of executed write operations within the first period of each of the plurality of word lines.

22. The memory system according to claim 16, wherein each of the plurality of memory cells is capable of storing 1-bit data.

23. A memory system comprising:
a semiconductor memory medium including:
a first memory block including a plurality of first memory strings that include a plurality of first memory cells, the plurality of first memory cells each being capable of storing a first number of bits data and being coupled in series;
a second memory block including a plurality of second memory strings that include a plurality of second memory cells, the plurality of second memory cells each being capable of storing a second number of bits data larger than the first number of bits data and being coupled in series;
a plurality of first word lines respectively coupled to the plurality of first memory cells; and
a plurality of second word lines respectively coupled to the plurality of second memory cells; and
a controller configured to control an erase operation, a write operation, and a read operation in the semiconductor memory medium,
wherein the controller is configured to:
write data into the plurality of first memory cells when receiving the data from outside;
move the data stored in the plurality of first memory cells to the plurality of second memory cells; and
execute the write operation multiple times in at least one of the plurality of first memory cells within a first period from after an execution of a erase operation in the first memory block to an execution of a next erase operation in the first memory block.

24. The memory system according to claim 23, wherein the controller is further configured to control an operation for reducing a threshold voltage of the plurality of first memory cells in the semiconductor memory medium,
in the plurality of first memory cells, a selection sequence, in which the first memory cells are selected in each of the write operation executed multiple times, is predetermined, and
in a second write operation within the first period, when one of the plurality of the first memory cells to be selected first in the selection sequence is selected, the operation for reducing the threshold voltage is executed, and the write operation is then executed.

25. The memory system according to claim 24, wherein in the second write operation within the first period, when at least one of the plurality of first memory cells other than the memory cell to be selected first in the selection sequence is selected, the write operation is executed without executing the operation for reducing the threshold voltage.

26. The memory system according to claim 23, wherein the controller is further configured to:
select, from among the plurality of first word lines, one of the plurality of first word lines to which the plurality of first memory cells are coupled stores a volume of valid data that is equal to or lower than a predetermined threshold; and
execute a second write operation in the first period.

27. The memory system according to claim 26, wherein the threshold is 0.

28. The memory system according to claim 23, wherein the controller is further configured to write the data to the plurality of second memory cells, without writing the data in the plurality of first memory cells, when the plurality of first word lines do not include a first word line to which the plurality of first memory cells are coupled does not include valid data.

29. The memory system according to claim 26, wherein the controller is further configured to:
read valid data from the plurality of first memory cells coupled to one of the plurality of first word lines; and
execute the write operation of data, including at least the valid data and the data received from the outside, on the one of the plurality of first word lines as a writing target.

30. The memory system according to claim 23, wherein the first number of bits is 1.

* * * * *